US009666722B2

(12) United States Patent
Matsubayashi et al.

(10) Patent No.: US 9,666,722 B2
(45) Date of Patent: May 30, 2017

(54) SEMICONDUCTOR DEVICE

(71) Applicant: Semiconductor Energy Laboratory Co., Ltd., Atsugi-shi, Kanagawa-ken (JP)

(72) Inventors: Daisuke Matsubayashi, Kanagawa (JP); Yoshiyuki Kobayashi, Atsugi-Kanagawa (JP); Shuhei Nagatsuka, Kanagawa (JP); Yutaka Shionoiri, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 21 days.

(21) Appl. No.: 14/603,632

(22) Filed: Jan. 23, 2015

(65) Prior Publication Data
US 2015/0214378 A1 Jul. 30, 2015

(30) Foreign Application Priority Data

Jan. 28, 2014 (JP) .................. 2014-013395
Jun. 11, 2014 (JP) .................. 2014-120992
(Continued)

(51) Int. Cl.
H01L 29/786 (2006.01)
(52) U.S. Cl.
CPC .... H01L 29/7869 (2013.01); H01L 29/78648 (2013.01); H01L 29/78696 (2013.01)
(58) Field of Classification Search
CPC .................................................. H01L 27/1248
See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

CN 101901838 A 12/2010
CN 103339715 A 10/2013
(Continued)

OTHER PUBLICATIONS

Asakuma.N. et al., "Crystallization and Reduction of SOL-Gel-Derived Zinc Oxide Films by Irradiation With Ultraviolet Lamp", Journal of SOL-Gel Science and Technology, 2003, vol. 26, pp. 181-184.
(Continued)

Primary Examiner — Cuong Q Nguyen
Assistant Examiner — Nishath Yasmeen
(74) Attorney, Agent, or Firm — Fish & Richardson P.C.

(57) ABSTRACT

A transistor having favorable electrical characteristics. A transistor suitable for miniaturization. A transistor having a high switching speed. One embodiment of the present invention is a semiconductor device that includes a transistor. The transistor includes an oxide semiconductor, a gate electrode, and a gate insulator. The oxide semiconductor includes a first region in which the oxide semiconductor and the gate electrode overlap with each other with the gate insulator positioned therebetween. The transistor has a threshold voltage higher than 0 V and a switching speed lower than 100 nanoseconds.

14 Claims, 43 Drawing Sheets

(30) Foreign Application Priority Data

Aug. 7, 2014 (JP) ................................ 2014-161300
Oct. 10, 2014 (JP) ................................ 2014-209486

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0200178 A1* | 8/2007 | Yun .................. H01L 29/42392 257/353 |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0050941 A1* | 2/2009 | Yamazaki ......... H01L 21/76254 257/255 |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0276682 A1* | 11/2010 | Yeh .................. H01L 29/78609 257/43 |
| 2010/0301329 A1 | 12/2010 | Asano et al. |
| 2011/0089417 A1 | 4/2011 | Yamazaki et al. |
| 2011/0101351 A1 | 5/2011 | Yamazaki |
| 2011/0156022 A1 | 6/2011 | Yamazaki et al. |
| 2011/0193077 A1 | 8/2011 | Yamazaki |
| 2012/0138922 A1 | 6/2012 | Yamazaki et al. |
| 2012/0241739 A1 | 9/2012 | Yamazaki et al. |
| 2013/0309808 A1* | 11/2013 | Zhang ............... H01L 29/78648 438/104 |
| 2014/0306217 A1 | 10/2014 | Yamazaki et al. |
| 2014/0339538 A1 | 11/2014 | Yamazaki et al. |
| 2014/0339546 A1 | 11/2014 | Yamazaki et al. |
| 2014/0340608 A1 | 11/2014 | Yamazaki et al. |

FOREIGN PATENT DOCUMENTS

| | | |
|---|---|---|
| DE | 112011104002 | 8/2013 |
| EP | 1737044 A | 12/2006 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2011-009724 A | 1/2011 |
| JP | 2011-151394 A | 8/2011 |
| JP | 2011-181913 A | 9/2011 |
| JP | 2012-134475 A | 7/2012 |
| JP | 2012-216802 A | 11/2012 |
| KR | 2010-0129185 A | 12/2010 |
| KR | 2012-0106874 A | 9/2012 |

(56) References Cited

FOREIGN PATENT DOCUMENTS

| KR | 2012-0109396 A | 10/2012 | | |
|---|---|---|---|---|
| KR | 2012-0117914 A | 10/2012 | | |
| KR | 2013-0118921 A | 10/2013 | | |
| TW | 201138117 | 11/2011 | | |
| TW | 201203544 | 1/2012 | | |
| TW | 201236157 | 9/2012 | | |
| TW | 201244103 | 11/2012 | | |
| WO | WO-2004/114391 | 12/2004 | | |
| WO | WO-2011/077966 | 6/2011 | | |
| WO | WO-2011/096263 | 8/2011 | | |
| WO | WO-2012/073844 | 6/2012 | | |
| WO | WO2012071878 | * | 6/2012 | ....... H01L 29/66742 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions of Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IDEM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Fe, Ni, Cu,or Zn] at Temperatures Over 1000° C", Journal of Solid State Chemistry, 1985, vol. 60, pp. 382-384.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m—7, 8, 9, and 16) in the In2O3—ZnGa2O4—ZnO System", Journal of Solid State Chemisty, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

(56) References Cited

OTHER PUBLICATIONS

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", JPN. J. Appl. Phys. (Japanese Journal of Applied Physics), 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White TANDEM OLEDS", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Elecrochemical Society), 2008, vol. 155, No. 12, pp. H1009-H1014.
Ohara.H et al., "21.3:4.0 In. QVGA AMOLED Display Using In—Ga—Zn—Oxide TFTS With a Novel Passivation Layer", SID Digest '09 : SID International Symposium Digest of Technical Papers, May 31, 2009, pp. 284-287.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Park.J et al., "Amorphous Indium—Gallium—Zinc Oxide TFTS and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors By Ar Plasma Treatment", Appl. Physics Lett. (Applied Physics Letters), Jun. 26, 2007, vol. 90, No. 26, pp. 262106-1-262106-3.
Park.S et al., "Challenge to Future Displays: Transparent AM-OLED Driven by PEALD Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Sakata.J et al., "Development of 4.0-In. AMOLED Display With Driver Circuit Using Amorphous In—Ga—Zn—Oxide TFTS", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Yamazaki.S et al., "Research, Development, and Application of Crystalline Oxide Semiconductor", SID Digest '12 : SID International Symposium Digest of Technical Papers, Jun. 5, 2012, pp. 183-186.
Aoki.T et al., "Electronic Global Shutter CMOS Image Sensor Using Oxide Semiconductor FET With Extremely Low Off-State Current", 2011 Symposium on VLSI Technology : Digest of Technical Papers, 2011, pp. 174-175.
Kato.K et al., "Evaluation of Off-State Current Characteristics of Transistor Using Oxide Semiconductor Material, Indium.Gallium. Zinc Oxide", JPN. J. Appl. Phys. (Japanese Journal of Applied Physics), 2012, vol. 51, pp. 021201-1-021201-7.
Inoue.H et al., "Nonvolatile Memory With Extremely Low-Leakage Indium—Gallium—Zinc—Oxide Thin-Film Transistor", IEEE Journal of Solid-State Circuits, Sep. 1, 2012, vol. 47, No. 9, pp. 2258-2265.
Ohmaru.T, "Eight-Bit CPU With Nonvolatile Registers Capable of Holding Data for 40 Days at 85° C Using Crystalline In—Ga—Zn Oxide Thin Film Transistors", Extended Abstracts of the 2012 International Conference on Solid State Devices and Materials, 2012, pp. 1144-1145.
International Search Report (Application No. PCT/IB2015/050264) Dated May 19, 2015.

(56) References Cited

OTHER PUBLICATIONS

Written Opinion (Application No. PCT/IB2015/050264) Dated May 19, 2015.

* cited by examiner

FIG. 9A
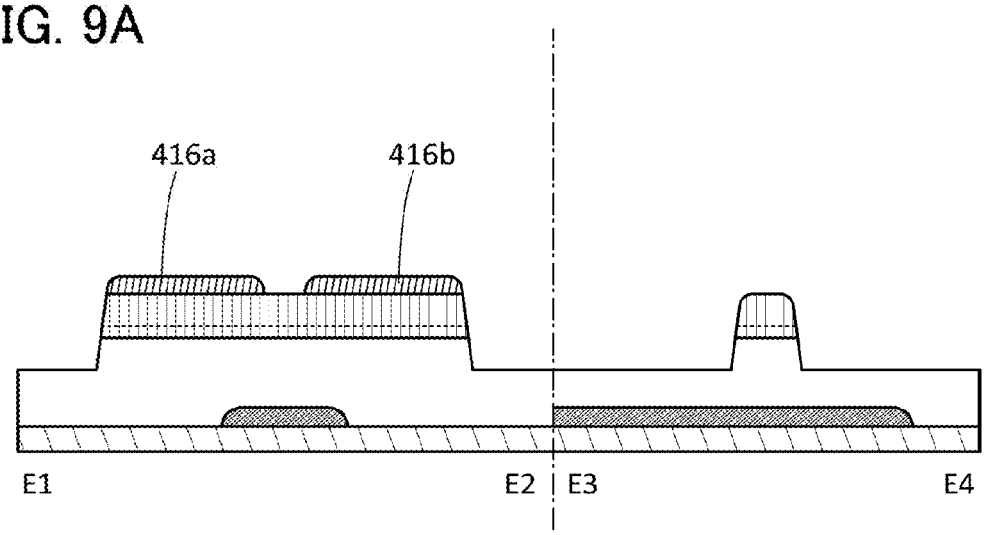
FIG. 9B
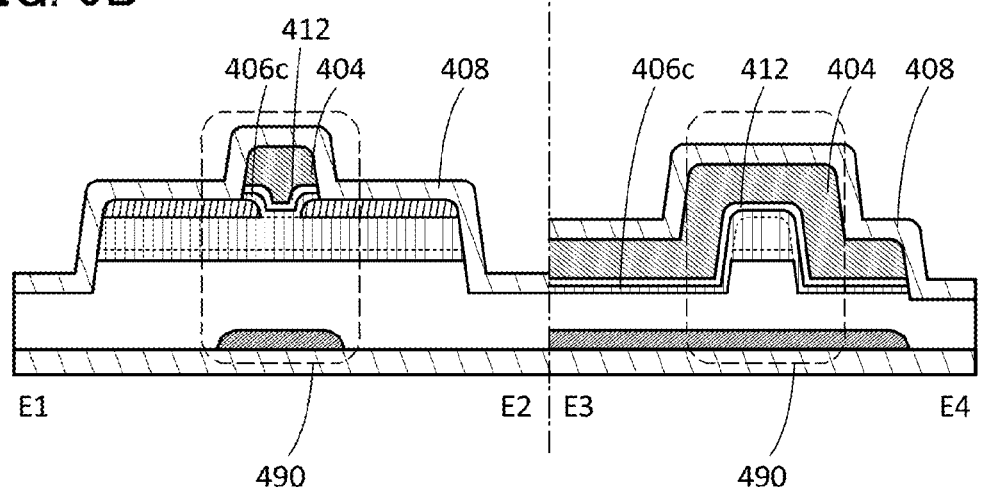
FIG. 9C1
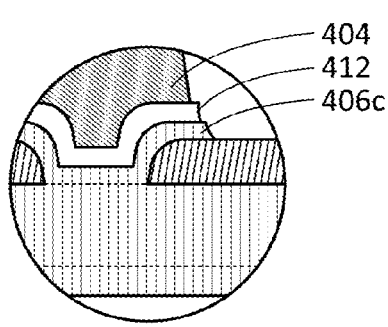
FIG. 9C2
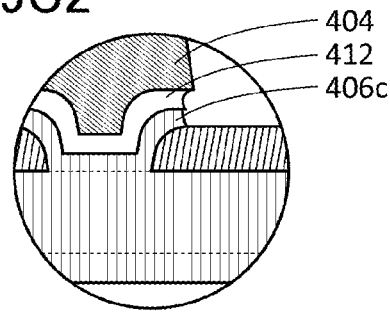

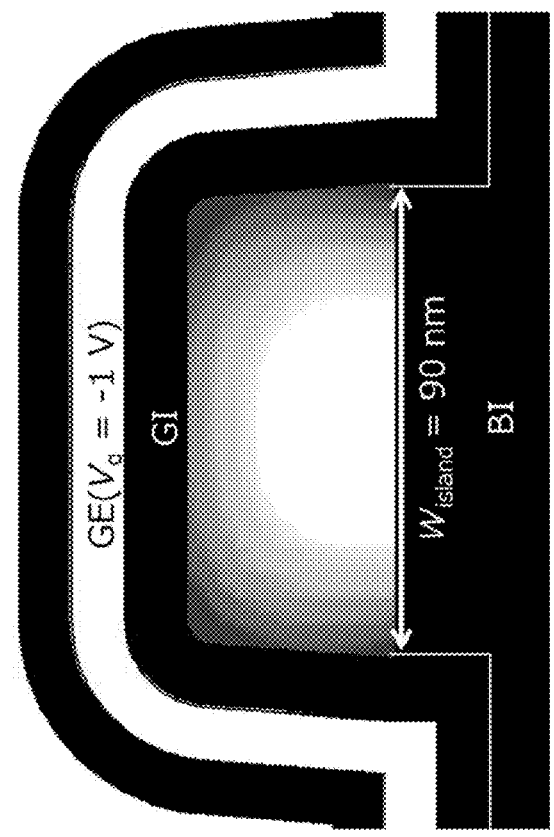
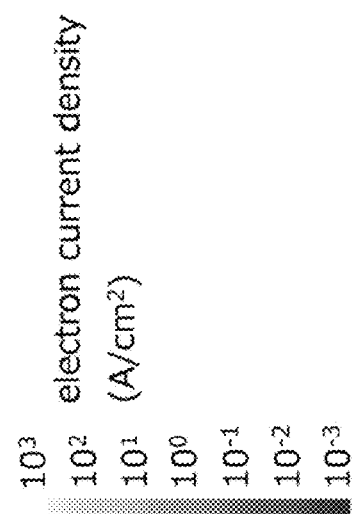
FIG. 31A
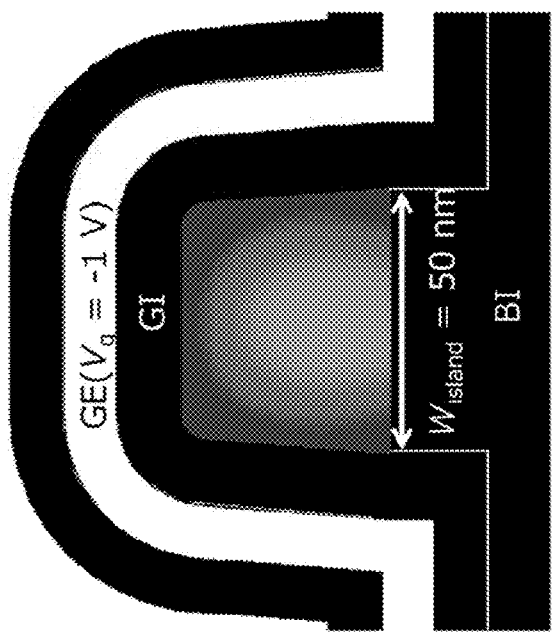
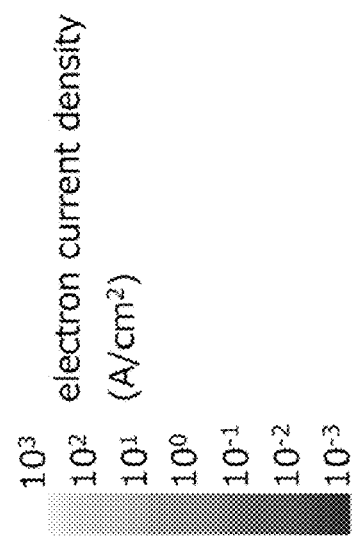
FIG. 31B

FIG. 38A
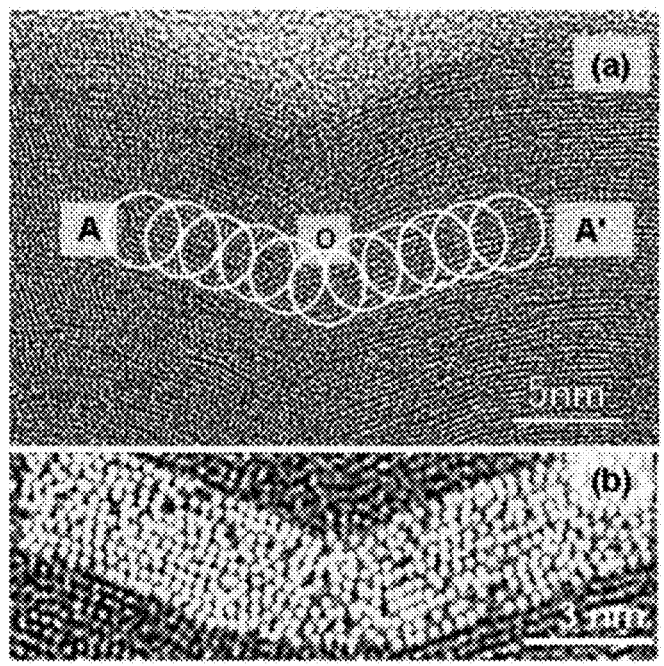
FIG. 38B
FIG. 38C
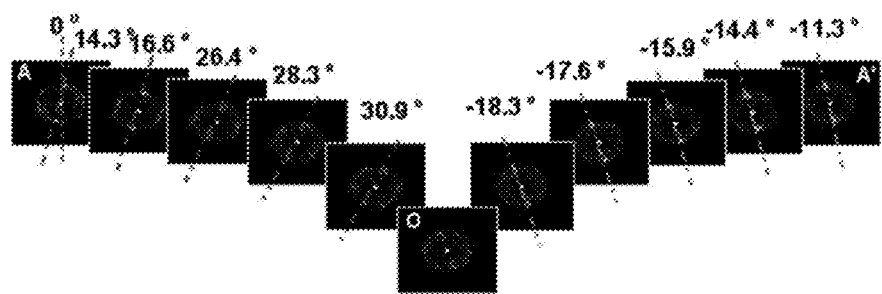

CAAC-OS nc-OS as-sputtered heat treatment at 450°C

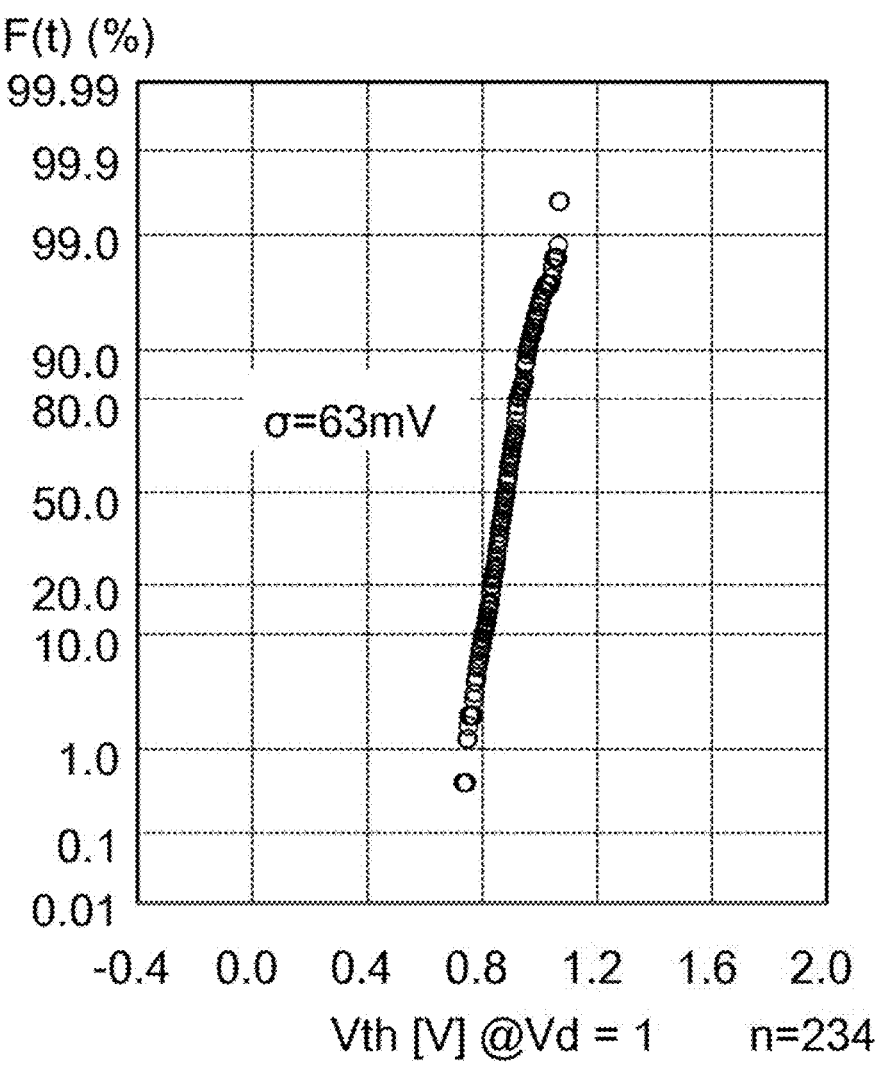

SEMICONDUCTOR DEVICE

TECHNICAL FIELD

The present invention relates to an object, a method, or a manufacturing method. Further, the present invention relates to a process, a machine, manufacture, or a composition of matter. In particular, the present invention relates to, for example, a semiconductor, a semiconductor device, a display device, a light-emitting device, a lighting device, a power storage device, a memory device, or a processor. The present invention relates to a method for manufacturing a semiconductor, a semiconductor device, a display device, a light-emitting device, a lighting device, a power storage device, a memory device, or a processor. The present invention relates to a method for driving a semiconductor device, a display device, a light-emitting device, a lighting device, a power storage device, a memory device, or a processor.

In this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

BACKGROUND ART

A technique by which transistors are formed using semiconductor thin films formed over a substrate having an insulating surface has been attracting attention. The transistor is used in a wide range of electronic devices such as an integrated circuit (IC) or an image display device (also simply referred to as a display device). As semiconductor thin films that can be used for the transistors, silicon-based semiconductor materials have been widely known, but oxide semiconductors have been attracting attention as alternative materials.

For example, a technique for forming a transistor using zinc oxide or an In—Ga—Zn oxide semiconductor is disclosed (see Patent Documents 1 and 2).

A high-resolution, low-power display device in which an oxide semiconductor having a c-axis aligned crystal structure is used for an active layer of a transistor is disclosed (see Non-Patent Document 1).

In recent years, demand for integrated circuits in which semiconductor elements such as miniaturized transistors are integrated with a high density has risen with increased performance and reductions in the size and weight of electronic devices.

For example, when a transistor includes, in an active layer, an oxide semiconductor with a crystal structure in which c-axes are aligned in a direction perpendicular to a surface, the transistor has extremely low off-state current (see Non-Patent Document 2). Application of the transistor to an LSI such as a nonvolatile memory, a CPU, or an image sensor by utilizing the features of the transistor is suggested (see Non-Patent Documents 3 to 5).

REFERENCE

Patent Document

[Patent Document 1] Japanese Published Patent Application No. 2007-123861

[Patent Document 2] Japanese Published Patent Application No. 2007-096055

Non-Patent Document

[Non-Patent Document 1] S. Yamazaki et al., *The Society for Information Display* 2012 *International Symposium Digest*, pp. 183-186

[Non-Patent Document 2] K. Kato et al., *Japanese Journal of Applied Physics* 2012, vol. 51, 021201

[Non-Patent Document 3] H. Inoue et al., *The Institute of Electrical and Electronics Engineers Journal of Solid-State Circuits* 2012, vol. 47, pp. 2258-2065

[Non-Patent Document 4] T. Ohmaru et al., Extented Abstract, *Solid State Devices and Materials* 2012, pp. 1144-1145

[Non-Patent Document 5] T. Aoki et al., Symposia on VLSI Technology Digest of Technical Papers, 2011, pp. 174-175

DISCLOSURE OF INVENTION

An object of one embodiment of the present invention is to provide a transistor having favorable electrical characteristics. An object of one embodiment of the present invention is to provide a transistor suitable for miniaturization. An object of one embodiment of the present invention is to provide a transistor having a high switching speed. An object of one embodiment of the present invention is to provide a transistor having high on-state current. An object of one embodiment of the present invention is to provide a semiconductor device including the transistor. An object of one embodiment of the present invention is to provide a semiconductor device including the transistor and having a high operation speed.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device that includes a transistor. The transistor includes an oxide semiconductor, a gate electrode, and a gate insulator. The oxide semiconductor includes a first region in which the oxide semiconductor and the gate electrode overlap with each other with the gate insulator positioned therebetween. The transistor has a threshold voltage higher than 0 V and a switching speed lower than 100 nanoseconds.

Another embodiment of the present invention is the semiconductor device in which current flows in the whole oxide semiconductor when a voltage higher than or equal to the threshold voltage is applied to the gate electrode.

Another embodiment of the present invention is the semiconductor device in which the first region has a carrier density lower than $1 \times 10^{15}$ cm$^{-3}$.

Another embodiment of the present invention is the semiconductor device in which the oxide semiconductor includes a second region in which a side surface of the oxide semiconductor and the gate electrode face each other with the gate insulator positioned therebetween.

Another embodiment of the present invention is the semiconductor device in which a conductor is in contact with the oxide semiconductor, the oxide semiconductor includes a third region in contact with the conductor, the third region includes a site of an oxygen vacancy, and the site of the oxygen vacancy includes hydrogen.

Another embodiment of the present invention is the semiconductor device in which the third region is an n-type conductive region.

One embodiment of the present invention makes it possible to provide a transistor having favorable electrical characteristics. One embodiment of the present invention makes it possible to provide a transistor suitable for miniaturization. One embodiment of the present invention makes it possible to provide a transistor having a high switching speed. One embodiment of the present invention makes it possible to provide a transistor having high on-state current. One embodiment of the present invention makes it possible to provide a semiconductor device including the transistor. One embodiment of the present invention makes it possible to provide a semiconductor device including the transistor and having a high operation speed.

BRIEF DESCRIPTION OF DRAWINGS

FIGS. 9A, 9B, 9C1, 9C2 are cross-sectional views illustrating an example of a method for manufacturing a transistor of one embodiment of the present invention.

FIGS. 31A and 31B each show electron current density distribution in an active layer obtained by device calculation.

FIGS. 38A to 38C are high-resolution cross-sectional TEM images and a local Fourier transform image of an oxide semiconductor.

FIG. 41 shows cumulative frequency distribution of the threshold values of transistors of embodiments of the present invention.

BEST MODE FOR CARRYING OUT THE INVENTION

Figure 1A:
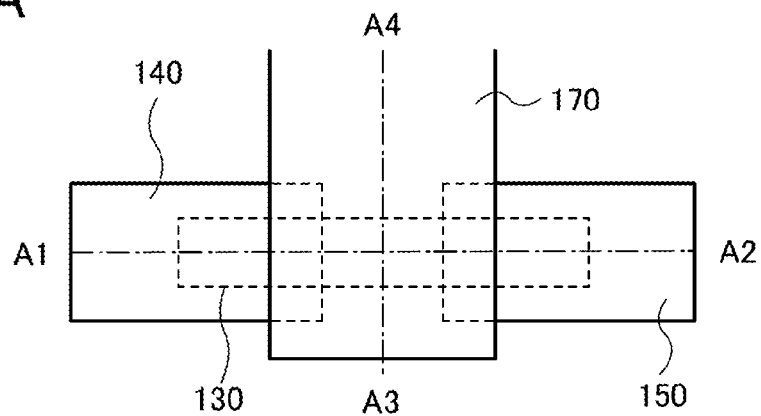
FIGS. 1A to 1C are a top view and cross-sectional views illustrating a transistor of one embodiment of the present invention.

Hereinafter, embodiments of the present invention will be described in detail with the reference to the drawings. However, the present invention is not limited to the description below, and it is easily understood by those skilled in the art that modes and details disclosed herein can be modified in various ways. Further, the present invention is not construed as being limited to description of the embodiments. In describing structures of the present invention with reference to the drawings, common reference numerals are used for the same portions in different drawings. Note that the same hatched pattern is applied to similar parts, and the similar parts are not especially denoted by reference numerals in some cases.

Note that the size, the thickness of films (layers), or regions in drawings is sometimes exaggerated for simplicity.

A voltage usually refers to a potential difference between a given potential and a reference potential (e.g., a source potential or a ground potential (GND)). A voltage can be referred to as a potential and vice versa.

Note that the ordinal numbers such as "first" and "second" in this specification are used for convenience and do not denote the order of steps or the stacking order of layers. Therefore, for example, the term "first" can be replaced with the term "second", "third", or the like as appropriate. In addition, the ordinal numbers in this specification and the like are not necessarily the same as those which specify one embodiment of the present invention.

Note that a "semiconductor" includes characteristics of an "insulator" in some cases when the conductivity is sufficiently low, for example. Further, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Further, a "semiconductor" includes characteristics of a "conductor" in some cases when the conductivity is sufficiently high, for example. Further, a "semiconductor" and a "conductor" cannot be strictly distinguished from each other in some cases because a border between the "semiconductor" and the "conductor" is not clear. Accordingly, a "semiconductor" in this specification can be called a "conductor" in some cases. Similarly, a "conductor" in this specification can be called a "semiconductor" in some cases.

Note that an impurity in a semiconductor refers to, for example, elements other than the main components of the semiconductor. For example, an element with a concentration of lower than 0.1 atomic % is an impurity. When an impurity is contained, the density of states (DOS) may be formed in a semiconductor, the carrier mobility may be decreased, or the crystallinity may be decreased, for example. In the case where the semiconductor is an oxide semiconductor, examples of an impurity which changes characteristics of the semiconductor include Group 1 elements, Group 2 elements, Group 14 elements, Group 15 elements, and transition metals other than the main components; specifically, there are hydrogen (included in water), lithium, sodium, silicon, boron, phosphorus, carbon, and nitrogen, for example. In the case of an oxide semiconductor, an oxygen vacancy may be formed by entry of impurities such as hydrogen. Further, in the case where the semiconductor is silicon, examples of an impurity which changes characteristics of the semiconductor include oxygen, Group 1 elements except hydrogen, Group 2 elements, Group 13 elements, and Group 15 elements.

Note that in the embodiments described below, an insulator may be formed to have, for example, a single-layer structure or a stacked-layer structure including an insulator containing one or more of boron, carbon, nitrogen, oxygen, fluorine, magnesium, aluminum, silicon, phosphorus, chlorine, argon, gallium, germanium, yttrium, zirconium, lanthanum, neodymium, hafnium, and tantalum unless otherwise specified. A resin may be used for the insulator. For example, a resin containing polyimide, polyamide, acrylic, silicone, or the like may be used. The use of a resin does not need planarization treatment performed on the top surface of the insulator in some cases. By using a resin, a thick film can be formed in a short time; thus, the productivity can be increased. The insulator may be preferably formed to have, for example, a single-layer structure or a stacked-layer structure including an insulator containing aluminum oxide, silicon nitride oxide, silicon nitride, gallium oxide, yttrium oxide, zirconium oxide, lanthanum oxide, neodymium oxide, hafnium oxide, or tantalum oxide.

Note that in the following embodiments, unless otherwise specified, a conductor may be formed to have, for example, a single-layer structure or a stacked-layer structure including a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

In this specification, the phrase "A has a region with a concentration B" includes, for example, "the concentration of the entire region of A in the depth direction is a concentration B", "the average concentration in a region of A in the depth direction is a concentration B", "the median value of a concentration in a region of A in the depth direction is a concentration B", "the maximum value of a concentration in a region of A in the depth direction is a concentration B", "the minimum value of a concentration in a region of A in the depth direction is a concentration B", "a convergence value of a concentration in a region of A in the depth direction is a concentration B", and "a concentration in a region in which a probable value is obtained in measurement is a concentration B".

In this specification, the phrase "A has a region with a size B, a length B, a thickness B, a width B, or a distance B" includes, for example, "the size, the length, the thickness, the width, or the distance of the entire region of A is B", "the average value of the size, the length, the thickness, the width, or the distance of a region of A is B", "the median value of the size, the length, the thickness, the width, or the distance of a region of A is B", "the maximum value of the size, the length, the thickness, the width, or the distance of a region of A is B", "the minimum value of the size, the length, the thickness, the width, or the distance of a region of A is B", "a convergence value of the size, the length, the thickness, the width, or the distance of a region of A is B", and "the size, the length, the thickness, the width, or the distance of a region in which a probable value is obtained in measurement is B".

Embodiment 1

In this embodiment, a semiconductor device of one embodiment of the present invention is described with reference to drawings.

In the description below, unless otherwise specified, a semiconductor device described as an example includes an oxide semiconductor in a channel formation region.

Figure 1B:
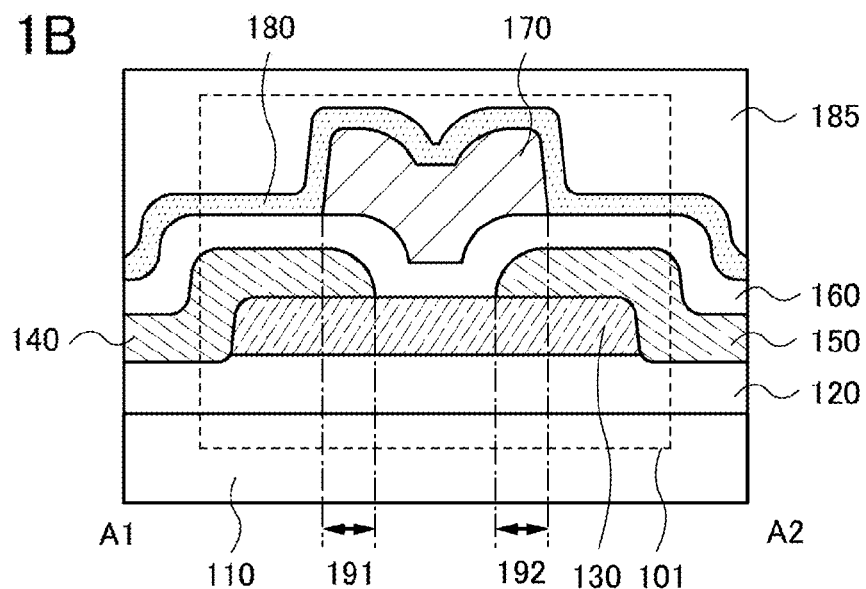
Figure 1C:
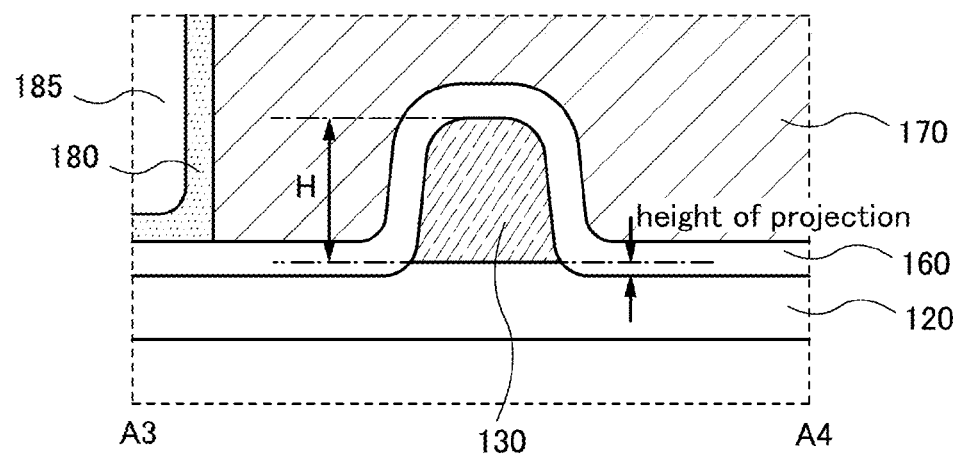

FIG. 1A is a top view. FIG. 1B illustrates a cross section in the direction of a dashed-dotted line A1-A2 in FIG. 1A. FIG. 1C illustrates a cross section in the direction of a dashed-dotted line A3-A4 in FIG. 1A. In FIGS. 1A to 1C, some components are enlarged, reduced in size, or omitted for easy understanding. In some cases, the direction of the dashed-dotted line A1-A2 is referred to as a channel length direction, and the direction of the dashed-dotted line A3-A4 is referred to as a channel width direction.

Note that the channel length refers to, for example, a distance between a source (a source region or a source electrode) and a drain (a drain region or a drain electrode) in a region where a semiconductor (or a portion where current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where current flows in a semiconductor when a transistor is on) and a gate electrode overlap with each other, or a region where a channel is formed. In one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

Note that depending on a transistor structure, a channel width in a region where a channel is actually formed (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of a semiconductor in some cases. In that case, an effective channel width obtained when a channel is actually formed is greater than an apparent channel width shown in the top view.

In a transistor having a three-dimensional structure, an effective channel width is difficult to measure in some cases. For example, estimation of an effective channel width from a design value requires an assumption that the shape of a semiconductor is known. Therefore, in the case where the shape of a semiconductor is not known accurately, it is difficult to measure an effective channel width accurately.

Therefore, in this specification, in a top view of a transistor, an apparent channel width that is the length of a portion where a source and a drain face each other in a region where a semiconductor and a gate electrode overlap with each other is referred to as a surrounded channel width (SCW) in some cases. Further, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, a value different from one in the case where an effective channel width is used for the calculation is obtained in some cases.

The transistor 101 includes an insulator 120 over a substrate 110; an oxide semiconductor 130 over the insulator 120; a source electrode 140 and a drain electrode 150 electrically connected to the oxide semiconductor 130; a gate insulator 160 over the oxide semiconductor 130, the source electrode 140, and the drain electrode 150; and a gate electrode 170 overlapping with the oxide semiconductor 130, part of the source electrode 140, and part of the drain electrode 150 with the gate insulator 160 provided therebetween. In addition, an insulator 180 may be provided over the gate insulator 160 and the gate electrode 170. Further, an insulator 185 formed using an oxide may be formed over the insulator 180. The insulator 185 is not necessarily provided. Another insulator may be further provided thereover.

The transistor of one embodiment of the present invention has a top-gate structure with a channel length greater than or equal to 10 nm and less than or equal to 300 nm. The transistor includes a region 191 (LovS) where the gate electrode 170 overlaps with the source electrode 140 and a region 192 (LovD) where the gate electrode 170 overlaps with the drain electrode 150. To reduce parasitic capacitance, the width of each of the regions 191 and 192 in the channel length direction is preferably greater than or equal to 3 nm and less than 300 nm.

The oxide semiconductor 130 preferably has a thickness of greater than or equal to 30 nm and less than or equal to 300 nm in a channel formation region. For example, the thickness can be greater than or equal to 100 nm and less than or equal to 200 nm. Note that the thickness may include the height of a projecting portion formed by over-etching of the insulator 120. That is, the sum of the height of the projecting portion and the thickness of the oxide semiconductor 130 may be greater than or equal to 30 nm and less than or equal to 300 nm (e.g., greater than or equal to 100 nm and less than or equal to 200 nm).

The thickness of the oxide semiconductor 130 divided by the channel width is preferably 0.5 or more, e.g., greater than or equal to 0.5 and less than or equal to 5, or greater than or equal to 1 and less than or equal to 3.

The equivalent oxide thickness of the gate insulator 160 is preferably greater than or equal to 2 nm and less than or equal to 30 nm. The equivalent oxide thickness of the insulator 120 is preferably greater than or equal to 10 nm and less than or equal to 1000 nm.

Figure 2:
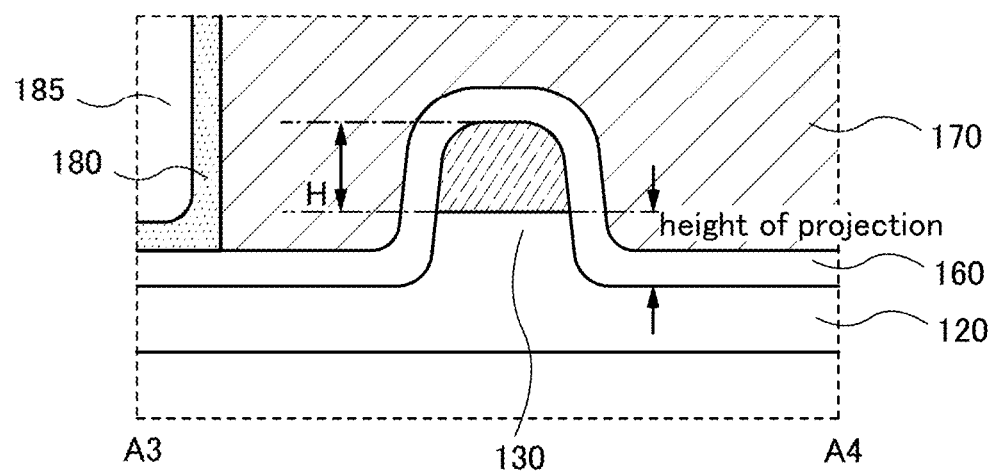
FIG. 2 is a cross-sectional view illustrating a transistor of one embodiment of the present invention.

In the transistor 101 illustrated in FIGS. 1A to 1C, the gate electrode 170 electrically surrounds the oxide semiconductor 130 in the channel width direction. Specifically, as illustrated in FIG. 2, the gate electrode 170 may surround a top surface and a side surface of the oxide semiconductor 130 and extend below the oxide semiconductor 130. Such a transistor structure in which a gate electrode electrically surrounds an oxide semiconductor in the channel width direction is called a surrounded channel (s-channel) structure.

The transistor 101 has a surrounded channel structure and has a small channel width, whereby carriers can be easily controlled with a gate electric field that is applied to the side surface of the oxide semiconductor 130. As a result, the transistor 101 can have favorable subthreshold characteristics and extremely low off-state current. Because of the above structure, the channel is formed in the whole part (bulk) of the oxide semiconductor 130 in some cases. In the s-channel structure, a large amount of current can flow between a source and a drain of a transistor, so that high on-state current can be obtained.

At least part (or the whole) of the source electrode 140 (and/or the drain electrode 150) is in contact with at least part (or the whole) of a surface, a side surface, a top surface, and/or a bottom surface of a semiconductor such as the oxide semiconductor 130. The contact region of the oxide semiconductor 130, in which donor levels are formed by entry of hydrogen into sites of oxygen vacancies in some cases, becomes an n-type conductive region. A state in which hydrogen enters sites of oxygen vacancies are denoted by $V_OH$ in some cases. Because of current flow in the n-type conductive region, high on-state current can be obtained.

Note that it is effective to reduce the concentration of impurities in the channel formation region of the oxide semiconductor 130 to make the oxide semiconductor intrinsic or substantially intrinsic. The term "substantially intrinsic" refers to the state where an oxide semiconductor has a carrier density lower than or equal to $1\times10^{17}/cm^3$, preferably lower than or equal to $1\times10^{15}/cm^3$, further preferably lower than or equal to $1\times10^{13}/cm^3$, further preferably lower than or equal to $1\times10^{11}/cm^3$, further preferably lower than or equal to $1\times10^{10}/cm^3$ and higher than or equal to $1\times10^{-9}/cm^3$. In the oxide semiconductor, hydrogen, nitrogen, carbon, silicon, and a metal element other than main components of the oxide semiconductor are impurities. For example, hydrogen and nitrogen form donor levels to increase the carrier density.

A transistor including the oxide semiconductor has a low carrier density in a channel formation region and thus, the transistor rarely has negative threshold voltage. In addition, because of few carrier traps in the oxide semiconductor, the transistor including the oxide semiconductor has small variation in electrical characteristics and high reliability. Furthermore, a transistor including the oxide semiconductor enables to make the off-state current extremely low.

When the transistor 101 is an accumulation-type transistor whose majority carriers are electrons, an electric field extending from regions of the oxide semiconductor 130 that are in contact with the source electrode 140 and the drain electrode 150 to the channel formation region is easily shielded; thus, carriers can be easily controlled with a gate electric field even when the channel is short.

Unlike in the case of using a semiconductor substrate as a channel formation region, when the transistor is formed over an insulating surface, parasitic capacitance is not formed between the gate electrode and the oxide semiconductor or the semiconductor substrate and thus, carriers can be easily controlled with a gate electric field. Furthermore, favorable switching characteristics can be achieved.

With the above structure, favorable electrical characteristics can be achieved. Specifically, excellent subthreshold characteristics, extremely low off-state current, and high on-state current can be obtained.

By having the above structure, even a minute transistor can have favorable electrical characteristics. Since parasitic capacitance in the transistor is reduced by miniaturization of the transistor, favorable switching characteristics can be obtained.

For example, the channel length and the channel width can each be 50 nm. In the channel formation region, the thickness of the oxide semiconductor 130 can be 40 nm and the equivalent oxide thickness of the gate insulator 160 can be 11 nm, and the equivalent oxide thickness of the insulator 120 can be 390 nm.

As a result, the on-state current standardized on the channel width can be 58 µA/µm and the off-state current can be 0.1 pA or less under a gate voltage of 3 V, a drain voltage of 1 V, and a source voltage of 0 V. The threshold voltage can be positive (i.e., normally off electrical characteristics), and a gate voltage with which a drain current of 1 pA is obtained can be 0 V or more. Drain induced barrier lowering (DIBL) can be greater than or equal to 45 mV/V and less than or equal to 100 mV/V, typically, 67 mV/V, and the subthreshold swing (SS) value can be greater than or equal to 60 mV/dec and less than or equal to 120 mV/dec, typically 92 mV/dec. In this manner, excellent electrical characteristics can be achieved.

With such a structure, the transistor can be normally off and have a switching speed of lower than 100 nanoseconds, preferably higher than or equal to 10 picoseconds and lower than 10 nanoseconds.

When a transistor having a channel length of 64 nm and a channel width of 68 nm is used as a writing transistor and a capacitor is charged, for example, a capacitor with a capacitance of 14 fF can be charged to 90% in approximately 60 nanoseconds.

Furthermore, the transistor can have a switching speed of higher than or equal to 10 picoseconds and lower than 10 nanoseconds, preferably higher than or equal to 100 picoseconds and lower than 3 nanoseconds.

Note that "a transistor has a high switching speed" means that the time required to switch the transistor is short. For example, "a switching speed of a transistor" means time taken for a gate capacitance of the transistor to be charged to 90% and time taken for the transistor to shift from a non-conduction state to a conduction state without load. The time can be regarded as time taken for an increase of a drain current of the transistor to compensate for an increase of charge accumulated in the gate capacitance in response to a potential applied to the gate. Alternatively, the time required to switch a transistor is expressed by $1/(2\times f_T)$ in some cases, where $f_T$ is the maximum frequency (cutoff frequency) at which current gain becomes 1 or more when the transistor is used as an amplifier. Further alternatively, the time required to switch a transistor is expressed by $1/(2\times f_{max})$ in some cases, where $f_{max}$ is the maximum frequency (also called the maximum oscillation frequency) at which power gain becomes 1 or more. As power gain, unilateral power gain or maximum available power gain can be used.

Note that switching speed may be actually measured, or obtained by calculation. In the case of obtaining switching speed by calculation, SPICE can be used. A transistor model parameter is preferably extracted from the electrical characteristics of a transistor that is actually measured. The electrical characteristics may be measured at room temperature. The electrical characteristics at low temperatures (e.g., −40° C.) and those at high temperatures (e.g., 125° C.) may also be measured. As an example of a transistor model, a Rensselaer Polytechnic Institute (RPI) model can be used. A parasitic element such as parasitic capacitance or parasitic resistance is preferably extracted in accordance with a layout.

For example, in SPICE calculation using a transistor model parameter extracted from a transistor with a channel length of 64 nm and a channel width of 68 nm, a capacitor with a capacitance of 1 fF or less can be charged to 90% in 5 nanoseconds or shorter.

With the use of this structure, a transistor can have extremely low off-state current and excellent subthreshold characteristics even when the equivalent oxide thickness of a gate insulator is as large as 11 nm and the channel length is as short as approximately 50 nm.

In addition, with the use of this structure, a transistor can have extremely low off-state current and excellent sub-threshold characteristics even when the equivalent oxide thickness of a gate insulator is as large as 11 nm, a gate overlap structure is employed, and the channel length is as short as approximately 50 nm.

With the use of a relatively thick gate insulator, leakage current through a gate insulator is reduced. A relatively thick gate insulator can be formed easily compared to a thin gate insulator and can have a smaller variation in thickness.

Note that functions of a "source" and a "drain" of a transistor are sometimes replaced with each other when a transistor of opposite polarity is used or when the direction of current flow is changed in circuit operation, for example. Therefore, the terms "source" and "drain" can be replaced with each other in this specification.

Note that at least part (or the whole) of the source electrode 140 (and/or the drain electrode 150) is provided on at least part (or the whole) of a surface, a side surface, a top surface, and/or a bottom surface of a semiconductor such as the oxide semiconductor 130.

Alternatively, at least part (or the whole) of the source electrode 140 (and/or the drain electrode 150) is in contact with at least part (or the whole) of a surface, a side surface, a top surface, and/or a bottom surface of a semiconductor such as the oxide semiconductor 130. Alternatively, at least part (or the whole) of the source electrode 140 (and/or the drain electrode 150) is in contact with at least part (or the whole) of a semiconductor such as the oxide semiconductor 130.

Alternatively, at least part (or the whole) of the source electrode 140 (and/or the drain electrode 150) is electrically connected to at least part (or the whole) of a surface, a side surface, a top surface, and/or a bottom surface of a semiconductor such as the oxide semiconductor 130. Alternatively, at least part (or the whole) of the source electrode 140 (and/or the drain electrode 150) is electrically connected to at least part (or the whole) of a semiconductor such as the oxide semiconductor 130.

Alternatively, at least part (or the whole) of the source electrode 140 (and/or the drain electrode 150) is provided near at least part (or the whole) of a surface, a side surface, a top surface, and/or a bottom surface of a semiconductor such as the oxide semiconductor 130. Alternatively, at least part (or the whole) of the source electrode 140 (and/or the drain electrode 150) is provided near at least part (or the whole) of a semiconductor such as the oxide semiconductor 130.

Alternatively, at least part (or the whole) of the source electrode 140 (and/or the drain electrode 150) is provided next to at least part (or the whole) of a surface, a side surface, a top surface, and/or a bottom surface of a semiconductor such as the oxide semiconductor 130. Alternatively, at least part (or the whole) of the source electrode 140 (and/or the drain electrode 150) is provided next to at least part (or the whole) of a semiconductor such as the oxide semiconductor 130.

Alternatively, at least part (or the whole) of the source electrode 140 (and/or the drain electrode 150) is provided obliquely above at least part (or the whole) of a surface, a side surface, a top surface, and/or a bottom surface of a semiconductor such as the oxide semiconductor 130. Alternatively, at least part (or the whole) of the source electrode 140 (and/or the drain electrode 150) is provided obliquely above at least part (or the whole) of a semiconductor such as the oxide semiconductor 130.

Alternatively, at least part (or the whole) of the source electrode 140 (and/or the drain electrode 150) is provided above at least part (or the whole) of a surface, a side surface, a top surface, and/or a bottom surface of a semiconductor such as the oxide semiconductor 130. Alternatively, at least part (or the whole) of the source electrode 140 (and/or the drain electrode 150) is provided above at least part (or the whole) of a semiconductor such as the oxide semiconductor 130.

Figure 3:
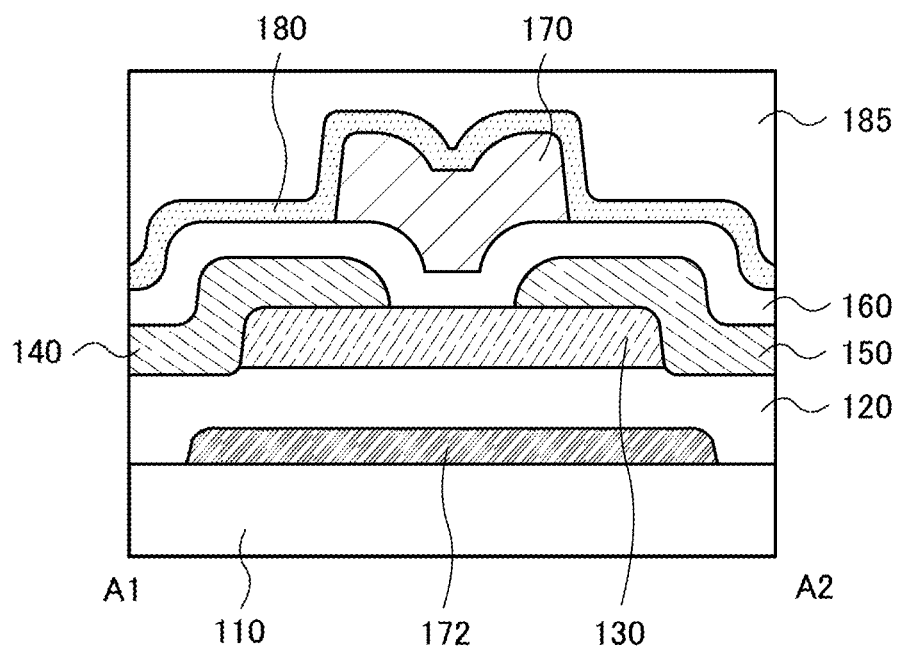
FIG. 3 is a cross-sectional view illustrating a transistor of one embodiment of the present invention.

The transistor 101 may include a conductor 172 between the oxide semiconductor 130 and the substrate 110 as shown in FIG. 3. When the conductor is used as a second gate electrode (back gate), the on-state current can be further increased or the threshold voltage can be controlled. In order to increase the on-state current, for example, the gate electrode 170 and the conductor 172 are set to have the same potential, and the transistor 101 is driven. Further, to control the threshold voltage, a fixed potential, which is different from a potential of the gate electrode 170, is supplied to the conductor 172.

Figure 4A:
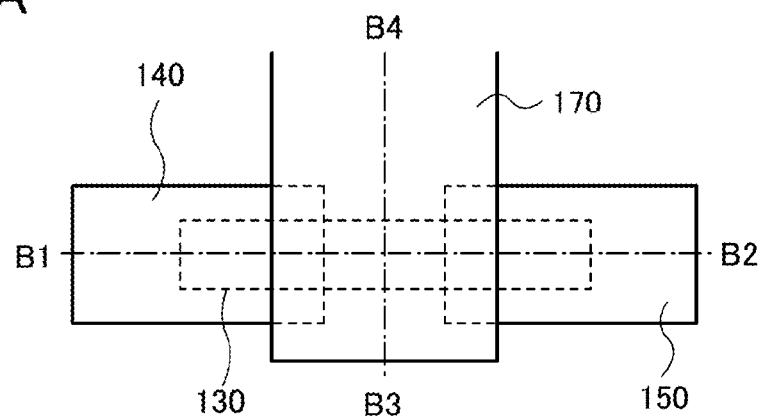
FIGS. 4A to 4C are a top view and cross-sectional views illustrating a transistor of one embodiment of the present invention.
Figure 4B:
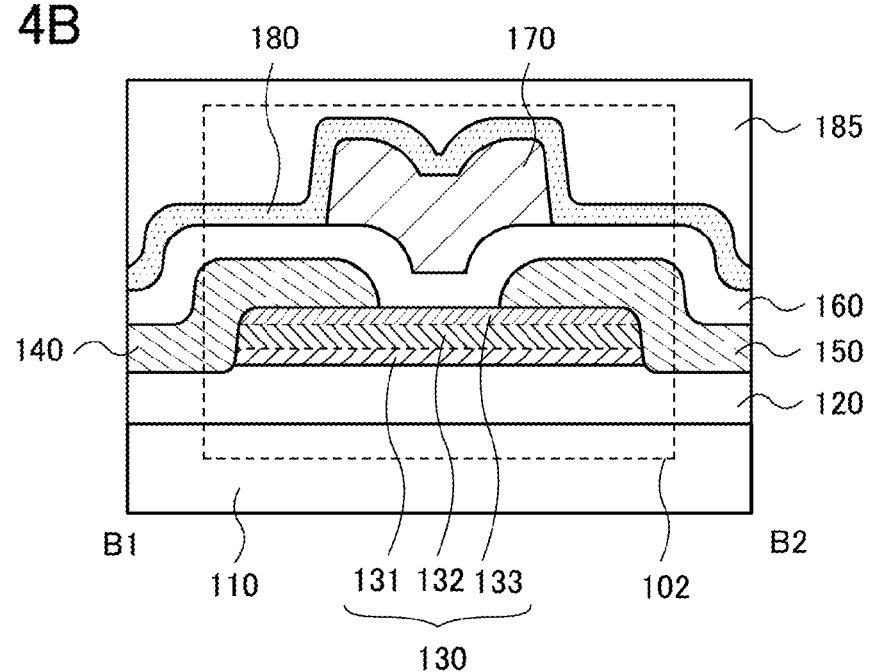
Figure 4C:
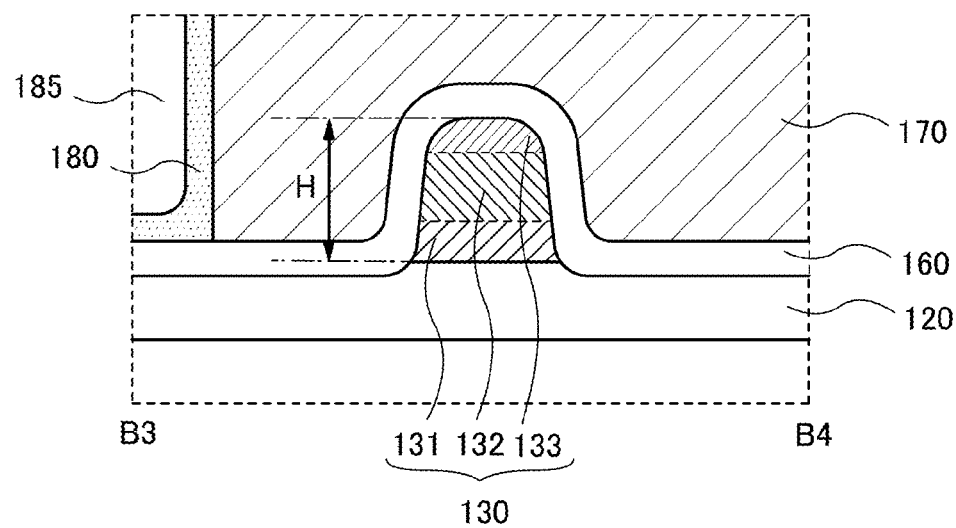

The transistor of one embodiment of the present invention may have a structure illustrated in FIGS. 4A to 4C. FIG. 4A is a top view. FIG. 4B illustrates a cross section in the direction of a dashed-dotted line B1-B2 in FIG. 4A. FIG. 4C illustrates a cross section in the direction of a dashed-dotted line B3-B4 in FIG. 4A. In FIGS. 4A to 4C, some components are enlarged, reduced in size, or omitted for easy understanding. In some cases, the direction of the dashed-dotted line B1-B2 is referred to as a channel length direction, and the direction of the dashed-dotted line B3-B4 is referred to as a channel width direction.

A transistor 102 shown in FIGS. 4A to 4C differs from the transistor 101 in that a first oxide semiconductor 131, a second oxide semiconductor 132, and a third oxide semiconductor 133 are formed, as the oxide semiconductor 130, in this order from the insulator 120 side.

Oxide semiconductors with different compositions, for example, can be used as the first oxide semiconductor 131, the second oxide semiconductor 132, and the third oxide semiconductor 133. Note that the first oxide semiconductor 131 and the third oxide semiconductor 133 may have the same composition, or the composition of the first oxide semiconductor 131 may be in the neighborhood of the composition of the third oxide semiconductor 133.

Note that the description on the shape of the oxide semiconductor 130 in the transistor 101 can also be applied to the transistor 102 and the shape can produce a similar effect. It is also possible to apply the structure shown in FIG. 3 to the transistor 102.

Figure 5A:
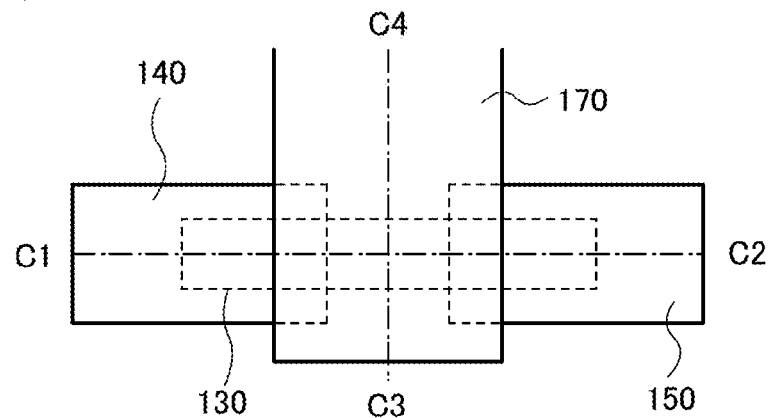
FIGS. 5A to 5C are a top view and cross-sectional views illustrating a transistor of one embodiment of the present invention.
Figure 5B:
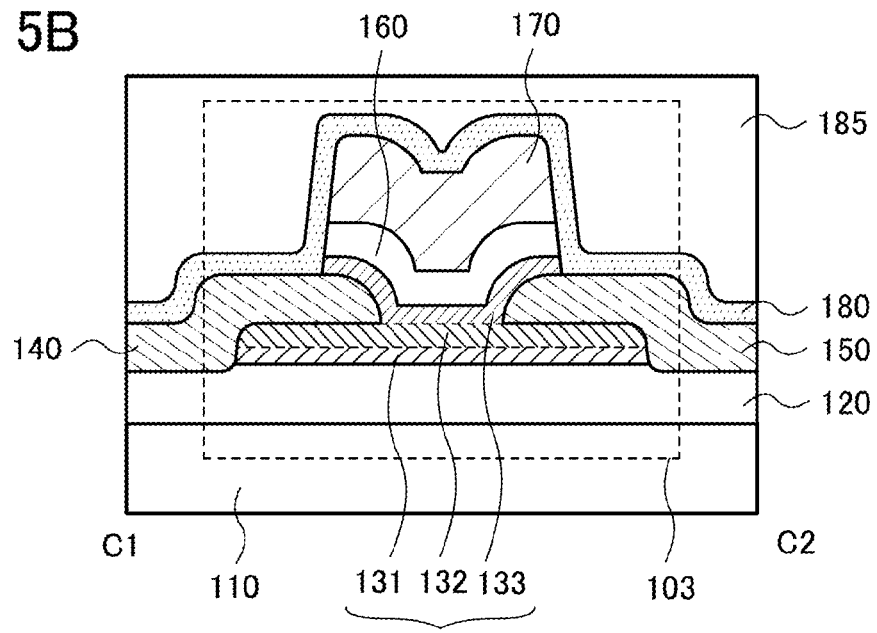
Figure 5C:
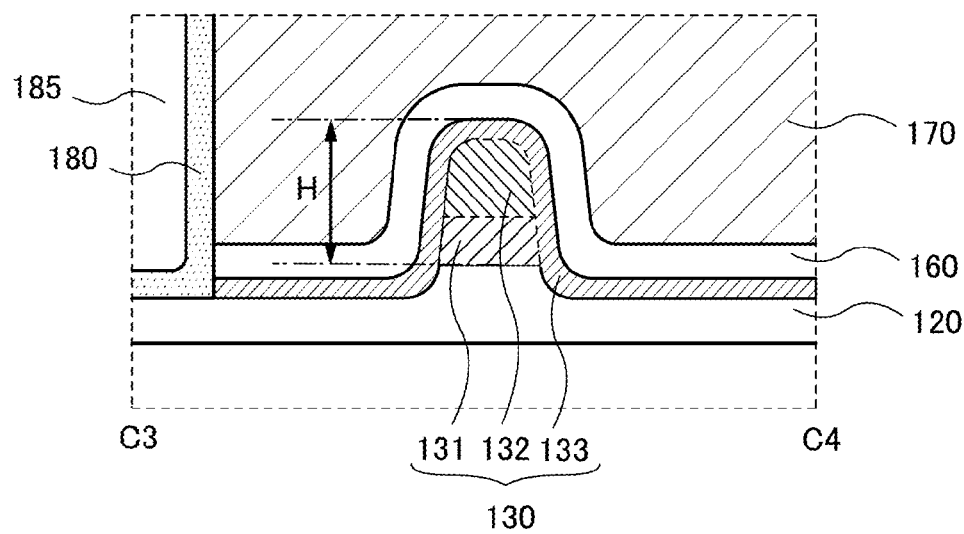

The transistor of one embodiment of the present invention may have a structure illustrated in FIGS. 5A to 5C. FIG. 5A is a top view. FIG. 5B illustrates a cross section in the direction of a dashed-dotted line C1-C2 in FIG. 5A. FIG. 5C illustrates a cross section in the direction of a dashed-dotted line C3-C4 in FIG. 5A. In FIGS. 5A to 5C, some components are enlarged, reduced in size, or omitted for easy understanding. In some cases, the direction of the dashed-dotted line C1-C2 is referred to as a channel length direction, and the direction of the dashed-dotted line C3-C4 is referred to as a channel width direction.

A transistor 103 shown in FIGS. 5A to 5C differs from the transistor 101 and the transistor 102 in that the oxide semiconductor 130 includes a stack in which the first oxide semiconductor 131 and the second oxide semiconductor 132 are formed in this order from the insulator 120 side and the third oxide semiconductor 133 covering part of the stack.

Oxide semiconductors with different compositions, for example, can be used as the first oxide semiconductor 131, the second oxide semiconductor 132, and the third oxide semiconductor 133. Note that the first oxide semiconductor 131 and the third oxide semiconductor 133 may have the same composition, or the composition of the first oxide semiconductor 131 may be in the neighborhood of the composition of the third oxide semiconductor 133.

Specifically, the transistor 103 includes the insulator 120 over the substrate 110; the stack in which the first oxide semiconductor 131 and the second oxide semiconductor 132 are formed in this order over the insulator 120; the source electrode 140 and the drain electrode 150 electrically connected to part of the stack; the third oxide semiconductor 133 covering part of the stack, part of the source electrode 140, and part of the drain electrode 150; and the gate insulator 160 and the gate electrode 170 overlapping with part of the stack, part of the source electrode 140, part of the drain electrode 150, and the third oxide semiconductor 133. The insulator 180 may be provided over the source electrode 140, the drain electrode 150, and the gate electrode 170. Further, the insulator 185 formed using an oxide may be formed over the insulator 180. The insulator 185 is not necessarily provided. Another insulator may be further provided thereover.

In the transistor 101 illustrated in FIGS. 1A to 1C, the oxide semiconductor 130 is a single layer in a channel formation region. Meanwhile, in the transistor 102 illustrated in FIGS. 4A to 4C, the oxide semiconductor 130 has a three-layer structure in which the first oxide semiconductor 131, the second oxide semiconductor 132, and the third oxide semiconductor 133 are stacked from the substrate 110 side. In the transistor 103 illustrated in FIGS. 5A to 5C, as in the transistor 102, the oxide semiconductor 130 has a three-layer structure. In the channel formation region, the second oxide semiconductor 132 is surrounded by the first oxide semiconductor 131 and the third oxide semiconductor 133.

In each of the structures of the transistor 102 and the transistor 103, selecting appropriate materials for the three layers forming the oxide semiconductor 130 allows current to flow in the whole of the second oxide semiconductor 132. Since current flows in the second oxide semiconductor 132 in an inner part of the oxide semiconductor 130, the current is hardly influenced by interface scattering, leading to a high on-state current. Note that increasing the thickness of the second oxide semiconductor 132 can increase the on-state current.

Next, the components of the transistor of one embodiment of the present invention will be described in detail.

The substrate 110 is not limited to a simple supporting substrate, and may be a substrate where another device such as a transistor is formed. In that case, one of the gate electrode 170, the source electrode 140, and the drain electrode 150 of the transistor may be electrically connected to the above another device.

The insulator 120 can have a function of supplying oxygen to the oxide semiconductor 130 as well as a function of preventing diffusion of impurities from the substrate 110. For this reason, the insulator 120 is preferably an insulator containing oxygen and further preferably, the insulator 120 is an insulator containing oxygen in which the oxygen content is higher than that in the stoichiometric composition. For example, the insulator 120 is a film of which the amount of released oxygen converted into oxygen atoms is $1.0 \times 10^{19}$ atoms/cm$^3$ or more in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 500° C. In the case where the substrate 110 is provided with another device as described above, the insulator 120 also has a function as an interlayer insulator. In that case, the insulator 120 is preferably subjected to planarization treatment such as chemical mechanical polishing (CMP) treatment so as to have a flat surface.

In this embodiment, detailed description is given mainly on the case where the oxide semiconductor 130 has a three-layer structure; however, there is no limitation on the number of stacked layers. In the case where the oxide semiconductor 130 is a single layer as in the transistor 101, a layer corresponding to the second oxide semiconductor 132 described in this embodiment is used. In the case where the oxide semiconductor 130 has a two-layer structure, for example, a structure of the oxide semiconductor 130 in the transistor 102 or the transistor 103 without the third oxide semiconductor 133 is employed. In such a case, the second oxide semiconductor 132 and the first oxide semiconductor 131 can be replaced with each other. In the case where the oxide semiconductor 130 has a stacked-layer structure of four or more layers, for example, a structure in which another oxide semiconductor is stacked over the three-layer stack described in this embodiment or a structure in which another oxide semiconductor is inserted in any one of the interfaces in the three-layer stack can be employed.

For the second oxide semiconductor 132, for example, an oxide semiconductor whose electron affinity (an energy difference between a vacuum level and the conduction band minimum) is higher than those of the first oxide semiconductor 131 and the third oxide semiconductor 133 is used. The electron affinity can be obtained by subtracting an energy difference between the conduction band minimum and the valence band maximum (what is called an energy gap) from an energy difference between the vacuum level and the valence band maximum (what is called an ionization potential).

The first oxide semiconductor 131 and the third oxide semiconductor 133 each contain one or more kinds of metal elements contained in the second oxide semiconductor 132. For example, the first oxide semiconductor 131 and the third oxide semiconductor 133 are preferably formed using an oxide semiconductor whose conduction band minimum is closer to a vacuum level than that of the second oxide semiconductor 132 by 0.05 eV or more, 0.07 eV or more, 0.1 eV or more, or 0.15 eV or more and 2 eV or less, 1 eV or less, 0.5 eV or less, or 0.4 eV or less.

In such a structure, when an electric field is applied to the gate electrode 170, a channel is formed in the second oxide semiconductor 132 whose conduction band minimum is the lowest in the oxide semiconductor 130.

Further, since the first oxide semiconductor 131 contains one or more kinds of metal elements contained in the second oxide semiconductor 132, an interface state is unlikely to be formed at the interface between the second oxide semiconductor 132 and the first oxide semiconductor 131, compared with the interface between the second oxide semiconductor 132 and the insulator 120 on the assumption that the second oxide semiconductor 132 is in contact with the insulator 120. The interface state sometimes forms a channel; therefore, the threshold voltage of the transistor is changed in some cases. Thus, with the first oxide semiconductor 131, fluctuations in electrical characteristics of the transistor, such as a threshold voltage, can be reduced. Further, the reliability of the transistor can be improved.

Furthermore, since the third oxide semiconductor 133 contains one or more kinds of metal elements contained in the second oxide semiconductor 132, scattering of carriers is unlikely to occur at the interface between the second oxide semiconductor 132 and the third oxide semiconductor 133, compared with the interface between the second oxide semiconductor 132 and the gate insulator 160 on the assumption that the second oxide semiconductor 132 is in contact with the gate insulator 160. Thus, with the third oxide semiconductor 133, the field-effect mobility of the transistor can be increased.

For the first oxide semiconductor 131 and the third oxide semiconductor 133, for example, a material containing Al, Ti, Ga, Ge, Y, Zr, Sn, La, Ce, or Hf with a higher atomic ratio than that used for the second oxide semiconductor 132 can be used. Specifically, an atomic ratio of any of the above metal elements in the first oxide semiconductor 131 and the third oxide semiconductor 133 is 1.5 times or more, preferably 2 times or more, further preferably 3 times or more as much as that in the second oxide semiconductor 132. Any of the above metal elements is strongly bonded to oxygen and thus has a function of suppressing generation of an oxygen vacancy in the oxide semiconductor. That is, an oxygen vacancy is less likely to be generated in the first oxide semiconductor 131 and the third oxide semiconductor 133 than in the second oxide semiconductor 132.

Note that when each of the first oxide semiconductor 131, the second oxide semiconductor 132, and the third oxide semiconductor 133 is an In-M-Zn oxide containing at least indium, zinc, and M (M is a metal such as Al, Ti, Ga, Ge, Y, Zr, Sn, La, Ce, or Hf), and the first oxide semiconductor 131 has an atomic ratio of In to M and Zn which is $x_1:y_1:z_1$, the second oxide semiconductor 132 has an atomic ratio of In to M and Zn which is $x_2:y_2:z_2$, and the third oxide semiconductor 133 has an atomic ratio of In to M and Zn which is $x_3:y_3:z_3$, each of $y_1/x_1$ and $y_3/x_3$ is preferably larger than $y_2/x_2$. Each of $y_1/x_1$ and $y_3/x_3$ is 1.5 times or more, preferably 2 times or more, further preferably 3 times or more as large as $y_2/x_2$. At this time, when $y_2$ is greater than or equal to $x_2$ in the second oxide semiconductor 132, the transistor can have stable electrical characteristics. However, when $y_2$ is 3 times or more as large as $x_2$, the field-effect mobility of the transistor is reduced; accordingly, $y_2$ is preferably smaller than 3 times $x_2$.

In the case where Zn and O are not taken into consideration, the proportion of In and the proportion of M in each of the first oxide semiconductor 131 and the third oxide semiconductor 133 are preferably less than 50 atomic % and greater than 50 atomic %, respectively, further preferably less than 25 atomic % and greater than 75 atomic %, respectively. Further, in the case where Zn and O are not taken into consideration, the proportion of In and the proportion of M in the second oxide semiconductor 132 are preferably greater than 25 atomic % and less than 75 atomic %, respectively, further preferably greater than 34 atomic % and less than 66 atomic %, respectively.

The thicknesses of the first oxide semiconductor 131 and the third oxide semiconductor 133 are each greater than or equal to 3 nm and less than or equal to 100 nm, preferably greater than or equal to 3 nm and less than or equal to 50 nm. The thickness of the second oxide semiconductor 132 is greater than or equal to 3 nm and less than or equal to 200 nm, preferably greater than or equal to 10 nm and less than or equal to 100 nm, further preferably greater than or equal to 10 nm and less than or equal to 80 nm. In addition, the second oxide semiconductor 132 is preferably thicker than the first oxide semiconductor 131 and the third oxide semiconductor 133.

Note that in order that a transistor in which an oxide semiconductor serves as a channel can have stable electrical characteristics, it is effective to reduce the concentration of impurities in the oxide semiconductor to make the oxide semiconductor intrinsic or substantially intrinsic. The term "substantially intrinsic" refers to the state where an oxide semiconductor has a carrier density lower than or equal to $1\times10^{17}/cm^3$, preferably lower than or equal to $1\times10^{15}/cm^3$, further preferably lower than or equal to $1\times10^{13}/cm^3$, further preferably lower than or equal to $1\times10^{11}/cm^3$, further preferably lower than or equal to $1\times10^{10}/cm^3$ and higher than or equal to $1\times10^{-9}/cm^3$.

In the oxide semiconductor, hydrogen, nitrogen, carbon, silicon, and a metal element other than main components of the oxide semiconductor are impurities. For example, hydrogen and nitrogen form donor levels to increase the carrier density. In addition, silicon in the oxide semiconductor forms an impurity level. The impurity level serves as a trap and might cause deterioration of electrical characteristics of the transistor. Accordingly, in the first oxide semiconductor 131, the second oxide semiconductor 132, and the third oxide semiconductor 133 and at interfaces between these oxide semiconductors, the impurity concentration is preferably reduced.

In order to make the oxide semiconductor intrinsic or substantially intrinsic, in secondary ion mass spectrometry (SIMS), for example, the concentration of silicon at a certain depth of the oxide semiconductor or in a region of the oxide semiconductor is lower than $1\times10^{19}$ atoms/cm$^3$, preferably lower than $5\times10^{18}$ atoms/cm$^3$, further preferably lower than $1\times10^{18}$ atoms/cm$^3$. Further, the concentration of hydrogen at a certain depth of the oxide semiconductor or in a region of the oxide semiconductor is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. Further, the concentration of nitrogen at a certain depth of the oxide semiconductor or in a region of the oxide semiconductor is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

In the case where the oxide semiconductor includes crystals, high concentration of silicon or carbon might reduce the crystallinity of the oxide semiconductor. In order not to lower the crystallinity of the oxide semiconductor, for example, the concentration of silicon at a certain depth of the oxide semiconductor or in a region of the oxide semiconductor may be lower than $1\times10^{19}$ atoms/cm$^3$, preferably lower than $5\times10^{18}$ atoms/cm$^3$, further preferably lower than $1\times10^{18}$ atoms/cm$^3$. Further, the concentration of carbon at a certain depth of the oxide semiconductor or in a region of the oxide semiconductor may be lower than $1\times10^{19}$ atoms/cm$^3$, preferably lower than $5\times10^{18}$ atoms/cm$^3$, further preferably lower than $1\times10^{18}$ atoms/cm$^3$, for example.

A transistor in which a highly purified oxide semiconductor is used for a channel formation region as described above has an extremely low off-state current. For example, in the case where the voltage between the source and the drain is set to approximately 0.1 V, 5 V, or 10 V, the off-state current standardized on the channel width of the transistor can be as low as several yoctoamperes per micrometer to several zeptoamperes per micrometer.

Such a highly purified oxide semiconductor has few carrier generation sources, and thus can have a low carrier density. Thus, a transistor including the oxide semiconductor rarely has a negative threshold voltage. In addition, the oxide semiconductor has few carrier traps. Accordingly, the transistor including the oxide semiconductor has little variation in electrical characteristics and high reliability.

Note that as the gate insulator of the transistor, an insulator containing silicon is used in many cases; thus, it is preferable that, as in the transistor of one embodiment of the present invention, a region of the oxide semiconductor, which serves as a channel, not be in contact with the gate insulator for the above-described reason. In the case where a channel is formed at the interface between the gate insulator and the oxide semiconductor, scattering of carriers occurs at the interface, whereby the field-effect mobility of the transistor is reduced in some cases. Also from the view of the above, it is preferable that the region of the oxide semiconductor, which serves as a channel, be separated from the gate insulator.

Accordingly, with the oxide semiconductor 130 having a stacked-layer structure including the first oxide semiconductor 131, the second oxide semiconductor 132, and the third oxide semiconductor 133, a channel can be formed in the second oxide semiconductor 132; thus, the transistor can have a high field-effect mobility and stable electrical characteristics. Furthermore, favorable switching characteristics can be achieved.

In a band diagram, the conduction band minimums of the first oxide semiconductor 131, the second oxide semiconductor 132, and the third oxide semiconductor 133 are continuous. This can be understood also from the fact that the compositions of the first oxide semiconductor 131, the second oxide semiconductor 132, and the third oxide semiconductor 133 are close to one another and oxygen is easily diffused among the first oxide semiconductor 131, the second oxide semiconductor 132, and the third oxide semiconductor 133. Thus, the first oxide semiconductor 131, the second oxide semiconductor 132, and the third oxide semiconductor 133 have a continuous physical property although they have different compositions and form a stack. In the drawings in this specification, interfaces between the oxide semiconductors of the stack are indicated by dotted lines.

The oxide semiconductor 130 in which layers containing the same main components are stacked is formed to have not only a simple stacked-layer structure of the layers but also a continuous energy band (here, in particular, a well structure having a U shape in which the conduction band minimums are continuous (U-shaped well)). In other words, the stacked-layer structure is formed such that the concentration of impurities that form a defect level such as a trap center or a recombination center at each interface is low. If impurities exist between the stacked oxide semiconductors at a high concentration, the continuity of the energy band is lost and carriers disappear by a trap or recombination at the interface in some cases.

For example, an In—Ga—Zn oxide whose atomic ratio of In to Ga and Zn is 1:3:2, 1:3:3, 1:3:4, 1:3:6, 1:6:4, or 1:9:6 can be used for the first oxide semiconductor 131 and the third oxide semiconductor 133 and an In—Ga—Zn oxide whose atomic ratio of In to Ga and Zn is 1:1:1, 5:5:6, or 3:1:2 can be used for the second oxide semiconductor 132. Alternatively, it is possible to use an In—Ga—Zn oxide whose atomic ratio of In to Ga and Zn is 1:6:4 or 1:9:6 for the first oxide semiconductor 131 and an In—Ga—Zn oxide whose atomic ratio of In to Ga and Zn is 1:3:2, 1:3:3, or 1:3:4 for the third oxide semiconductor 133, for example. Deposition of the first oxide semiconductor 131, the second oxide semiconductor 132, and the third oxide semiconductor 133 are preferably performed by sputtering using an oxide target with the above-described atomic ratio. When sputtering is used, although depending on substrate heating temperature, the proportion of zinc in the composition of the deposited oxide semiconductor is sometimes lower than that in the composition of the target by approximately 20% to 60%. Furthermore, the proportion of gallium in the composition of the deposited oxide semiconductor is sometimes lower than that in the composition of the target by approximately 1% to 20%.

The second oxide semiconductor 132 of the oxide semiconductor 130 serves as a well, so that a channel is formed in the second oxide semiconductor 132 in a transistor including the oxide semiconductor 130. Note that since the conduction band minimums are continuous, the oxide semiconductor 130 can also be referred to as a U-shaped well. Further, a channel formed to have such a structure can also be referred to as a buried channel.

Note that trap levels due to impurities or defects might be formed in the vicinity of the interface between an insulator such as a silicon oxide film and each of the first oxide semiconductor 131 and the third oxide semiconductor 133. The second oxide semiconductor 132 can be distanced away from the trap levels owing to existence of the first oxide semiconductor 131 and the third oxide semiconductor 133. However, when the energy differences between the conduction band minimum of the second oxide semiconductor 132 and the conduction band minimum of each of the first oxide semiconductor 131 and the third oxide semiconductor 133 are small, an electron in the second oxide semiconductor 132 might reach the trap level by passing over the energy differences. The electron is trapped by the trap level to be negative charge, whereby the threshold voltage of the transistor shifts in the positive direction.

Thus, to reduce fluctuations in the threshold voltage of the transistor, energy differences of at least certain values between the conduction band minimum of the second oxide semiconductor 132 and the conduction band minimum of each of the first oxide semiconductor 131 and the third oxide semiconductor 133 are preferably provided. Each of the energy differences is preferably greater than or equal to 0.1 eV, further preferably greater than or equal to 0.15 eV.

The first oxide semiconductor 131, the second oxide semiconductor 132, and the third oxide semiconductor 133 preferably include crystal parts. In particular, when crystals with c-axis alignment are used, the transistor can have stable electrical characteristics.

As the source electrode 140 and the drain electrode 150, a conductor capable of extracting oxygen from an oxide semiconductor is preferably used. For example, Al, Cr, Cu, Ta, Ti, Mo, or W can be used. Among the materials, in particular, it is preferable to use Ti which is easily bonded to oxygen or to use W with a high melting point, which allows subsequent process temperatures to be relatively high.

By the conductor capable of extracting oxygen from the oxide semiconductor, oxygen in the oxide semiconductor is released to form oxygen vacancies in the oxide semiconductor. Hydrogen slightly contained in the oxide semiconductor and the oxygen vacancy are bonded to each other, whereby the region is markedly changed to an n-type region. Accordingly, the n-type region can serve as a source or a drain of the transistor.

The gate insulator 160 can be formed using an insulator containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The gate insulator 160 may be a stack of any of the above materials. The gate insulator 160 may contain lanthanum (La), nitrogen, or zirconium (Zr) as an impurity.

An example of a stacked-layer structure of the gate insulator 160 will be described. The gate insulator 160 includes, for example, oxygen, nitrogen, silicon, or hafnium. Specifically, the gate insulator 160 preferably includes hafnium oxide and silicon oxide or silicon oxynitride.

Hafnium oxide has higher dielectric constant than silicon oxide and silicon oxynitride. Therefore, by using hafnium oxide, a physical thickness can be made larger than an equivalent oxide thickness; thus, even in the case where the equivalent oxide thickness is less than or equal to 10 nm or less than or equal to 5 nm, leakage current due to tunnel current can be low. That is, it is possible to provide a transistor with low off-state current. Moreover, hafnium oxide with a crystalline structure has higher dielectric constant than hafnium oxide with an amorphous structure. Therefore, it is preferable to use hafnium oxide with a crystalline structure in order to provide a transistor with low off-state current. Examples of the crystalline structure include a monoclinic crystal structure and a cubic crystal structure. Note that one embodiment of the present invention is not limited to the above examples.

A surface over which the hafnium oxide having a crystal structure is formed might have interface states due to defects. The interface state serves as a trap center in some cases. Therefore, when hafnium oxide is provided near a channel formation region of a transistor, the electrical characteristics of the transistor might deteriorate because of the interface state. In order to reduce the adverse effect of the interface state, in some cases, it is preferable to separate the channel formation region of the transistor and the hafnium oxide from each other by providing another film therebetween. The film has a buffer function. The film having a buffer function may be included in the gate insulator 160 or included in the oxide semiconductor. That is, the film having a buffer function can be formed using silicon oxide, silicon oxynitride, an oxide semiconductor, or the like. Note that the film having a buffer function is formed using, for example, a semiconductor or an insulator having a larger energy gap than a semiconductor to be the channel formation region. Alternatively, the film having a buffer function is formed using, for example, a semiconductor or an insulator having lower electron affinity than a semiconductor to be the channel formation region. Further alternatively, the film having a buffer function is formed using, for example, a semiconductor or an insulator having higher ionization energy than a semiconductor to be the channel formation region.

In some cases, the threshold voltage of a transistor can be controlled by trapping an electric charge in an interface state (trap center) in hafnium oxide having the above-described crystalline structure in the surface where the hafnium oxide is formed. In order to make the electric charge exist stably, for example, an insulator having a larger energy gap than hafnium oxide may be provided between the channel formation region and the hafnium oxide. Alternatively, a semiconductor or an insulator having lower electron affinity than hafnium oxide may be provided. The film having a buffer function may be formed using a semiconductor or an insulator having higher ionization energy than hafnium oxide. With the use of such an insulator, an electric charge trapped in the interface state is less likely to be released; accordingly, the electric charge can be held for a long period of time.

Examples of such an insulator include silicon oxide and silicon oxynitride. In order to make the interface state in the gate insulator 160 trap an electric charge, an electron may be transferred from the oxide semiconductor 130 toward the gate electrode 170. As a specific example, the potential of the gate electrode 170 is kept higher than the potential of the source electrode 140 or the drain electrode 150 under high temperature conditions (e.g., a temperature higher than or equal to 125° C. and lower than or equal to 450° C., typically higher than or equal to 150° C. and lower than or equal to 300° C.) for one second or longer, typically for one minute or longer.

The threshold voltage of a transistor in which a predetermined amount of electrons are trapped in interface states in the gate insulator 160 or the like shifts in the positive direction. The amount of electrons to be trapped (the amount of change in threshold voltage) can be controlled by adjusting a voltage of the gate electrode 170 or time in which the voltage is applied. Note that a location in which an electric charge is trapped is not necessarily limited to the inside of the gate insulator 160 as long as an electric charge can be trapped therein. A stacked film having a similar structure may be used as another insulator.

For the gate electrode 170, a conductor formed using Al, Ti, Cr, Co, Ni, Cu, Y, Zr, Mo, Ru, Ag, Ta, W, or the like can be used. The gate electrode may be a stack of any of the above materials. Alternatively, a conductor containing nitrogen may be used for the gate electrode.

An aluminum oxide film is preferably included in the insulator 180 over the gate insulator 160 and the gate electrode 170. The aluminum oxide film has a high blocking effect of preventing penetration of both oxygen and impurities such as hydrogen and moisture. Accordingly, during and after the manufacturing process of the transistor, the aluminum oxide film can suitably function as a protective film that has effects of preventing entry of impurities such as hydrogen and moisture, which cause variations in the electrical characteristics of the transistor, into the oxide semiconductor 130, preventing release of oxygen, which is a main component of the oxide semiconductor 130, from the oxide semiconductor, and preventing unnecessary release of oxygen from the insulator 120. Further, oxygen contained in the aluminum oxide film can be diffused in the oxide semiconductor.

Further, the insulator 185 is preferably formed over the insulator 180. Each of the insulator 185 can be formed using an insulator containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulator 185 may be a stack of any of the above materials.

Here, like the insulator 120, the insulator 185 preferably contains oxygen more than that in the stoichiometric composition. Oxygen released from the insulator 185 can be diffused into the channel formation region in the oxide semiconductor 130 through the gate insulator 160, so that oxygen vacancies formed in the channel formation region can be filled with the oxygen. In this manner, stable electrical characteristics of the transistor can be achieved.

In addition, high integration of a semiconductor device requires miniaturization of a transistor. However, it is known that miniaturization of a transistor causes deterioration of electrical characteristics of the transistor.

To solve the problem, in the transistor of one embodiment of the present invention shown in FIGS. 5A to 5C, as described above, the third oxide semiconductor 133 is formed so as to cover the second oxide semiconductor 132 where a channel is formed and the channel formation layer and the gate insulator are not in contact with each other. Accordingly, scattering of carriers at the interface between the channel formation layer and the gate insulator can be reduced and the on-state current of the transistor can be increased. As a result, favorable switching characteristics can be achieved.

In the transistor of one embodiment of the present invention, as described above, the gate electrode 170 is formed to surround the oxide semiconductor 130 electrically in the channel width direction; accordingly, a gate electric field is applied to the oxide semiconductor 130 in the side surface direction in addition to the perpendicular direction. In other words, a gate electric field is applied to the oxide semiconductor 130 entirely, so that current flows in the whole of the second oxide semiconductor 132 serving as a channel, leading to a further increase in on-state current. As a result, favorable switching characteristics can be achieved.

In the transistor of one embodiment of the present invention, the second oxide semiconductor 132 is formed over the first oxide semiconductor 131, so that an interface state is less likely to be formed. In addition, impurities do not enter the second oxide semiconductor 132 from above and below because the second oxide semiconductor 132 is positioned at the middle of the three-layer structure. Therefore, the transistor can achieve not only the increase in the on-state current of the transistor but also stabilization of the threshold voltage and a reduction in the SS. Thus, current when gate voltage Vg is 0 V can be reduced and power consumption can be reduced. In addition, in the case where an electric charge (or data) held in a capacitor is controlled by the transistor, the electric charge (or data) can be held (or stored) for a long period. Further, the threshold voltage of the transistor becomes stable; thus, long-term reliability of the semiconductor device can be improved.

This embodiment can be combined as appropriate with any of the other embodiments and examples in this specification.

Embodiment 2

Figure 6A:
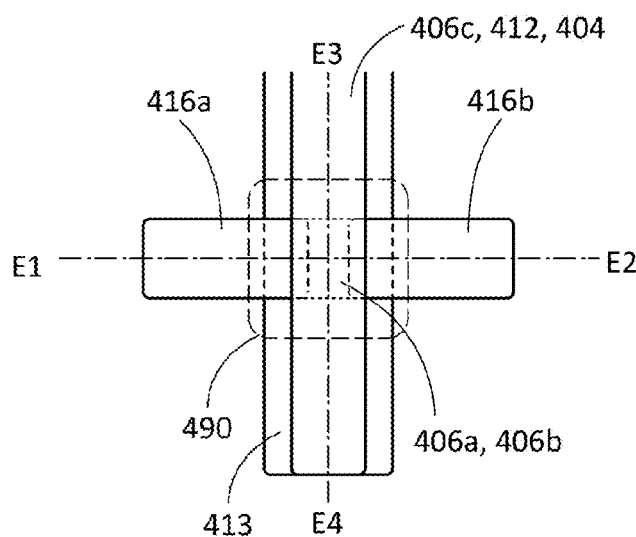
FIGS. 6A and 6B are a top view and a cross-sectional view illustrating a transistor of one embodiment of the present invention.
Figure 6B:
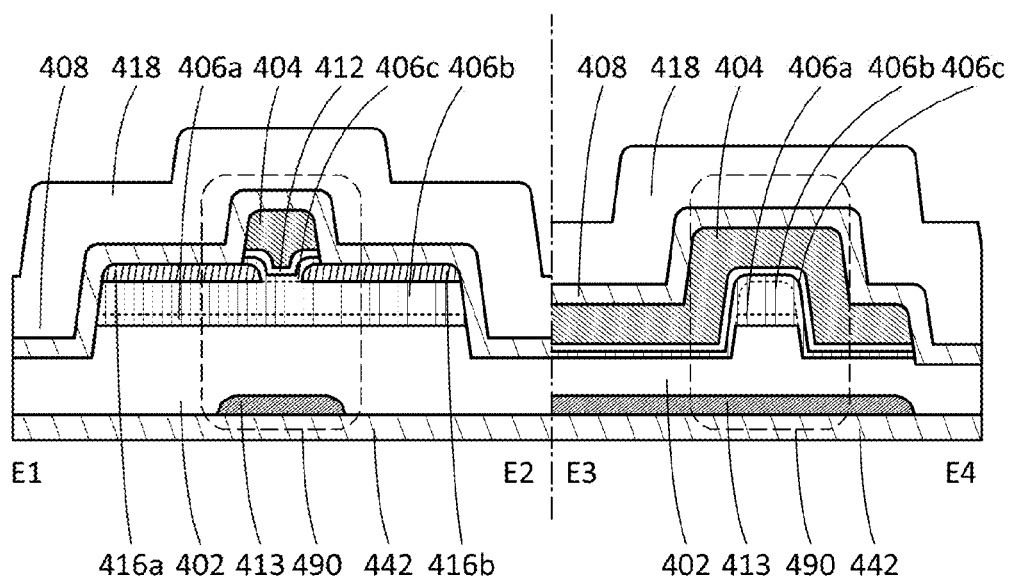

In this embodiment, a method for manufacturing a transistor 490 of one embodiment of the present invention illustrated in FIGS. 6A and 6B is described. FIG. 6A is a plan view illustrating an example of a structure of the transistor 490. FIG. 6B is a cross-sectional view in the directions of a dashed-dotted line E1-E2 and a dashed-dotted line E3-E4 in FIG. 6A.

First, an insulator 442 is formed. The insulator 442 may be formed by a sputtering method, a chemical vapor deposition (CVD) method, a molecular beam epitaxy (MBE) method, a pulsed laser deposition (PLD) method, or an atomic layer deposition (ALD) method.

The insulator 442 is preferably formed by DC sputtering using a metal target or an alloy target. Especially when DC sputtering using oxygen as a reactive gas is employed, an insulator containing a suboxide is sometimes formed because of an insufficient reaction on the target surface. A suboxide is stabilized by trapping hydrogen, oxygen, or the like in some cases. Thus, when the insulator 442 contains a suboxide, the insulator 442 has an excellent blocking property with respect to hydrogen, oxygen, or the like.

The CVD method can include a plasma enhanced CVD (PECVD) method using plasma, a thermal CVD (TCVD) method using heat, and the like. Moreover, the CVD method can include a metal CVD (MCVD) method and a metal organic CVD (MOCVD) method depending on a source gas.

By using the PECVD method, a high-quality film can be formed at a relatively low temperature. By using the TCVD method, in which plasma is not used, a film can be formed with few defects because damage caused by plasma does not occur.

In the case of a CVD method, the composition of a film to be obtained can be controlled by adjusting the flow ratio of a source gas. For example, by an MCVD method or an MOCVD method, a film with a desired composition can be formed by adjusting the flow rate of a source gas. Furthermore, for example, by an MCVD method or an MOCVD method, a film whose composition is gradually changed can be formed by changing the flow rate of a source gas during deposition. In the case where a film is deposited while the flow rate of a source gas is changed, the time for film formation can be shorter than in the case where a film is deposited using a plurality of deposition chambers because time for transferring the substrate and time for adjusting the pressure are not needed. Thus, the transistor 490 can be manufactured with improved productivity.

Next, a conductor to be a conductor 413 is formed. The conductor to be the conductor 413 may be formed by a sputtering method, a CVD method, an MBE method, a PLD method, an ALD method, or the like.

Next, part of the conductor to be the conductor 413 is etched, so that the conductor 413 is formed.

Figure 7A:
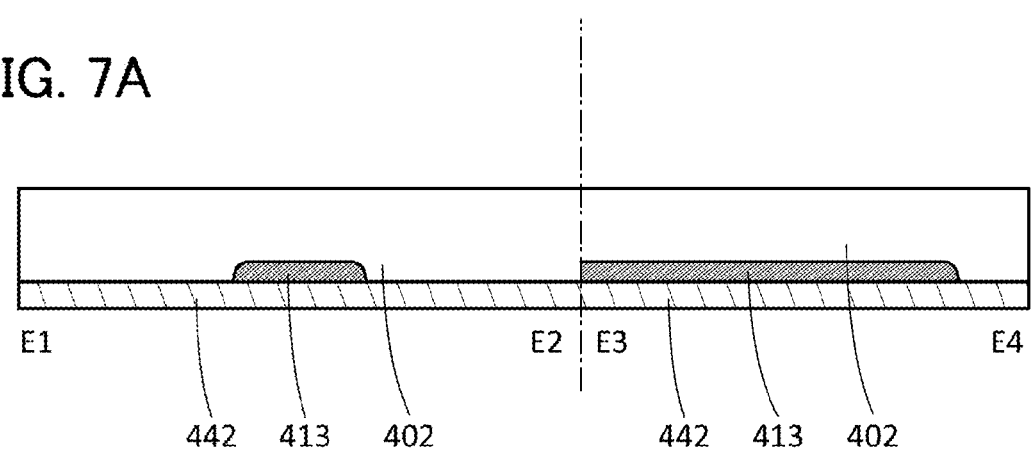
FIGS. 7A and 7B are cross-sectional views illustrating an example of a manufacturing method of a transistor of one embodiment of the present invention.

Next, the insulator 402 is formed (see FIG. 7A). The insulator 402 may be formed by a sputtering method, a CVD method, an MBE method, a PLD method, an ALD method, or the like. Note that here, an example where the top surface of the insulator 402 is planarized by a CMP method or the like is described. By planarizing the top surface of the insulator 402, the subsequent steps can be performed easily, and the yield of the transistor 490 can be increased. For example, by a CMP method, the root mean square (RMS) roughness of the insulator 402 is less than or equal to 1 nm, preferably less than or equal to 0.5 nm, further preferably less than or equal to 0.3 nm. Ra (average surface roughness) with the measurement area of 1 μm×1 μm is less than 1 nm, preferably less than 0.6 nm, more preferably less than 0.5 nm, still more preferably less than 0.4 nm. Peak-Valley with the measurement area of 1 μm×1 μm is less than 10 nm, preferably less than 9 nm, more preferably less than 8 nm, still more preferably less than 7 nm. The transistor 490 of one embodiment of the present invention is not limited to a transistor when the top surface of the insulator 402 is planarized.

The insulator 402 may be formed to contain excess oxygen. Alternatively, oxygen may be added after the insulator 402 is formed. The addition of oxygen may be performed by an ion implantation method at an acceleration voltage of higher than or equal to 2 kV and lower than or equal to 100 kV and at a dose of greater than or equal to $5 \times 10^{14}$ ions/cm$^2$ and less than or equal to $5 \times 10^{16}$ ions/cm$^2$, for example.

Note that in the case where the insulator 402 is a stacked-layer film, films in the stacked-layer film may be formed using by different formation methods such as the above formation methods. For example, the first film may be formed by a CVD method and the second film may be formed by an ALD method. Alternatively, the first film may be formed by a sputtering method and the second film may be formed by an ALD method. When films are formed by different formation methods as described above, the films can have different functions or different properties. Furthermore, by stacking the films, a more appropriate film can be formed as a stacked-layer film.

In other words, an n-th film (n is a natural number) is formed by at least one of a sputtering method, a CVD method, an MBE method, a PLD method, an ALD method, and the like, and an n+1-th film is formed by at least one of a sputtering method, a CVD method, an MBE method, a PLD method, an ALD method, and the like. Note that the n-th film and the n+1-th film may be formed by the same formation method or different formation methods. Note that the n-th film and the n+2-th film may be formed by the same formation method. Alternatively, all the films may be formed by the same formation method.

Next, a semiconductor 436a to be the semiconductor 406a and a semiconductor 436b to be the semiconductor 406b are formed in this order. The semiconductor 436a to be the semiconductor 406a and the semiconductor 436b to be the semiconductor 406b may be formed by a sputtering method, a CVD method, an MBE method, a PLD method, an ALD method, or the like.

In the case where In—Ga—Zn oxide layers are formed as the semiconductors 436a and 436b by an MOCVD method, trimethylindium, trimethylgallium, dimethylzinc, and the like may be used as the source gases. The source gas is not limited to the combination of these gases, triethylindium or the like may be used instead of trimethylindium. Triethylgallium or the like may be used instead of trimethylgallium. Diethylzinc or the like may be used instead of dimethylzinc.

Next, first heat treatment is preferably performed. The first heat treatment is performed at a temperature higher than or equal to 250° C. and lower than or equal to 650° C., preferably higher than or equal to 300° C. and lower than or equal to 500° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. By the first heat treatment, crystallinity of the semiconductor 436a and crystallinity of the semiconductor 436b can be increased and impurities such as hydrogen and water can be removed.

Figure 7B:
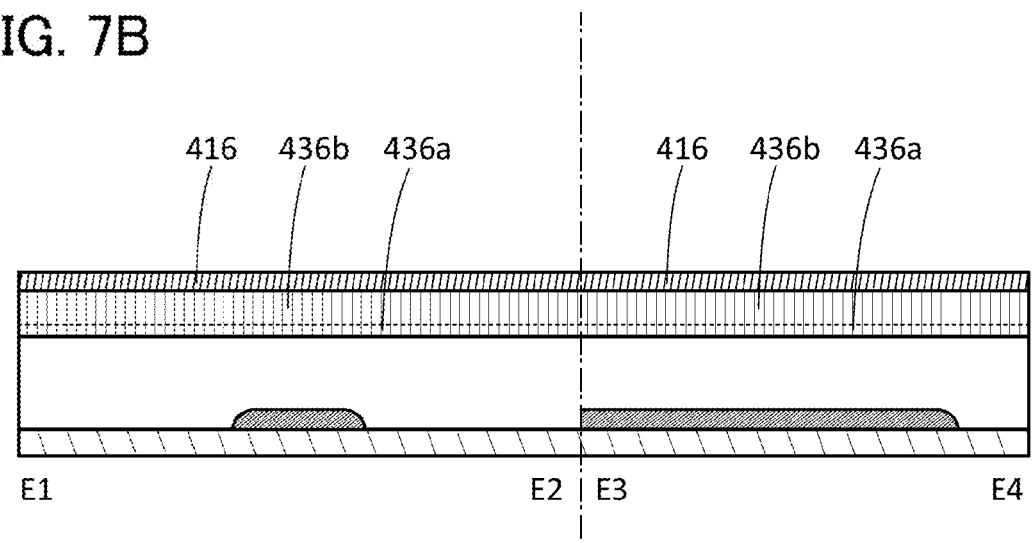

Next, a conductor 416 is formed (see FIG. 7B). The conductor 416 may be formed by a sputtering method, a CVD method, an MBE method, a PLD method, an ALD method, or the like.

The conductor 416a and the conductor 416b are formed in such a manner that the conductor 416 is formed and then partly etched. Therefore, it is preferable to employ a formation method by which the semiconductor 406b is not damaged when the conductor 416 is formed. In other words, the conductor 416 is preferably formed by an MCVD method or the like.

Note that in the case where the conductor 416 is formed to have a stacked-layer structure, films in the stacked-layer film may be formed by different formation methods such as a sputtering method, a CVD method (a plasma CVD method, a thermal CVD method, an MCVD method, an MOCVD method, or the like), an MBE method, a PLD method, and an ALD method. For example, the first film may be formed by an MOCVD method and the second film may be formed by a sputtering method. Alternatively, the first film may be formed by an ALD method and the second film may be formed by an MOCVD method. Alternatively, the first film may be formed by an ALD method and the second film may be formed by a sputtering method. Alternatively, the first film may be formed by an ALD method, the second film may be formed by a sputtering method, and the third film may be formed by an ALD method. When films are formed by different formation methods as described above, the films can have different functions or different properties. Furthermore, by stacking the films, a more appropriate film can be formed as a stacked-layer film.

In other words, in the case where the conductor 416 is a stacked-layer film, for example, an n-th film (n is a natural number) is formed by at least one of a sputtering method, a CVD method (a plasma CVD method, a thermal CVD method, an MCVD method, an MOCVD method, or the like), an MBE method, a PLD method, an ALD method, and the like and an n+1-th film is formed by at least one of a sputtering method, a CVD method (a plasma CVD method, a thermal CVD method, an MCVD method, an MOCVD method, or the like), an MBE method, a PLD method, an ALD method, and the like. Note that the n-th film and the n+1-th film may be formed by different formation methods. Note that the n-th film and the n+2-th film may be formed by the same formation method. Alternatively, all the films may be formed by the same formation method.

Note that the conductor 416 or at least one of the films in the stacked-layer film of the conductor 416 and the semiconductor 436a to be the semiconductor 406a or the semiconductor 436b to be the semiconductor 406b may be formed by the same formation method. For example, both of them may be formed by an ALD method. Thus, they can be formed without exposure to the air. As a result, entry of impurities can be prevented.

Note that the conductor 416 or at least one of the films in the stacked-layer film of the conductor 416, the semiconductor 436a to be the semiconductor 406a or the semiconductor 436b to be the semiconductor 406b, and the insulator 402 or at least one of the films in the stacked-layer film of the insulator 402 may be formed by the same formation method. For example, all of them may be formed by a sputtering method. Thus, they can be formed without exposure to the air. As a result, entry of impurities can be prevented. Note that a method for manufacturing a semiconductor device of one embodiment of the present invention is not limited thereto.

Figure 8A:
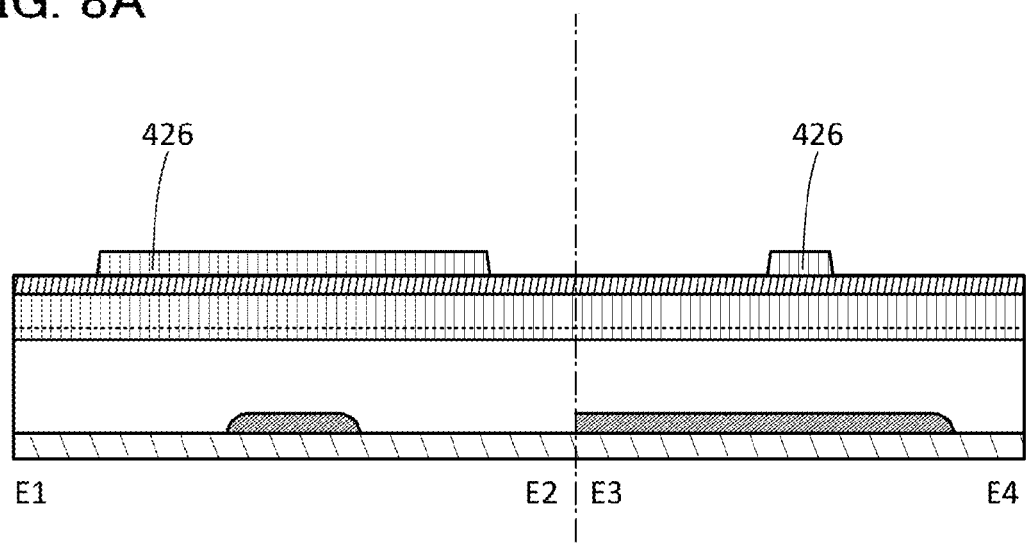
FIGS. 8A and 8B are cross-sectional views illustrating an example of a manufacturing method of a transistor of one embodiment of the present invention.

Next, a mask 426 is formed (see FIG. 8A). For the mask 426, a photosensitive resist may be used. Note that a bottom anti-reflective coating (BARC) film may be provided under the photoresist and a stack including the photoresist and the BARC film may be used as the mask 426. When the bottom anti-reflective coating film is provided, defects due to halation can be suppressed and a minute shape can be obtained.

Next, the conductor 416 is etched using the mask 426, whereby a conductor 417 is formed. To form the conductor 417 having a minute shape, the mask 426 having a minute shape needs to be formed. When the mask 426 having a minute shape is too thick, the mask might fall down; therefore, the mask 426 preferably includes a region with a thickness small enough to be self-standing. The conductor 416 to be etched using the mask 426 preferably has a thickness small enough to be etched under conditions that the mask 426 can withstand. Since the conductor 416 becomes the conductor 416a and the conductor 416b serving as a source electrode and a drain electrode of the transistor 490, the conductor 416 preferably has a certain thickness such that the on-state current of the transistor 490 is high. Accordingly, the conductor 416 includes a region with a thickness of, for example, greater than or equal to 5 nm and less than or equal to 30 nm, preferably greater than or equal to 5 nm and less than or equal to 20 nm, more preferably greater than or equal to 5 nm and less than or equal to 15 nm.

Figure 8B:
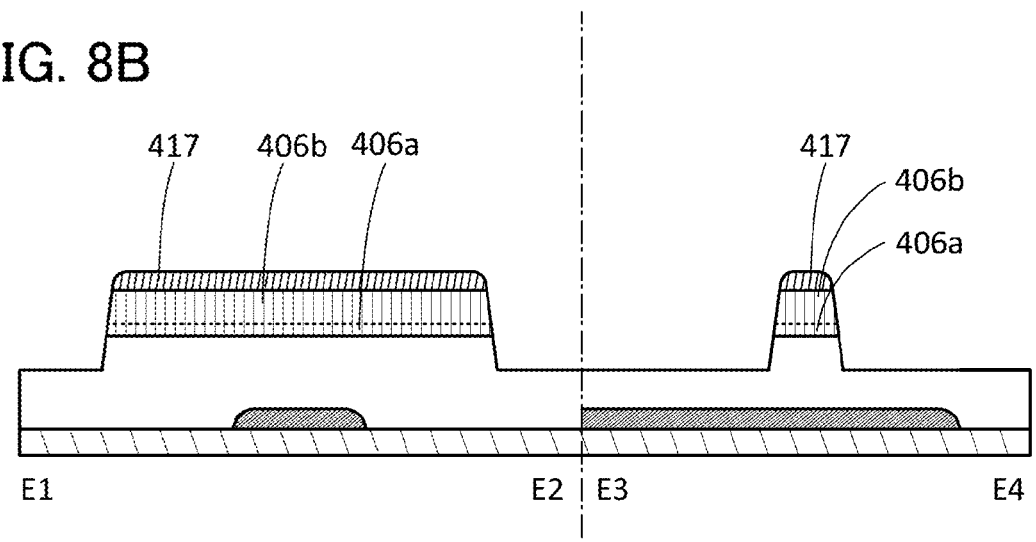

Next, the semiconductor 436a and the semiconductor 436b are etched using the conductor 417 as a mask, so that the semiconductor 406a and the semiconductor 406b are formed. At this time, when the insulator 402 is etched, an s-channel structure is likely to be formed (see FIG. 8B).

Next, part of the conductor 417 is etched, so that the conductor 416a and the conductor 416b are formed (see FIG. 9A). As described above, the conductor 416 formed as a mask for etching the semiconductor 436a and the semiconductor 436b becomes the conductor 416a and the conductor 416b serving as the source electrode and the drain electrode of the transistor 490. Since the conductor 416 to be the conductor 416a and the conductor 416b is also used as a mask, the number of steps for manufacturing the transistor 490 can be reduced. The transistor 490 has a structure suitable for a miniaturized semiconductor device because the area occupied by the conductor 416a and the conductor 416b can be small.

Next, a semiconductor to be the semiconductor 406c is formed. The semiconductor to be the semiconductor 406c can be formed by a sputtering method, a CVD method, an MBE method, a PLD method, an ALD method, or the like.

In the case where an In—Ga—Zn oxide layer is formed as the semiconductor to be the semiconductor 406c by an MOCVD method, trimethylindium, trimethylgallium, dimethylzinc, or the like may be used as the source gases. The source gas is not limited to the above combination of these gases, triethylindium or the like may be used instead of trimethylindium. Triethylgallium or the like may be used instead of trimethylgallium. Diethylzinc or the like may be used instead of dimethylzinc.

Next, second heat treatment may be performed. For example, as the semiconductor 406a, a semiconductor whose oxygen-transmitting property is higher than that of the semiconductor to be the semiconductor 406c is selected. That is, as the semiconductor to be the semiconductor 406c, a semiconductor whose oxygen-transmitting property is lower than that of the semiconductor 406a is selected. In other words, as the semiconductor 406a, a semiconductor having a function of passing oxygen is selected. As the semiconductor to be the semiconductor 406c, a semiconductor having a function of blocking oxygen is selected. In this case, by the second heat treatment, excess oxygen in the insulator 402 is moved to the semiconductor 406b through the semiconductor 406a. The semiconductor 406b is covered with the semiconductor to be the semiconductor 406c; thus, outward diffusion of excess oxygen is less likely to occur. Therefore, by performing the second heat treatment at this time, defects (oxygen vacancies) in the semiconductor 406b can be efficiently reduced. Note that the second heat treatment may be performed at a temperature such that excess oxygen (oxygen) in the insulator 402 is diffused to the semiconductor 406b. For example, the description of the first heat treatment may be referred to for the second heat treatment. The second heat treatment is preferably performed at a temperature lower than that of the first heat treatment by higher than or equal to 20° C. and lower than or equal to 150° C., preferably higher than or equal to 40° C. and lower than or equal to 100° C. Accordingly, superfluous release of excess oxygen (oxygen) from the insulator 402 can be inhibited.

Next, an insulator to be the insulator 412 is formed. The insulator to be the insulator 412 may be formed by a sputtering method, a CVD method, an MBE method, a PLD method, an ALD method, or the like.

Note that in the case where the insulator to be the insulator 412 is formed to have a stacked-layer structure, films in the stacked-layer film may be formed by different formation methods such as a sputtering method, a CVD method (a plasma CVD method, a thermal CVD method, an MCVD method, an MOCVD method, or the like), an MBE method, a PLD method, and an ALD method. For example, the first film may be formed by an MOCVD method and the second film may be formed by a sputtering method. Alternatively, the first film may be formed by an ALD method and the second film may be formed by an MOCVD method. Alternatively, the first film may be formed by an ALD method and the second film may be formed by a sputtering method. Alternatively, the first film may be formed by an ALD method, the second film may be formed by a sputtering method, and the third film may be formed by an ALD method. Thus, when films are formed by different formation methods, the films can have different functions or different properties. Furthermore, by stacking the films, a more appropriate film can be formed as a stacked-layer film.

In other words, in the case where the insulator to be the insulator 412 is a stacked-layer film, for example, an n-th film (n is a natural number) is formed by at least one of a sputtering method, a CVD method (a plasma CVD method, a thermal CVD method, an MCVD method, an MOCVD method, or the like), an MBE method, a PLD method, an ALD method, and the like and an n+1-th film is formed by at least one of a sputtering method, a CVD method (a plasma CVD method, a thermal CVD method, an MCVD method, an MOCVD method, or the like), an MBE method, a PLD method, an ALD method, and the like. Note that the n-th film and the n+1-th film may be formed by different formation methods. Note that the n-th film and the n+2-th film may be formed by the same formation method. Alternatively, all the films may be formed by the same formation method.

Next, third heat treatment may be performed. For example, as the semiconductor 406a, a semiconductor whose oxygen-transmitting property is higher than that of the semiconductor to be the semiconductor 406c is selected. That is, as the semiconductor to be the semiconductor 406c, a semiconductor whose oxygen-transmitting property is lower than that of the semiconductor 406a is selected. As the semiconductor to be the semiconductor 406c, a semiconductor having a function of blocking oxygen is selected. For example, as the semiconductor 406a, a semiconductor whose oxygen-transmitting property is higher than that of the insulator to be the insulator 412 is selected. That is, as the insulator to be the insulator 412, an insulator whose oxygen-transmitting property is lower than that of the semiconductor 406a is selected. In other words, as the semiconductor 406a, a semiconductor having a function of passing oxygen is selected. As the insulator to be the insulator 412, an insulator having a function of blocking oxygen is selected. In this case, by the third heat treatment, excess oxygen in the insulator 402 is moved to the semiconductor 406b through the semiconductor 406a. The semiconductor 406b is covered with the semiconductor to be the semiconductor 406c and the insulator to be the insulator 412; thus, outward diffusion of excess oxygen is less likely to occur. Therefore, by performing the third heat treatment at this time, defects (oxygen vacancies) in the semiconductor 406b can be efficiently reduced. Note that the third heat treatment may be performed at a temperature such that excess oxygen (oxygen) in the insulator 402 is diffused to the semiconductor 406b. For example, the description of the first heat treatment may be referred to for the third heat treatment. The third heat treatment is preferably performed at a temperature lower than that of the first heat treatment by higher than or equal to 20° C. and lower than or equal to 150° C., preferably higher than or equal to 40° C. and lower than or equal to 100° C. Note that in the case where the insulator to be the insulator 412 has a function of blocking oxygen, the semiconductor to be the semiconductor 406c does not necessarily have a function of blocking oxygen.

Next, a conductor to be the conductor 404 is formed. The conductor to be the conductor 404 may be formed by a sputtering method, a CVD method, an MBE method, a PLD method, an ALD method, or the like.

The insulator to be the insulator 412 functions as a gate insulator of the transistor 490. Therefore, the conductor to be the conductor 404 is preferably formed by a formation method by which the insulator to be the insulator 412 is not damaged when the conductor to be the conductor 404 is formed. In other words, the conductor is preferably formed by an MCVD method or the like.

Note that in the case where the conductor to be the conductor 404 is formed to have a stacked-layer structure, films in the stacked-layer film may be formed by different formation methods such as a sputtering method, a CVD method (a plasma CVD method, a thermal CVD method, an MCVD method, an MOCVD method, or the like), an MBE method, a PLD method, and an ALD method. For example, the first film may be formed by an MOCVD method and the second film may be formed by a sputtering method. Alternatively, the first film may be formed by an ALD method and the second film may be formed by an MOCVD method. Alternatively, the first film may be formed by an ALD method and the second film may be formed by a sputtering method. Alternatively, the first film may be formed by an ALD method, the second film may be formed by a sputtering method, and the third film may be formed by an ALD method. Thus, when films are formed by different formation methods, the films can have different functions or different properties. Furthermore, by stacking the films, a more appropriate film can be formed as a stacked-layer film.

In other words, in the case where the conductor to be the conductor 404 is a stacked-layer film, for example, an n-th film (n is a natural number) is formed by at least one of a sputtering method, a CVD method (a plasma CVD method, a thermal CVD method, an MCVD method, an MOCVD method, or the like), an MBE method, a PLD method, an ALD method, and the like and an n+1-th film is formed by at least one of a sputtering method, a CVD method (a plasma CVD method, a thermal CVD method, an MCVD method, an MOCVD method, or the like), an MBE method, a PLD method, an ALD method, and the like. Note that the n-th film and the n+1-th film may be formed by different formation methods. Note that the n-th film and the n+2-th film may be formed by the same formation method. Alternatively, all the films may be formed by the same formation method.

Note that the conductor to be the conductor 404 or at least one of the films in the stacked-layer film of the conductor to be the conductor 404 and the insulator to be the insulator 412 or at least one of the films in the stacked-layer film of the insulator to be the insulator 412 may be formed by the same formation method. For example, both of them may be formed by an ALD method. Thus, they can be formed without exposure to the air. As a result, entry of impurities can be prevented. For example, the conductor to be the conductor 404 and the insulator to be the insulator 412 which are in contact with each other may be formed by the same formation method. Thus, the formation can be performed in the same chamber. As a result, entry of impurities can be prevented.

Note that the conductor to be the conductor 404 or at least one of the films in the stacked-layer film of the conductor to be the conductor 404 and the insulator to be the insulator 412 or at least one of the films in the stacked-layer film of the insulator to be the insulator 412 may be formed by the same formation method. For example, all of them may be formed by a sputtering method. Thus, they can be formed without exposure to the air. As a result, entry of impurities can be prevented.

Next, the conductor to be the conductor 404 is partly etched, so that the conductor 404 is formed. The conductor 404 is formed to overlap with at least part of the semiconductor 406b.

Next, in a manner similar to that of the conductor to be the conductor 404, the insulator to be the insulator 412 is partly etched, so that the insulator 412 is formed.

Next, in a manner similar to those of the conductor to be the conductor 404 and the insulator to be the insulator 412, the semiconductor to be the semiconductor 406c is partly etched, so that the semiconductor 406c is formed.

The conductor to be the conductor 404, the insulator to be the insulator 412, and the semiconductor to be the semiconductor 406c may be partly etched through the same photolithography process, for example. Alternatively, the insulator to be the insulator 412 and the semiconductor to be the semiconductor 406c may be etched using the conductor 404 as a mask. Thus, the conductor 404, the insulator 412, and the semiconductor 406c have similar shapes in the top view. Note that the insulator 412 and/or the semiconductor 406c may project as compared with the conductor 404 as illustrated in FIG. 9C1 or the conductor 404 may project as compared with the insulator 412 and/or the semiconductor 406c as illustrated in FIG. 9C2. With such a shape, shape defects are reduced and gate leakage current can be reduced in some cases.

Next, the insulator 408 is formed (see FIG. 9B). The insulator 408 may be formed by a sputtering method, a CVD method, an MBE method, a PLD method, an ALD method, or the like.

Next, fourth heat treatment may be performed. For example, as the semiconductor 406a, a semiconductor whose oxygen-transmitting property is higher than that of the semiconductor 406c is selected. In other words, as the semiconductor 406c, a semiconductor whose oxygen-transmitting property is lower than that of the semiconductor 406a is selected. As the semiconductor 406c, a semiconductor having a function of blocking oxygen is selected. For example, as the semiconductor 406a, a semiconductor whose oxygen-transmitting property is higher than that of the insulator 412 is selected. In other words, as the insulator 412, a semiconductor whose oxygen-transmitting property is lower than that of the semiconductor 406a is selected. For example, as the semiconductor 406a, a semiconductor whose oxygen-transmitting property is higher than that of the insulator 408 is selected. That is, as the insulator 408, a semiconductor whose oxygen-transmitting property is lower than that of the semiconductor 406a is selected. In other words, as the semiconductor 406a, a semiconductor having a function of passing oxygen is selected. As the insulator 408, an insulator having a function of blocking oxygen is selected. In this case, by the fourth heat treatment, excess oxygen in the insulator 402 is moved to the semiconductor 406b through the semiconductor 406a. The semiconductor 406b is covered with any of the semiconductor 406c, the insulator 412, and the insulator 408; thus, outward diffusion of excess oxygen is less likely to occur. Therefore, by performing the fourth heat treatment at this time, defects (oxygen vacancies) in the semiconductor 406b can be efficiently reduced. Note that the fourth heat treatment may be performed at a temperature such that excess oxygen (oxygen) in the insulator 402 is diffused to the semiconductor 406b. For example, the description of the first heat treatment may be referred to for the fourth heat treatment. The fourth heat treatment is preferably performed at a temperature lower than that of the first heat treatment by higher than or equal to 20° C. and lower than or equal to 150° C., preferably higher than or equal to 40° C. and lower than or equal to 100° C. Note that in the case where the insulator 408 has a function of blocking oxygen, the semiconductor 406c and/or the insulator 412 does not necessarily have a function of blocking oxygen.

One or more of the first heat treatment, the second heat treatment, the third heat treatment, and the fourth heat treatment are not necessarily performed.

Next, the insulator 418 is formed. The insulator 418 may be formed by a sputtering method, a CVD method, an MBE method, a PLD method, an ALD method, or the like.

Through the above steps, the transistor 490 illustrated in FIGS. 6A and 6B can be manufactured.

This embodiment can be combined as appropriate with any of the other embodiments and examples in this specification.

Embodiment 3

In this embodiment, an oxide semiconductor that can be used for a transistor of one embodiment of the present invention is described.

An oxide semiconductor is classified roughly into a single crystal oxide semiconductor and a non-single-crystal oxide semiconductor. The non-single-crystal oxide semiconductor includes any of a c-axis aligned crystalline oxide semiconductor (CAAC-OS), a polycrystalline oxide semiconductor, a microcrystalline oxide semiconductor, an amorphous oxide semiconductor, and the like. Note that a CAAC-OS can also be called a c-axis aligned nanocrystalline oxide semiconductor (CANC-OS).

First, a CAAC-OS is described.

The CAAC-OS is an oxide semiconductor having a plurality of c-axis aligned crystal parts.

With a transmission electron microscope (TEM), a combined analysis image (high-resolution TEM image) of a bright-field image and a diffraction pattern of the CAAC-OS is observed, and a plurality of crystal parts can be clearly observed. However, in the high-resolution TEM image, a boundary between crystal parts, that is, a grain boundary is not clearly observed. Thus, in the CAAC-OS, a reduction in electron mobility due to the grain boundary is less likely to occur.

According to the high-resolution cross-sectional TEM image of the CAAC-OS observed in a direction substantially parallel to a sample surface, metal atoms are arranged in a layered manner in the crystal parts. Each metal atom layer reflects unevenness of a surface over which the CAAC-OS is formed (hereinafter a surface over which the CAAC-OS is formed is referred to as a formation surface) or a top surface of the CAAC-OS, and is arranged parallel to the formation surface or the top surface of the CAAC-OS.

In this specification, the term "parallel" indicates that the angle formed between two straight lines is greater than or equal to −10° and less than or equal to 10°, and accordingly also includes the case where the angle is greater than or equal to −5° and less than or equal to 5°. A term "substantially parallel" indicates that the angle formed between two straight lines is greater than or equal to −30° and less than or equal to 30°. In addition, the term "perpendicular" indicates that the angle formed between two straight lines is greater than or equal to 80° and less than or equal to 100°, and accordingly also includes the case where the angle is greater than or equal to 85° and less than or equal to 95°. A term "substantially perpendicular" indicates that the angle formed between two straight lines is greater than or equal to 60° and less than or equal to 120°.

In the high-resolution planar TEM image of the CAAC-OS observed in a direction substantially perpendicular to the sample surface, metal atoms arranged in a triangular or hexagonal configuration are seen in the crystal parts. However, there is no regularity of arrangement of metal atoms between different crystal parts.

FIG. 38A is a high-resolution cross-sectional TEM image of a CAAC-OS. FIG. 38B is a high-resolution cross-sectional TEM image obtained by enlarging the image of FIG. 38A. In FIG. 38B, atomic arrangement is highlighted for easy understanding.

FIG. 38C is Fourier transform images of regions each surrounded by a circle (the diameter is about 4 nm) between A and O and between O and A' in FIG. 38A. C-axis alignment can be observed in each region in FIG. 38C. The c-axis direction between A and O is different from that between O and A', which indicates that a grain in the region between A and O is different from that between O and A'. In addition, between A and O, the angle of the c-axis continuously and gradually changes from 14.3°, 16.6° to 26.4°. Similarly, between O and A', the angle of the c-axis continuously and gradually changes from −18.3°, −17.6°, to −15.9°.

Note that in an electron diffraction pattern of the CAAC-OS, spots (bright spots) having alignment are shown. For example, spots are shown in a nanobeam electron diffraction pattern of the top surface of the CAAC-OS obtained by using an electron beam having a probe diameter ranging from 1 nm to 30 nm, for example (see FIG. 39A).

The high-resolution cross-sectional TEM image and the high-resolution planar TEM image show that the crystal parts in the CAAC-OS have alignment.

Most of the crystal parts included in the CAAC-OS each fit inside a cube whose one side is less than 100 nm. Thus, there is a case where a crystal part included in the CAAC-OS fits inside a cube whose one side is less than 10 nm, less than 5 nm, or less than 3 nm. Note that when a plurality of crystal parts included in the CAAC-OS are connected to each other, one large crystal region is formed in some cases. For example, a crystal region with an area of 2500 nm$^2$ or more, 5 μm$^2$ or more, or 1000 μm$^2$ or more is observed in some cases in the planar high-resolution TEM image.

A CAAC-OS is subjected to structural analysis with an X-ray diffraction (XRD) apparatus. For example, when the CAAC-OS including an InGaZnO$_4$ crystal is analyzed by an out-of-plane method, a peak appears frequently at a diffraction angle (2θ) of around 31°. This peak is derived from the (009) plane of the InGaZnO$_4$ crystal, which indicates that crystals in the CAAC-OS have c-axis alignment, and that the c-axes are aligned in a direction substantially perpendicular to the formation surface or the top surface of the CAAC-OS.

On the other hand, when the CAAC-OS is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor of InGaZnO$_4$, six peaks appear. The six peaks are derived from crystal planes equivalent to the (110) plane. On the other hand, in the case of a CAAC-OS, a peak is not clearly observed even when φ scan is performed with 2θ fixed at around 56°.

According to the above results, in the CAAC-OS having c-axis alignment, while the directions of a-axes and b-axes are irregularly oriented between crystal parts, the c-axes are aligned in a direction parallel to a normal vector of a formation surface or a normal vector of a top surface. Thus, each metal atom layer arranged in a layered manner observed in the high-resolution cross-sectional TEM image corresponds to a plane parallel to the a-b plane of the crystal.

Note that the crystal part is formed concurrently with deposition of the CAAC-OS or is formed through crystallization treatment such as heat treatment. As described above, the c-axis of the crystal is aligned with a direction parallel to a normal vector of a formation surface or a normal vector of a top surface. Thus, for example, in the case where a shape of the CAAC-OS is changed by etching or the like, the c-axis might not be necessarily parallel to a normal vector of a formation surface or a normal vector of a top surface of the CAAC-OS.

Furthermore, distribution of c-axis aligned crystal parts in the CAAC-OS is not necessarily uniform. For example, in the case where crystal growth leading to the crystal parts of the CAAC-OS occurs from the vicinity of the top surface of the CAAC-OS, the proportion of the c-axis aligned crystal parts in the vicinity of the top surface is higher than that in the vicinity of the formation surface in some cases. Furthermore, when an impurity is added to the CAAC-OS, a region to which the impurity is added is altered, and the proportion of the c-axis aligned crystal parts in the CAAC-OS varies depending on a region, in some cases.

Note that when the CAAC-OS with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS. It is preferable that in the CAAC-OS, a peak of 2θ appear at around 31° and a peak of 2θ not appear at around 36°.

The CAAC-OS is an oxide semiconductor having low impurity concentration. The impurity is an element other than the main components of the oxide semiconductor, such as hydrogen, carbon, silicon, or a transition metal element. In particular, an element that has higher bonding strength to oxygen than a metal element included in the oxide semiconductor, such as silicon, disturbs the atomic arrangement of the oxide semiconductor by depriving the oxide semiconductor of oxygen and causes a decrease in crystallinity. In addition, a heavy metal such as iron or nickel, argon, carbon dioxide, or the like has a large atomic radius (molecular radius), and thus disturbs the atomic arrangement of the oxide semiconductor and causes a decrease in crystallinity when it is contained in the oxide semiconductor. Note that the impurity contained in the oxide semiconductor might function as a carrier trap or a carrier generation source.

The CAAC-OS is an oxide semiconductor having a low density of defect states. In some cases, oxygen vacancies in the oxide semiconductor function as carrier traps or function as carrier generation sources when hydrogen is captured therein.

The state in which impurity concentration is low and density of defect states is low (the amount of oxygen vacancies is small) is referred to as a "highly purified intrinsic" or "substantially highly purified intrinsic" state. A highly purified intrinsic or substantially highly purified intrinsic oxide semiconductor has few carrier generation sources, and thus can have a low carrier density. Thus, a transistor including the oxide semiconductor rarely has negative threshold voltage (is rarely normally on). The highly purified intrinsic or substantially highly purified intrinsic oxide semiconductor has few carrier traps. Accordingly, the transistor including the oxide semiconductor has little variation in electrical characteristics and high reliability. Electric charge trapped by the carrier traps in the oxide semiconductor takes a long time to be released, and might behave like fixed electric charge. Thus, the transistor which includes the oxide semiconductor having high impurity concentration and a high density of defect states has unstable electrical characteristics in some cases.

With the use of the CAAC-OS in a transistor, variation in the electrical characteristics of the transistor due to irradiation with visible light or ultraviolet light is small.

Next, a microcrystalline oxide semiconductor is described.

A microcrystalline oxide semiconductor has a region in which a crystal part is observed and a region in which a crystal part is not clearly observed in a high-resolution TEM image. In most cases, the size of a crystal part included in the microcrystalline oxide semiconductor is greater than or equal to 1 nm and less than or equal to 100 nm, or greater than or equal to 1 nm and less than or equal to 10 nm. An oxide semiconductor including a nanocrystal (nc) that is a microcrystal with a size greater than or equal to 1 nm and less than or equal to 10 nm, or a size greater than or equal to 1 nm and less than or equal to 3 nm is specifically referred to as a nanocrystalline oxide semiconductor (nc-OS). In a high-resolution TEM image of the nc-OS, for example, a grain boundary is not clearly observed in some cases.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS. Thus, the orientation of the whole layer is not ordered. Accordingly, the nc-OS cannot be distinguished from an amorphous oxide semiconductor, depending on an analysis method. For example, when the nc-OS is subjected to structural analysis by an out-of-plane method with an XRD apparatus using an X-ray having a diameter larger than the size of a crystal part, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the diameter of a crystal part (the electron diffraction is also referred to as selected-area electron diffraction). Meanwhile, spots appear in a nanobeam electron diffraction pattern of the nc-OS when an electron beam having a probe diameter close to or smaller than the diameter of a crystal part is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots are shown in a ring-like region in some cases (see FIG. 39B).

The nc-OS is an oxide semiconductor that has high regularity as compared with an amorphous oxide semiconductor. Therefore, the nc-OS is likely to have a lower density of defect states than an amorphous oxide semiconductor. Note that there is no regularity of crystal orientation between different crystal parts in the nc-OS. Therefore, the nc-OS has a higher density of defect states than the CAAC-OS.

Note that an oxide semiconductor may be a stacked film including two or more of an amorphous oxide semiconductor, a microcrystalline oxide semiconductor, and a CAAC-OS, for example.

In the case where an oxide semiconductor has a plurality of structures, the structures can be analyzed using nanobeam electron diffraction in some cases.

Figure 39A:
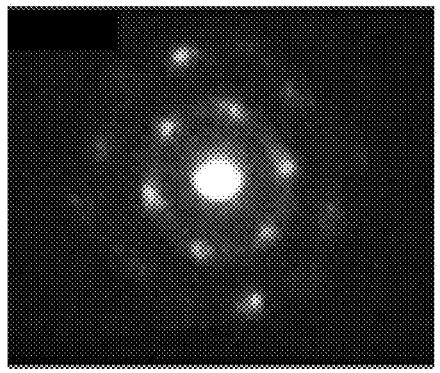
FIGS. 39A and 39B show nanobeam electron diffraction patterns of oxide semiconductors and FIGS. 39C and 39D illustrate an example of a transmission electron diffraction measurement apparatus.
Figure 39B:
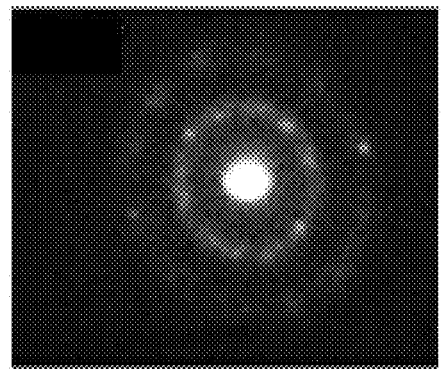
Figure 39C:
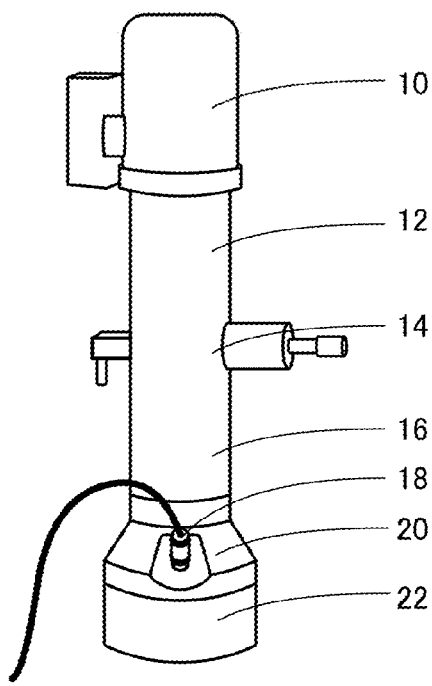

FIG. 39C illustrates a transmission electron diffraction measurement apparatus which includes an electron gun chamber 10, an optical system 12 below the electron gun chamber 10, a sample chamber 14 below the optical system 12, an optical system 16 below the sample chamber 14, an observation chamber 20 below the optical system 16, a camera 18 installed in the observation chamber 20, and a film chamber 22 below the observation chamber 20. The camera 18 is provided to face toward the inside of the observation chamber 20. Note that the film chamber 22 is not necessarily provided.

Figure 39D:
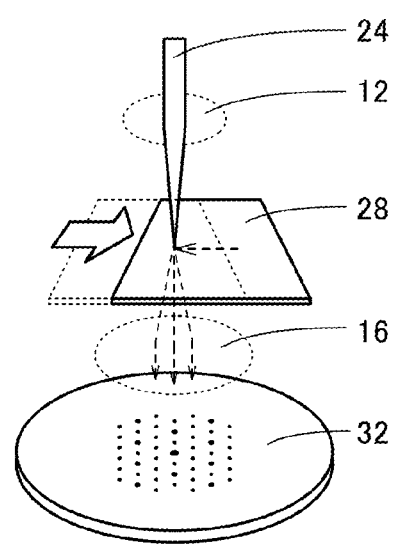

FIG. 39D illustrates an internal structure of the transmission electron diffraction measurement apparatus illustrated in FIG. 39C. In the transmission electron diffraction measurement apparatus, a substance 28 which is positioned in the sample chamber 14 is irradiated with electrons emitted from an electron gun installed in the electron gun chamber 10 through the optical system 12. Electrons passing through the substance 28 enter a fluorescent plate 32 provided in the observation chamber 20 through the optical system 16. On the fluorescent plate 32, a pattern corresponding to the intensity of the incident electron appears, which allows measurement of a transmission electron diffraction pattern.

The camera 18 is installed so as to face the fluorescent plate 32 and can take a picture of a pattern appearing in the fluorescent plate 32. An angle formed by a straight line which passes through the center of a lens of the camera 18 and the center of the fluorescent plate 32 and an upper surface of the fluorescent plate 32 is, for example, 15° or more and 80° or less, 30° or more and 75° or less, or 45° or more and 70° or less. As the angle is reduced, distortion of the transmission electron diffraction pattern taken by the camera 18 becomes larger. Note that if the angle is obtained in advance, the distortion of an obtained transmission electron diffraction pattern can be corrected. Note that the film chamber 22 may be provided with the camera 18. For example, the camera 18 may be set in the film chamber 22 so as to be opposite to the incident direction of electrons 24. In this case, a transmission electron diffraction pattern with less distortion can be taken from the rear surface of the fluorescent plate 32.

A holder for fixing the substance 28 that is a sample is provided in the sample chamber 14. The holder transmits electrons passing through the substance 28. The holder may have, for example, a function of moving the substance 28 in the direction of the X, Y, and Z axes. The movement function of the holder may have an accuracy of moving the substance in the range of, for example, 1 nm to 10 nm, 5 nm to 50 nm, 10 nm to 100 nm, 50 nm to 500 nm, and 100 nm to 1 µm. The range is preferably determined to be an optimal range for the structure of the substance 28.

Then, a method for measuring a transmission electron diffraction pattern of a substance by the transmission electron diffraction measurement apparatus described above will be described.

For example, changes in the structure of a substance can be observed by changing the irradiation position of the electrons 24 that are a nanobeam in the substance (or by scanning) as illustrated in FIG. 39D. At this time, when the substance 28 is a CAAC-OS, a diffraction pattern shown in FIG. 39A is observed. When the substance 28 is an nc-OS, a diffraction pattern shown in FIG. 39B is observed.

Even when the substance 28 is a CAAC-OS, a diffraction pattern similar to that of an nc-OS or the like is partly observed in some cases. Therefore, whether a CAAC-OS is favorable can be determined by the proportion of a region where a diffraction pattern of a CAAC-OS is observed in a predetermined area (also referred to as proportion of CAAC). In the case of a high quality CAAC-OS, for example, the proportion of CAAC is higher than or equal to 50%, preferably higher than or equal to 80%, further preferably higher than or equal to 90%, still further preferably higher than or equal to 95%. Note that the proportion of a region where a diffraction pattern different from that of a CAAC-OS is observed is referred to as the proportion of non-CAAC.

For example, transmission electron diffraction patterns were obtained by scanning a top surface of a sample including a CAAC-OS obtained just after deposition (represented as "as-sputtered") and a top surface of a sample including a CAAC-OS subjected to heat treatment at 450° C. in an atmosphere containing oxygen. Here, the proportion of CAAC was obtained in such a manner that diffraction patterns were observed by scanning for 60 seconds at a rate of 5 nm/second and the obtained diffraction patterns were converted into still images every 0.5 seconds. Note that as an electron beam, a nanobeam with a probe diameter of 1 nm was used. The above measurement was performed on six samples. The proportion of CAAC was calculated using the average value of the six samples.

Figure 40A:
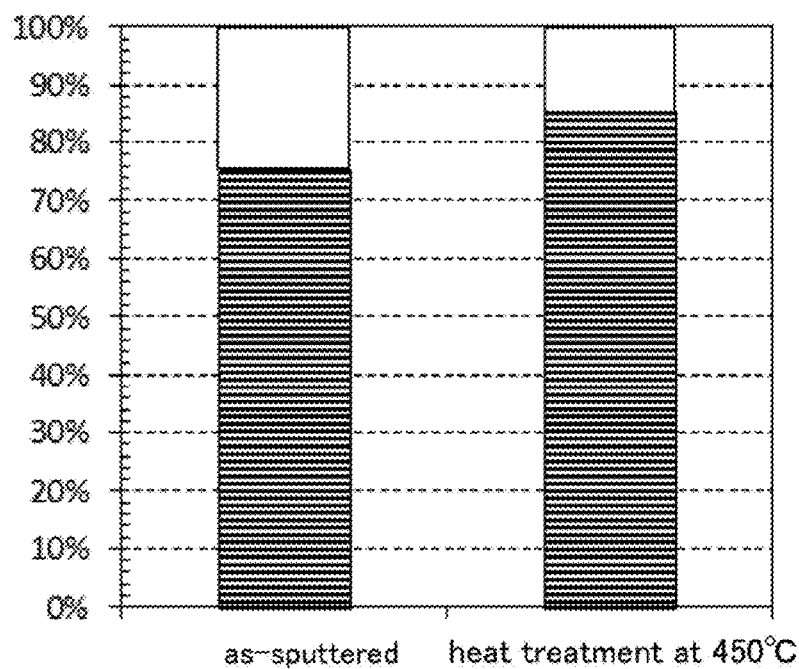
FIG. 40A shows an example of structural analysis by transmission electron diffraction measurement and FIGS. 40B and 40C show high-resolution planar TEM images.

FIG. 40A shows the proportion of CAAC in each sample. The proportion of CAAC of the CAAC-OS obtained just after the deposition was 75.7% (the proportion of non-CAAC was 24.3%). The proportion of CAAC of the CAAC-OS subjected to the heat treatment at 450° C. was 85.3% (the proportion of non-CAAC was 14.7%). These results show that the proportion of CAAC obtained after the heat treatment at 450° C. is higher than that obtained just after the deposition. That is, heat treatment at high temperatures (e.g., higher than or equal to 400° C.) reduces the proportion of non-CAAC (increases the proportion of CAAC). Furthermore, the above results also indicate that even when the temperature of the heat treatment is lower than 500° C., the CAAC-OS can have a high proportion of CAAC.

Here, most of diffraction patterns different from that of a CAAC-OS are diffraction patterns similar to that of an nc-OS. Furthermore, an amorphous oxide semiconductor was not able to be observed in the measurement region. Therefore, the above results suggest that the region having a structure similar to that of an nc-OS is rearranged by the heat treatment owing to the influence of the structure of the adjacent region, whereby the region becomes CAAC.

Figure 40B:
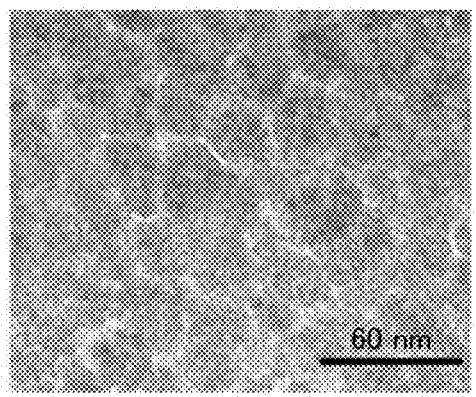
Figure 40C:
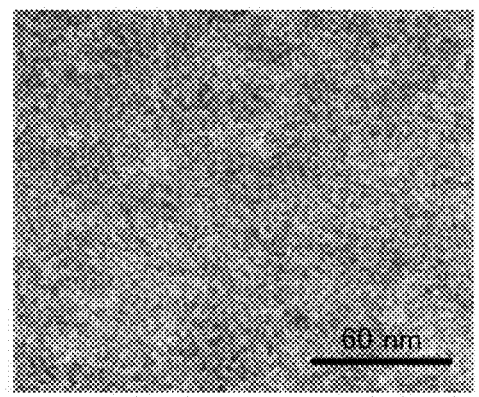

FIGS. 40B and 40C are high-resolution planar TEM images of the CAAC-OS obtained just after the deposition and the CAAC-OS subjected to the heat treatment at 450° C., respectively. Comparison between FIGS. 40B and 40C shows that the CAAC-OS subjected to the heat treatment at 450° C. has more uniform film quality. That is, the heat treatment at high temperatures improves the film quality of the CAAC-OS.

With such a measurement method, the structure of an oxide semiconductor having a plurality of structures can be analyzed in some cases.

The above oxide semiconductor can be used as the semiconductor 406a, the semiconductor 406b, the semiconductor 406c, or the like.

This embodiment can be combined as appropriate with any of the other embodiments and examples in this specification.

Embodiment 4

In this embodiment, an example of a circuit including the transistor of one embodiment of the present invention is described with reference to drawings.

[Cross-Sectional Structure]

Figure 10A:
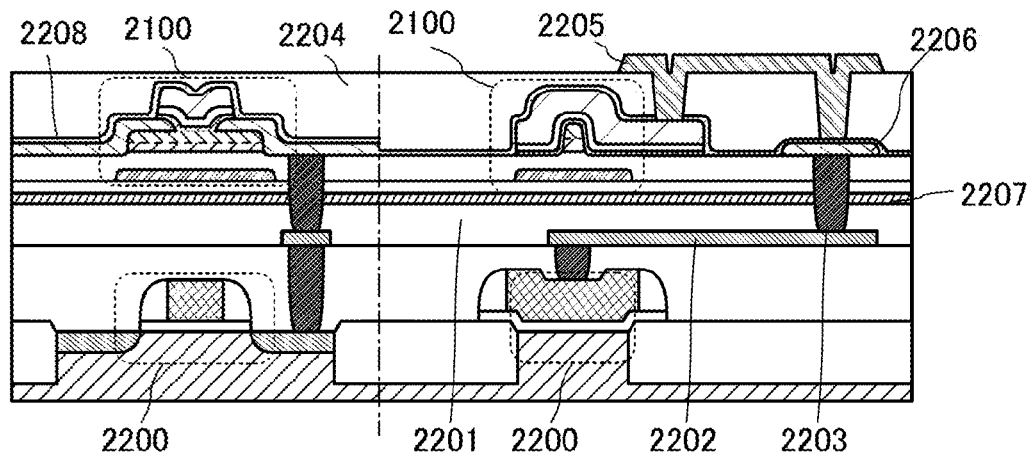
FIGS. 10A to 10D are cross-sectional views and circuit diagrams of a semiconductor device of one embodiment of the present invention.

FIG. 10A is a cross-sectional view of a semiconductor device of one embodiment of the present invention. The semiconductor device illustrated in FIG. 10A includes a transistor 2200 containing a first semiconductor material in a lower portion and a transistor 2100 containing a second semiconductor material in an upper portion. In FIG. 10A, an example is illustrated in which the transistor described in the above embodiment as an example is used as the transistor 2100 containing the second semiconductor material. A cross-sectional view of the transistors in the channel length direction is on the left side of a dashed-dotted line, and a cross-sectional view of the transistors in the channel width direction is on the right side of the dashed-dotted line.

Here, the first semiconductor material and the second semiconductor material are preferably materials having different band gaps. For example, the first semiconductor material can be a semiconductor material other than an oxide semiconductor (examples of such a semiconductor material include silicon (including strained silicon), germanium, silicon germanium, silicon carbide, gallium arsenide, aluminum gallium arsenide, indium phosphide, gallium nitride, and an organic semiconductor), and the second semiconductor material can be an oxide semiconductor. A transistor using a material other than an oxide semiconductor, such as single crystal silicon, can operate at a high speed easily. In contrast, a transistor using an oxide semiconductor and described in the above embodiment as an example has excellent sub-threshold characteristics and a minute structure. Furthermore, the transistor can operate at a high speed because of its high switching speed and has low leakage current because of its low off-state current.

The transistor 2200 may be either an n-channel transistor or a p-channel transistor, and an appropriate transistor may be used in accordance with a circuit. Furthermore, the specific structure of the semiconductor device, such as the material or the structure used for the semiconductor device, is not necessarily limited to those described here except for the use of the transistor of one embodiment of the present invention which uses an oxide semiconductor.

FIG. 10A illustrates a structure in which the transistor 2100 is provided over the transistor 2200 with an insulator 2201 and an insulator 2207 provided therebetween. A plurality of wirings 2202 are provided between the transistor 2200 and the transistor 2100. Furthermore, wirings and electrodes provided over and under the insulators are electrically connected to each other through a plurality of plugs 2203 embedded in the insulators. An insulator 2204 covering the transistor 2100, a wiring 2205 over the insulator 2204, and a wiring 2206 formed by processing a conductor that is also used for a pair of electrodes of the transistor 2100 are provided.

The stack of the two kinds of transistors reduces the area occupied by the circuit, allowing a plurality of circuits to be highly integrated.

Here, in the case where a silicon-based semiconductor material is used for the transistor 2200 provided in a lower portion, hydrogen in an insulator provided in the vicinity of the semiconductor of the transistor 2200 terminates dangling bonds of silicon; accordingly, the reliability of the transistor 2200 can be improved. Meanwhile, in the case where an oxide semiconductor is used for the transistor 2100 provided in an upper portion, hydrogen in an insulator provided in the vicinity of the semiconductor of the transistor 2100 becomes a factor of generating carriers in the oxide semiconductor; thus, the reliability of the transistor 2100 might be decreased. Therefore, in the case where the transistor 2100 using an oxide semiconductor is provided over the transistor 2200 using a silicon-based semiconductor material, it is particularly effective that the insulator 2207 having a function of preventing diffusion of hydrogen is provided between the transistors 2100 and 2200. The insulator 2207 makes hydrogen remain in the lower portion, thereby improving the reliability of the transistor 2200. In addition, since the insulator 2207 suppresses diffusion of hydrogen from the lower portion to the upper portion, the reliability of the transistor 2100 also can be improved.

The insulator 2207 can be, for example, formed using aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

Furthermore, a blocking film 2208 (corresponding to the insulator 180 in the transistors 101 to 103) having a function of preventing diffusion of hydrogen is preferably formed over the transistor 2100 to cover the transistor 2100 including an oxide semiconductor. For the blocking film 2208, a material that is similar to that of the insulator 2207 can be used, and in particular, an aluminum oxide film is preferably used. The aluminum oxide film has a high shielding (blocking) effect of preventing penetration of both oxygen and impurities such as hydrogen and moisture. Thus, by using the aluminum oxide film as the blocking film 2208 covering the transistor 2100, release of oxygen from the oxide semiconductor included in the transistor 2100 can be prevented and entry of water and hydrogen into the oxide semiconductor can be prevented.

Note that the transistor 2200 can be a transistor of various types without being limited to a planar type transistor. For example, the transistor 2200 can be a fin-type transistor, a tri-gate transistor, or the like. An example of a cross-sectional view in this case is shown in FIG. 10D. An insulator 2212 is provided over a semiconductor substrate 2211. The semiconductor substrate 2211 includes a projecting portion with a thin tip (also referred to a fin). Note that an insulator may be provided over the projecting portion. The insulator functions as a mask for preventing the semiconductor substrate 2211 from being etched when the projecting portion is formed. The projecting portion does not necessarily have the thin tip; a projecting portion with a cuboid-like projecting portion and a projecting portion with a thick tip are permitted, for example. A gate insulator 2214 is provided over the projecting portion of the semiconductor substrate 2211, and a gate electrode 2213 is provided over the gate insulator 2214. Source and drain regions 2215 are formed in the semiconductor substrate 2211. Note that here is shown an example in which the semiconductor substrate 2211 includes the projecting portion; however, a semiconductor device of one embodiment of the present invention is not limited thereto. For example, a semiconductor region having a projecting portion may be formed by processing an SOI substrate.

Circuit Configuration Example

In the above structure, electrodes of the transistor 2100 and the transistor 2200 can be connected as appropriate; thus, a variety of circuits can be formed. Examples of circuit configurations which can be achieved by using a semiconductor device of one embodiment of the present invention are shown below.

[CMOS Inverter Circuit]

Figure 10B:
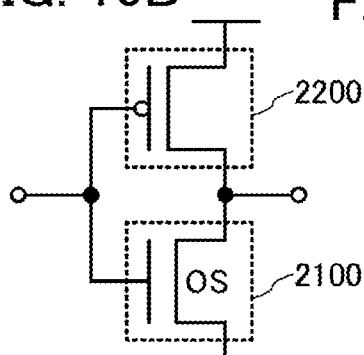

A circuit diagram in FIG. 10B shows a configuration of a so-called CMOS inverter in which the p-channel transistor 2200 and the n-channel transistor 2100 are connected to each other in series and in which gates of them are connected to each other.

[CMOS Analog Switch]

Figure 10C:
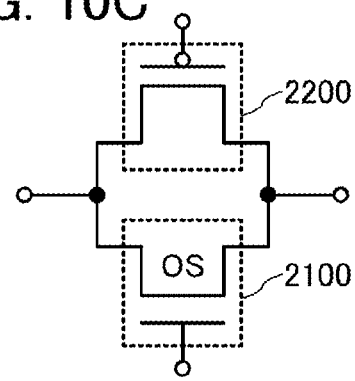
Figure 10D:
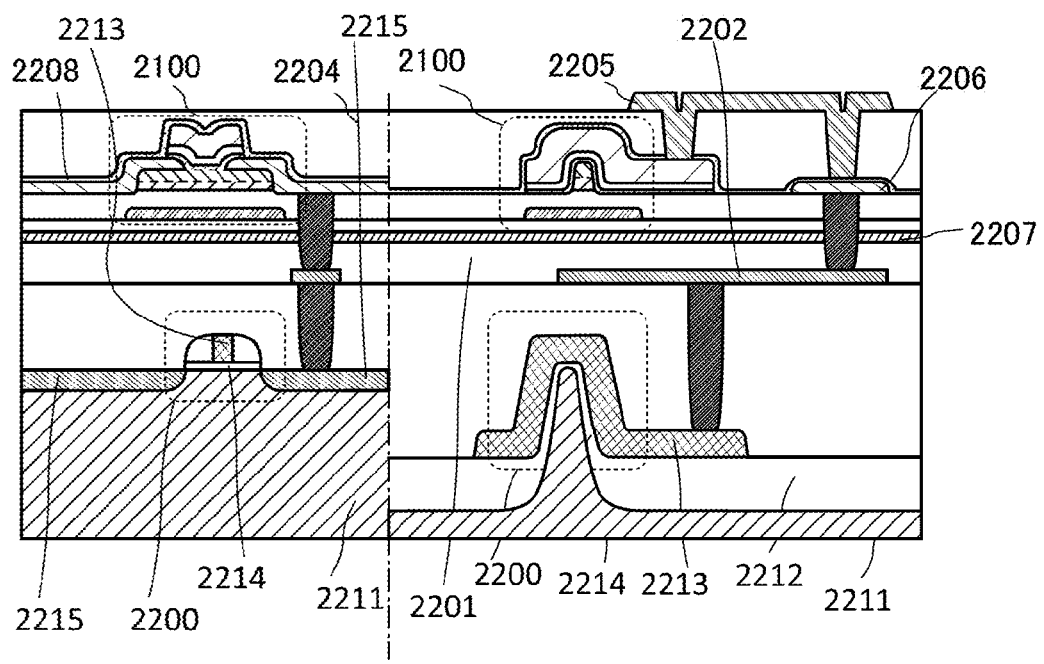

A circuit diagram in FIG. 10C shows a configuration in which sources of the transistors 2100 and 2200 are connected to each other and drains of the transistors 2100 and 2200 are connected to each other. With such a configuration, the transistors can function as a so-called CMOS analog switch.

[Memory Device Example]

Figure 11A:
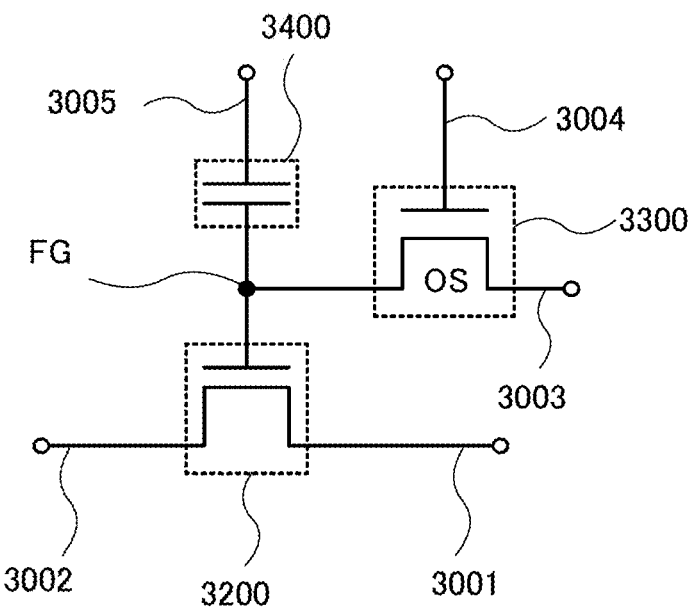
FIGS. 11A to 11C are a cross-sectional view and circuit diagrams of a semiconductor device of one embodiment of the present invention.
Figure 11B:
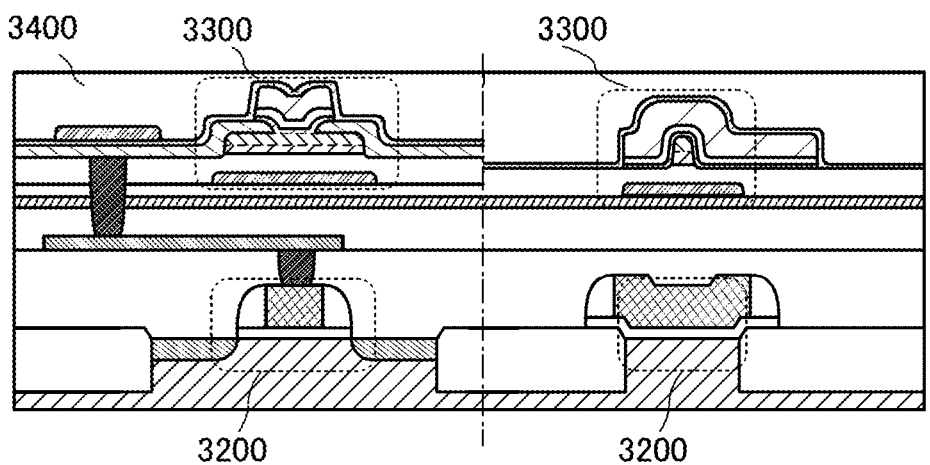
Figure 11C:
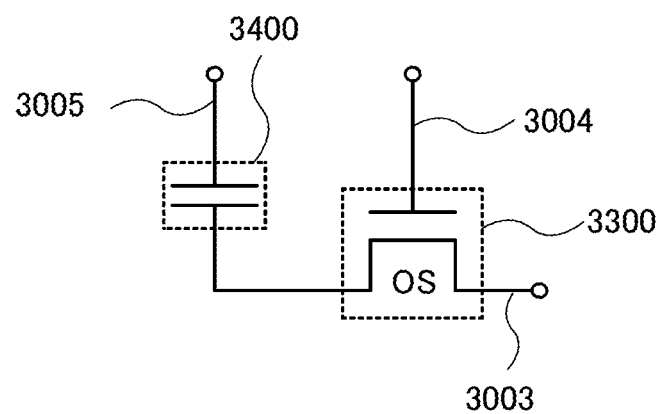

An example of a semiconductor device (memory device) which includes the transistor of one embodiment of the present invention, which can retain stored data even when not powered, and which has an unlimited number of write cycles is shown in FIGS. 11A to 11C.

The semiconductor device illustrated in FIG. 11A includes a transistor 3200 using a first semiconductor material, a transistor 3300 using a second semiconductor material, and a capacitor 3400. Note that any of the above-described transistors can be used as the transistor 3300.

FIG. 11B is a cross-sectional view of the semiconductor device illustrated in FIG. 11A. The semiconductor device in the cross-sectional view has a structure in which the transistor 3300 is provided with a back gate; however, a structure without a back gate may be employed.

In FIG. 11A, a first wiring 3001 is electrically connected to a source electrode of the transistor 3200. A second wiring 3002 is electrically connected to a drain electrode of the transistor 3200. A third wiring 3003 is electrically connected to one of a source electrode and a drain electrode of the transistor 3300. A fourth wiring 3004 is electrically connected to a gate electrode of the transistor 3300. A gate electrode of the transistor 3200 is electrically connected to the other of the source electrode and the drain electrode of the transistor 3300 and one electrode of the capacitor 3400. A fifth wiring 3005 is electrically connected to the other electrode of the capacitor 3400.

The semiconductor device in FIG. 11A has a feature that the potential of the gate electrode of the transistor 3200 can be retained, and thus enables writing, retaining, and reading of data as follows.

Writing and retaining of data are described. First, the potential of the fourth wiring 3004 is set to a potential at which the transistor 3300 is turned on, so that the transistor 3300 is turned on. Accordingly, the potential of the third wiring 3003 is supplied to the gate electrode of the transistor 3200 and one electrode of the capacitor 3400. That is, a predetermined charge is supplied to the capacitor 3400. Here, two potential levels (a low level and a high level) are supplied. Any of charges corresponding to the two potential levels is supplied to the capacitor 3400. After that, the potential of the fourth wiring 3004 is set to a potential at which the transistor 3300 is turned off, so that the transistor 3300 is turned off. Thus, the charge supplied to the capacitor 3400 is held. In this manner, writing to the semiconductor device illustrated in FIG. 11A is performed.

Since the off-state current of the transistor 3300 is extremely low, the charge supplied to the capacitor 3400 is retained for a long time. Therefore, stored data can be retained even when power is not supplied.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the capacitor 3400. This is because in the case of using an n-channel transistor as the transistor 3200, an apparent threshold voltage $V_{th\_H}$ at the time when the high-level potential is given to the gate electrode of the transistor 3200 is lower than an apparent threshold voltage $V_{th\_L}$ at the time when the low-level potential is given to the gate electrode of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$, whereby potential supplied to the gate electrode of the transistor 3200 can be determined. For example, in the case where the high-level potential is supplied to the gate electrode of the transistor 3200 in writing and the potential of the fifth wiring 3005 is $V_0$ ($>V_{th\_H}$), the transistor 3200 is turned on. In the case where the low-level potential is supplied to the gate electrode of the transistor 3200 in writing, even when the potential of the fifth wiring 3005 is $V_0$ ($<V_{th\_L}$), the transistor 3200 remains off. Thus, the data retained in the gate electrode of the transistor 3200 can be read by determining the potential of the second wiring 3002.

Note that in the case where memory cells are arrayed to be used, it is necessary that only data of a desired memory cell be able to be read. In the case where such reading is not performed, the fifth wiring 3005 may be supplied with a potential at which the transistor 3200 is turned off regardless of the amount of charge retained in the capacitor 3400, that is, a potential lower than $V_{th\_H}$. Alternatively, the fifth wiring 3005 may be supplied with a potential at which the transistor 3200 is turned on regardless of the amount of charge retained in the capacitor 3400, that is, a potential higher than $V_{th\_L}$.

In the semiconductor device in this embodiment, the transistor 3300 is a transistor in which a channel is formed in a semiconductor including an oxide semiconductor. Since the off-state current of the transistor 3300 is low, stored data can be retained for a long period. In other words, power consumption can be sufficiently reduced because a semiconductor memory device in which refresh operation is unnecessary or the frequency of refresh operation is extremely low can be provided.

In the semiconductor device in this embodiment, the transistor 3300 is a transistor in which a channel is formed in a semiconductor including an oxide semiconductor. When the transistor described in the above embodiment is used as the transistor 3300, the transistor 3300 can have excellent subthreshold characteristics and a minute structure. Furthermore, the transistor 3300 can operate at a high speed because of its high switching speed. In contrast, the transistor 3200, which includes single crystal silicon or the like as a semiconductor material other than an oxide semiconductor, can have a minute structure and operate at a high speed. By combination of these transistors, a small semiconductor device can be provided. In addition, high-speed writing and reading can be performed.

The semiconductor device illustrated in FIG. 11C is different from the semiconductor device illustrated in FIG. 11A in that the transistor 3200 is not provided. Also in this case, writing and retaining operation of data can be performed in a manner similar to the above.

Next, reading of data is described. When the transistor 3300 is turned on, the third wiring 3003 which is in a floating state and the capacitor 3400 are electrically connected to each other, and the charge is redistributed between wiring capacitance related to the third wiring 3003 and the capacitor 3400. As a result, the potential of the third wiring 3003 is changed. The amount of change in potential of the third wiring 3003 depends on the charge accumulated in the capacitor 3400 (or the potential of the one electrode of the capacitor 3400).

For example, when the potential of the fifth wiring 3005 is 0 V and the potential of the other electrode of the wiring capacitance related to the third wiring 3003 is 0 V, the potential of the third wiring 3003 after the charge redistribution is $(C_B \times V_{B0} + C \times V)/(C_B + C)$, where V is the potential of one electrode of the capacitor 3400, C is the capacitance of the capacitor 3400, $C_B$ is the wiring capacitance formed with the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0$ ($=(C_B \times V_{B0} + C \times V_0)/(C_B + C)$).

Then, by comparing the potential of the third wiring 3003 with a predetermined potential, data can be read.

In this case, a transistor including the first semiconductor material may be used for a driver circuit for driving a memory cell, and a transistor including the second semiconductor material may be stacked over the driver circuit as the transistor 3300.

When including a transistor in which a channel formation region is formed using an oxide semiconductor and which has extremely low off-state current, the semiconductor device described in this embodiment can retain stored data for an extremely long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

In the semiconductor device in this embodiment, the transistor 3300 is a transistor in which a channel is formed in a semiconductor including an oxide semiconductor. When the transistor described in the above embodiment is used as the transistor 3300, the transistor 3300 can have excellent subthreshold characteristics and a minute structure. Furthermore, the transistor 3300 can operate at a high speed because of its high switching speed. Accordingly, a small semiconductor device can be provided. In addition, high-speed writing and reading can be performed.

In the semiconductor device, high voltage is not needed for writing data and deterioration of elements is less likely to occur. Unlike in a conventional nonvolatile memory, for example, it is not necessary to inject and extract electrons into and from a floating gate; thus, a problem such as deterioration of an insulator is not caused. That is, the semiconductor device of one embodiment of the present invention does not have a limit on the number of times data can be rewritten, which is a problem of a conventional nonvolatile memory, and the reliability thereof is drastically improved. Furthermore, data is written depending on the state of the transistor (on or off), whereby high-speed operation can be easily achieved.

This embodiment can be combined as appropriate with any of the other embodiments and examples in this specification.

Embodiment 5

Figure 12:
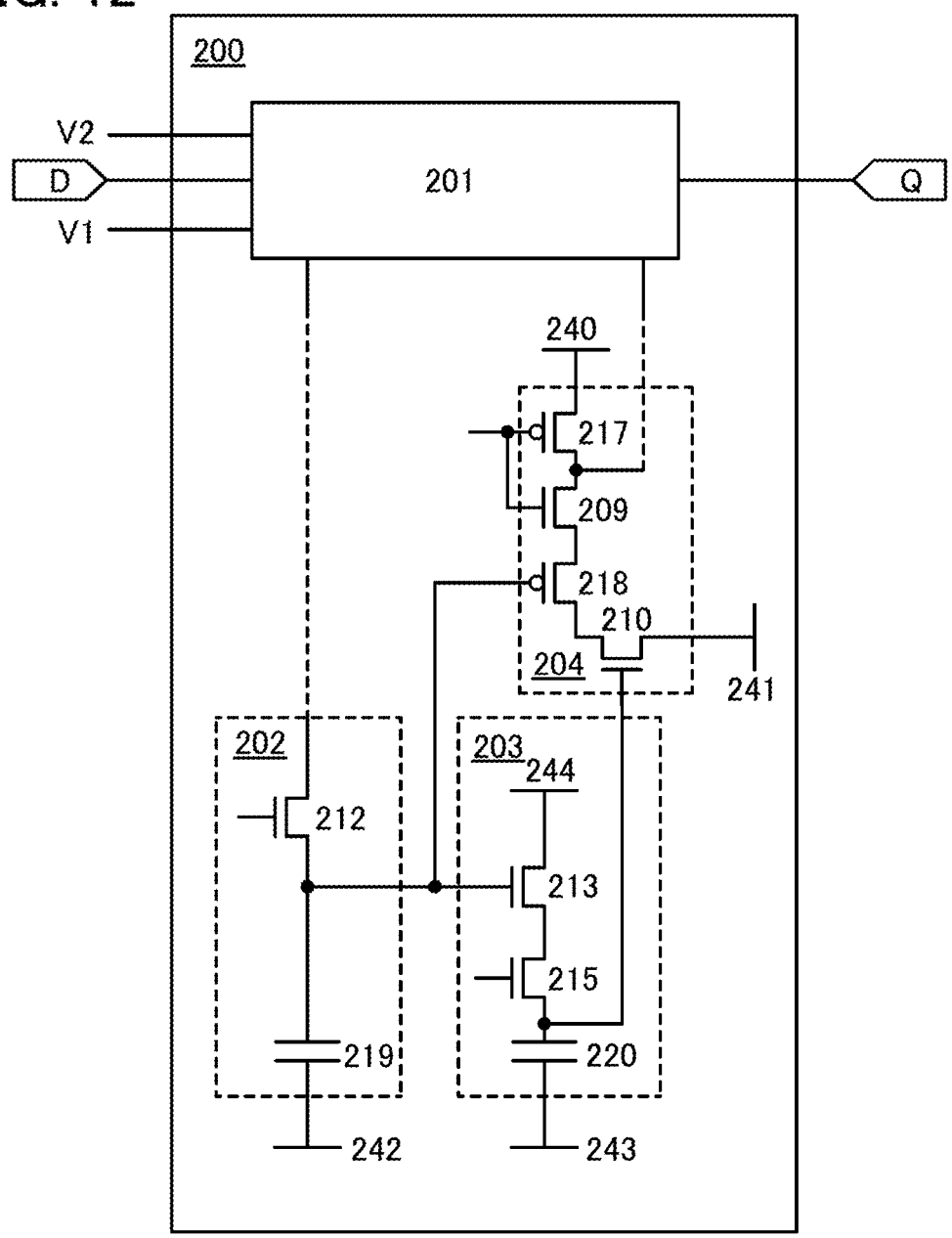
FIG. 12 illustrates a structure of a semiconductor device of one embodiment of the present invention.

FIG. 12 illustrates an example of the structure of a semiconductor device in one embodiment of the present invention.

A semiconductor device 200 illustrated in FIG. 12 includes a first memory circuit 201, a second memory circuit 202, a third memory circuit 203, and a read circuit 204. As a power supply voltage, a potential difference between a potential V1 and a potential V2 is supplied to the semiconductor device 200. One of the potential V1 and the potential V2 is high, and the other is low. The following shows an example of the structure of a semiconductor device in one embodiment of the present invention when the potential V1 is low and the potential V2 is high.

The first memory circuit 201 has a function of retaining data when a signal D including the data is input in a period during which the power supply voltage is supplied to the semiconductor device 200. The first memory circuit 201 outputs a signal Q including the retained data in the period during which the power supply voltage is supplied to the semiconductor device 200. On the other hand, the first memory circuit 201 cannot retain data in a period during which the power supply voltage is not supplied to the semiconductor device 200. That is, the first memory circuit 201 can be called a volatile memory circuit.

The second memory circuit 202 has a function of reading the data retained in the first memory circuit 201 to save the data in the period during which the power supply voltage is supplied to the semiconductor device 200. The third memory circuit 203 has a function of reading the data retained in the second memory circuit 202 to save the data in the period during which the power supply voltage is not supplied to the semiconductor device 200. The read circuit 204 has a function of reading data stored in the second memory circuit 202 or the third memory circuit 203, in the period during which the power supply voltage is supplied to the semiconductor device 200.

As illustrated in FIG. 12, the second memory circuit 202 includes a transistor 212 and a capacitor 219; the third memory circuit 203 includes a transistor 213, a transistor 215, and a capacitor 220; and the read circuit 204 includes a transistor 210, a transistor 218, a transistor 209, and a transistor 217.

The transistor 212 has a function of charging and discharging the capacitor 219 in accordance with data retained in the first memory circuit 201. The transistor 212 is preferably capable of charging and discharging the capacitor 219 at a high speed in accordance with data retained in the first memory circuit 201. Specifically, the transistor 212 preferably contains crystalline silicon (preferably polycrystalline silicon, more preferably single crystal silicon) in a channel formation region.

The on/off state of the transistor 213 is determined in accordance with the charge held in the capacitor 219. The transistor 215 has a function of charging and discharging the capacitor 220 in accordance with the potential of a wiring 244 when the transistor 213 is on. It is preferable that the off-state current of the transistor 215 be extremely low. Specifically, the transistor 215 preferably contains an oxide semiconductor (preferably oxide containing In, Ga, and Zn) in a channel formation region.

Specific connection relations between the elements are as follows. One of a source and a drain of the transistor 212 is connected to the first memory circuit 201. The other of the source and the drain of the transistor 212 is connected to one electrode of the capacitor 219, a gate of the transistor 213, and a gate of the transistor 218. The other electrode of the capacitor 219 is connected to a wiring 242. One of a source and a drain of the transistor 213 is connected to the wiring 244. The other of the source and the drain of the transistor 213 is connected to one of a source and a drain of the transistor 215. The other of the source and the drain of the transistor 215 is connected to one electrode of the capacitor 220 and a gate of the transistor 210. The other electrode of the capacitor 220 is connected to a wiring 243. One of a source and a drain of the transistor 210 is connected to a wiring 241. The other of the source and the drain of the transistor 210 is connected to one of a source and a drain of the transistor 218. The other of the source and the drain of the transistor 218 is connected to one of a source and a drain of the transistor 209. The other of the source and the drain of the transistor 209 is connected to one of a source and a drain of the transistor 217 and the first memory circuit 201. The other of the source and the drain of the transistor 217 is connected to a wiring 240. Although a gate of the transistor 209 is connected to a gate of the transistor 217 in FIG. 12, it is not necessarily connected to the gate of the transistor 217.

Note that FIG. 12 shows an example where the third memory circuit 203 and the read circuit 204 are connected to each other and the second memory circuit 202 and the read circuit 204 are connected to each other; however, one embodiment of the present invention is not limited to this structure. That is, the read circuit 204 is not necessarily connected to the second memory circuit 202 as long as it is connected at least to the third memory circuit 203. However, the structure where the read circuit 204 is connected to the second memory circuit 202 is preferable for power gating with fine time granularity because data stored in the second memory circuit 202 can be read and supplied to the first memory circuit 201.

When the transistor described in the above embodiment is used as the transistor 215, the transistor 215 can have not only low off-state current but also excellent subthreshold characteristics and a minute structure. Furthermore, the transistor 215 can operate at a high speed because of its high switching speed. Accordingly, a small semiconductor device can be provided. Since the data retained in the first memory circuit 201 can be saved at a high speed, power gating with fine time granularity can be implemented.

Embodiment 6

An example of the structure of a device including the semiconductor device in one embodiment of the present invention will be described with reference to FIG. 13.

Figure 13:
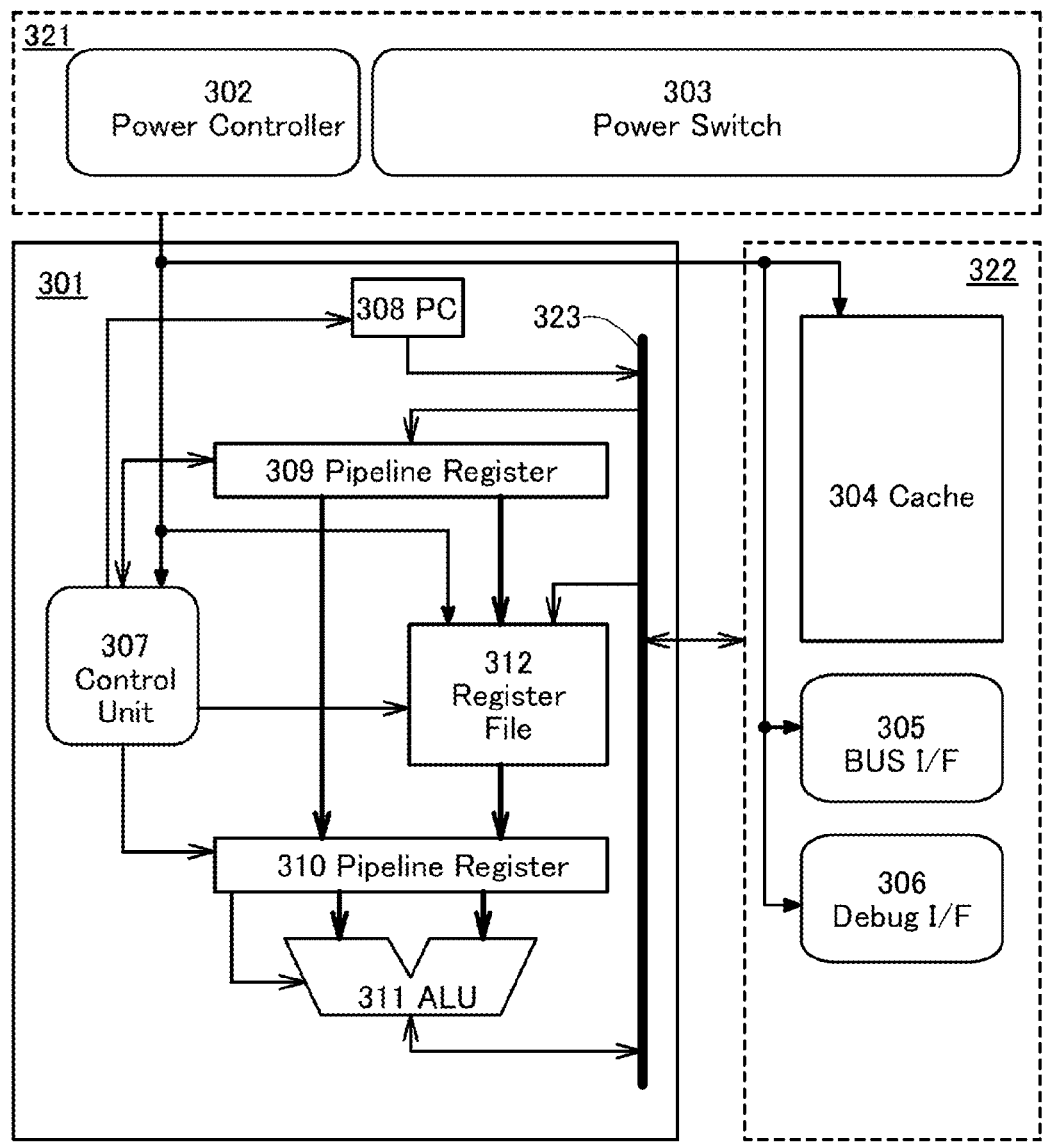
FIG. 13 illustrates a structure of a CPU of one embodiment of the present invention.

A semiconductor device 300 illustrated in FIG. 13 includes a CPU core 301, a power management unit 321, and a peripheral circuit 322. The power management unit 321 includes a power controller 302 and a power switch 303. The peripheral circuit 322 includes a cache 304 including cache memory, a bus interface (BUS I/F) 305, and a debug interface (Debug I/F) 306. The CPU core 301 includes a data bus 323, a control unit 307, a program counter (PC) 308, a pipeline register 309, a pipeline register 310, an arithmetic logic unit (ALU) 311, and a register file 312. Data is transmitted between the CPU core 301 and the peripheral circuit 322 such as the cache 304 via the data bus 323. The semiconductor device of one embodiment of the present invention can be applied to the program counter (PC) 308, the pipeline register 309, the pipeline register 310, and/or the register file 312, for example. Without limitations to these examples, the semiconductor device of one embodiment of the present invention can also be applied to other circuits including a register. Using the semiconductor device of one embodiment of the present invention for these circuits makes it possible to provide a semiconductor device that can aggressively reduce power consumption.

The control unit 307 has functions of decoding and executing instructions contained in a program such as inputted applications by controlling the overall operations of the PC 308, the pipeline registers 309 and 310, the ALU 311, the register file 312, the cache 304, the bus interface 305, the debug interface 306, and the power controller 302.

The ALU 311 has a function of performing a variety of arithmetic operations such as four arithmetic operations and logic operations.

The cache 304 has a function of temporarily storing frequently used data. The PC 308 is a register having a function of storing an address of an instruction to be executed next. Although not illustrated in FIG. 13, the cache 304 includes a cache controller for controlling the operation of the cache memory.

The pipeline register 309 has a function of temporarily storing instruction data.

The register file 312 includes a plurality of registers including a general purpose register and can retain data that is read from the main memory of the control unit 307, data obtained as a result of arithmetic operations in the ALU 311, or the like.

The pipeline register 310 has a function of temporarily storing data used for arithmetic operations performed in the ALU 311, data obtained as a result of arithmetic operations in the ALU 311, or the like.

The bus interface 305 functions as a path for data between the semiconductor device 300 and devices outside the semiconductor device 300. The debug interface 306 functions as a path of a signal for inputting an instruction to control debugging to the semiconductor device 300. The bus interface 305 and the debug interface 306 are each provided with a register.

The power switch 303 has a function of controlling supply of the power supply voltage to circuits other than the power controller 302 in the semiconductor device 300. These circuits belong to several different power domains. The power switch 303 controls whether the power supply voltage is supplied to circuits in the same power domain. The power controller 302 has a function of controlling the operation of the power switch 303.

A description is made on an example of the power gating sequence in the semiconductor device 300 having the above configuration.

First, the CPU core 301 sets the timing for stopping the supply of the power supply voltage in a register of the power controller 302. Next, an instruction to start power gating is sent from the CPU core 301 to the power controller 302. Then, the registers and the cache 304 in the semiconductor device 300 start data saving. Subsequently, the power switch 303 stops the supply of the power supply voltage to the circuits other than the power controller 302 in the semiconductor device 300. Then, an interrupt signal is input to the power controller 302, thereby starting the supply of the power supply voltage to the circuits included in the semiconductor device 300. Note that a counter may be provided in the power controller 302 to be used to determine the timing of starting the supply of the power supply voltage regardless of input of an interrupt signal. Next, the registers and the cache 304 start data restoration. After that, execution of an instruction is resumed in the control unit 307.

By applying the transistor of one embodiment of the present invention to a memory device such as a register or a cache memory included in a processor, data in the memory device can be prevented from being lost owing to the stop of the supply of the power supply voltage. Further, shortly after the supply of the power supply voltage is restarted, the memory device can be returned to the same state as that before the power supply is stopped. Therefore, the power supply can be stopped even for a short time in the processor or one or a plurality of logic circuits included in the processor. Accordingly, power consumption can be suppressed.

The transistor of one embodiment of the present invention can have not only low off-state current but also excellent subthreshold characteristics and a minute structure. Furthermore, the transistor can operate at a high speed because of its high switching speed. Accordingly, a small semiconductor device can be provided by using a register that includes the transistor described in the above embodiment. Since data can be saved at a high speed, power gating with fine time granularity can be implemented. As a result, power consumption can be reduced.

Note that a memory circuit including the transistor of one embodiment of the present invention can be used for not only a CPU but also an LSI such as a digital signal processor (DSP), a custom LSI, or a programmable logic device (PLD), a radio frequency (RF) tag, and a graphics processing unit (GPU).

Embodiment 7

In this embodiment, application examples of the semiconductor device in one embodiment of the present invention will be described.

Figure 14A:
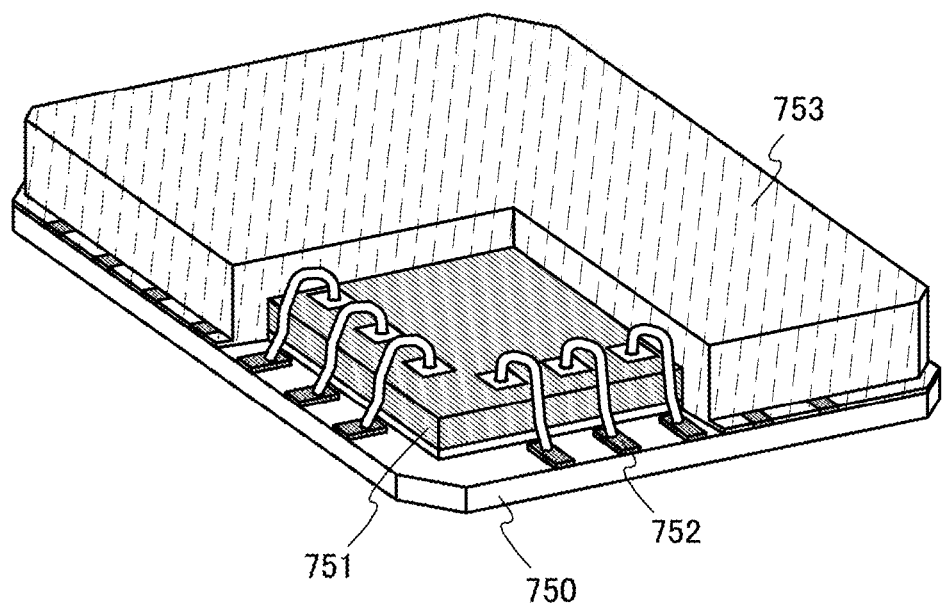
FIGS. 14A and 14B illustrate structures of a chip and a module.

FIG. 14A is a perspective view illustrating a cross-sectional structure of a package using a lead frame interposer. In the package illustrated in FIG. 14A, a chip 751 corresponding to the semiconductor device of one embodiment of the present invention is connected to a terminal 752 over an interposer 750 by wire bonding. The terminal 752 is placed on a surface of the interposer 750 on which the chip 751 is mounted. The chip 751 may be sealed by a mold resin 753, in which case the chip 751 is sealed such that part of each of the terminals 752 is exposed.

Figure 14B:
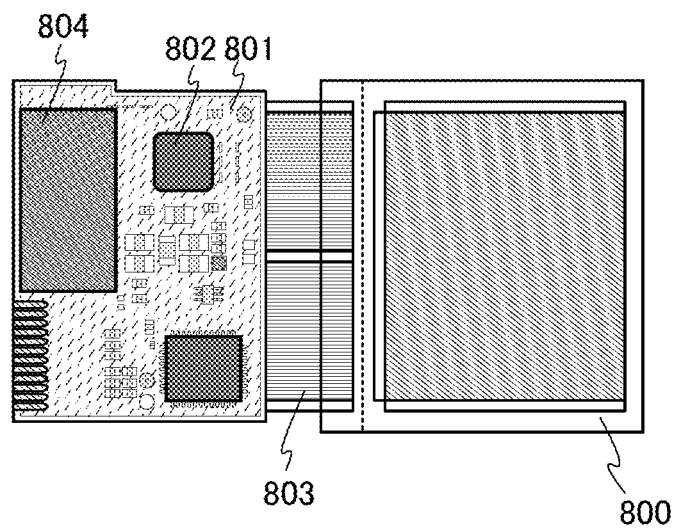

FIG. 14B illustrates the structure of a module of an electronic device (mobile phone) in which a package is mounted on a circuit board. In the module of the mobile phone in FIG. 14B, a package 802 and a battery 804 are mounted on a printed wiring board 801. The printed wiring board 801 is mounted on a panel 800 including a display element by an FPC 803.

Embodiment 8

The semiconductor device of one embodiment of the present invention can be used for display devices, personal computers, or image reproducing devices provided with recording media (typically, devices which reproduce the content of recording media such as digital versatile discs (DVDs) and have display devices for displaying the reproduced images). Other examples of electronic devices that can be equipped with the semiconductor device of one embodiment of the present invention are mobile phones, game machines including portable game consoles, portable data terminals, e-book readers, cameras such as video cameras and digital still cameras, goggle-type display devices (head mounted displays), navigation systems, audio reproducing devices (e.g., car audio systems and digital audio players), copiers, facsimiles, printers, multifunction printers, automated teller machines (ATM), and vending machines. FIGS. 15A to 15F illustrate specific examples of these electronic devices.

Figure 15A:
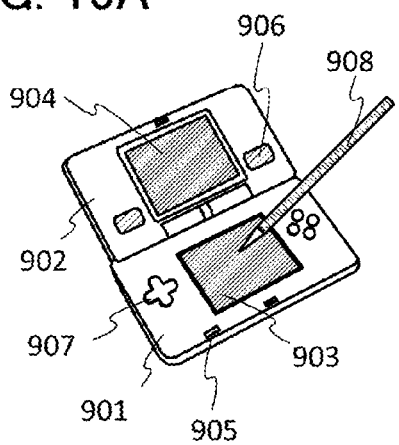
FIGS. 15A to 15F each illustrate an electronic device of one embodiment of the present invention.

FIG. 15A illustrates a portable game console including a housing 901, a housing 902, a display portion 903, a display portion 904, a microphone 905, a speaker 906, an operation key 907, a stylus 908, and the like. Although the portable game machine in FIG. 15A has the two display portions 903 and 904, the number of display portions included in a portable game machine is not limited to this.

Figure 15B:
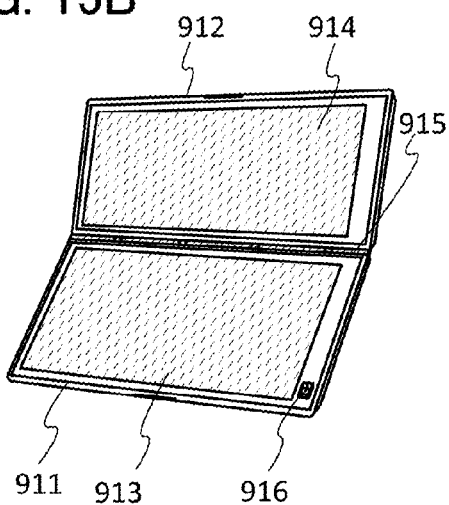

FIG. 15B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched depending on the angle between the first housing 911 and the second housing 912 at the joint 915. A display device with a position input function may be used as at least one of the first display portion 913 and the second display portion 914. Note that the position input function can be added by providing a touch panel in a display device. Alternatively, the position input function can be added by provision of a photoelectric conversion element called a photosensor in a pixel portion of a display device.

Figure 15C:
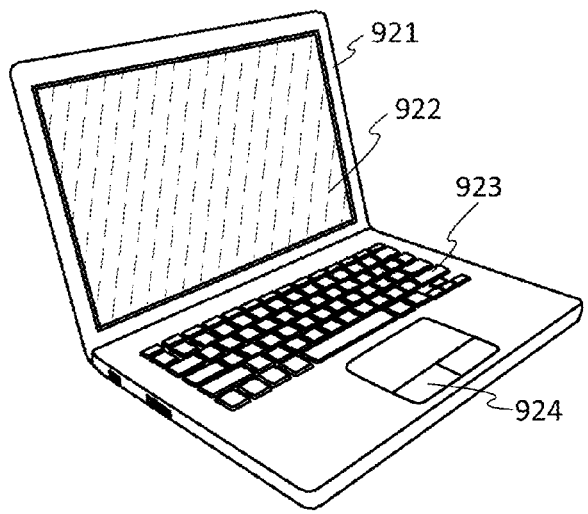

FIG. 15C illustrates a laptop personal computer, which includes a housing 921, a display portion 922, a keyboard 923, a pointing device 924, and the like.

Figure 15D:
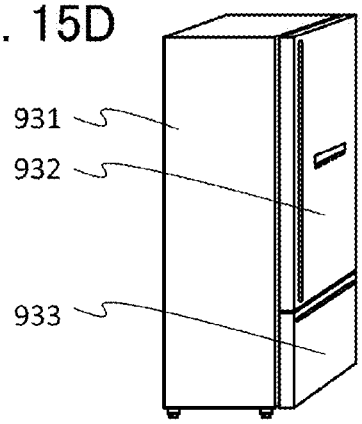

FIG. 15D illustrates an electric refrigerator-freezer including a housing 931, a door for a refrigerator 932, a door for a freezer 933, and the like.

Figure 15E:
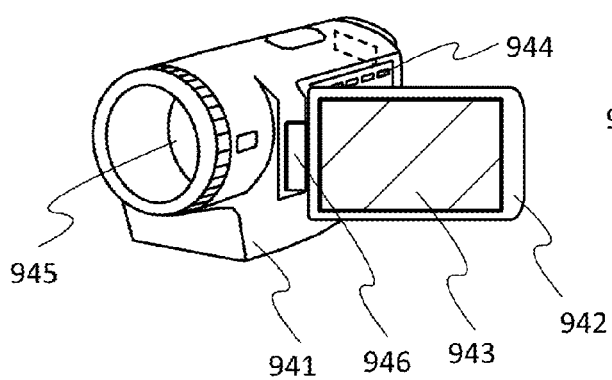

FIG. 15E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 15F:
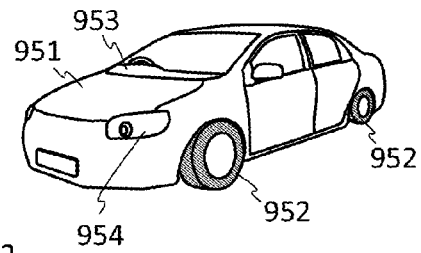

FIG. 15F illustrates an ordinary vehicle including a car body 951, wheels 952, a dashboard 953, lights 954, and the like.

When the semiconductor device of one embodiment of the present invention is used in these electronic devices, power can be saved in LSIs of the electronic devices. That is, when the transistor of one embodiment of the present invention is used for the LSIs and a memory circuit capable of retaining stored data even without supply of power is used, power supply to the LSI that is temporarily not in use can be stopped. This is made possible by saving the state of a logic circuit in the memory circuit before power supply is stopped. Accordingly, power consumption can be reduced. After the power supply is started, the electronic device can be returned at a high speed to the state before stop of power supply.

When the transistor described in the above embodiment is applied to an electronic device, the transistor can have excellent subthreshold characteristics and a minute structure. Furthermore, the transistor can operate at a high speed because of its high switching speed. Accordingly, a small semiconductor device can be provided. In addition, high-speed writing and reading can be performed. As a result, power supply can be stopped quickly and after power supply is started, the electronic device can be quickly returned to the state before stop of power supply.

This embodiment can be combined as appropriate with any of the other embodiments and examples in this specification.

Example 1

In this example, a semiconductor device of one embodiment of the present invention is described with reference to drawings.

A transistor that has a structure in which both a top surface and a side surface of a c-axis aligned crystalline indium-gallium-zinc oxide (CAAC-IGZO) island, which is a channel formation region, are surrounded by a gate electrode, i.e., a surrounded channel (s-channel) CAAC-IGZO transistor, can maintain favorable subthreshold characteristics even when the channel length is as small as approximately 50 nm.

Figure 16A:
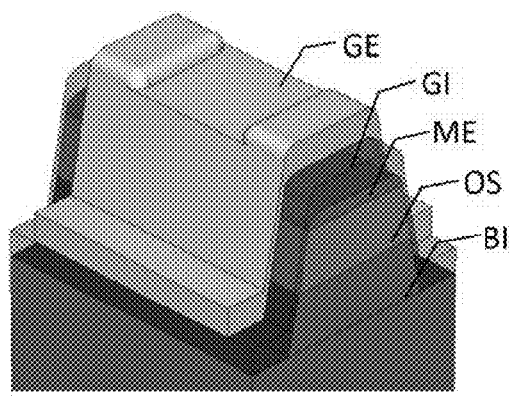
FIGS. 16A to 16D are a schematic view, a cross-sectional view, and cross-sectional STEM images of a transistor of one embodiment of the present invention.
Figure 16B:
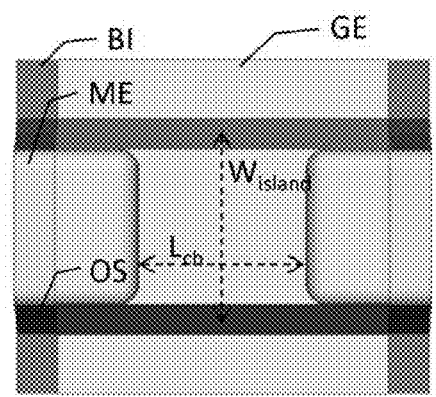

FIGS. 16A and 16B are a schematic view and a plan view of an s-channel CAAC-IGZO transistor. The transistor includes an insulator BI; an oxide semiconductor OS including CAAC-IGZO over the insulator BI; electrodes ME (source electrode and drain electrode) electrically connected to the oxide semiconductor OS; a gate insulator GI over the oxide semiconductor OS and the electrodes ME; and a gate electrode GE partly overlapping with the oxide semiconductor OS and the electrodes ME with the gate insulator GI positioned therebetween. The transistor illustrated in FIGS. 16A to 16D has a top-gate top-contact structure in which the gate electrode GE overlaps with the electrodes ME serving as the source electrode and the drain electrode. As illustrated in FIG. 16B, a channel length $L_{ch}$ means the distance between the electrodes ME and a channel width $W_{island}$ means the width of the oxide semiconductor OS.

Figure 16C:
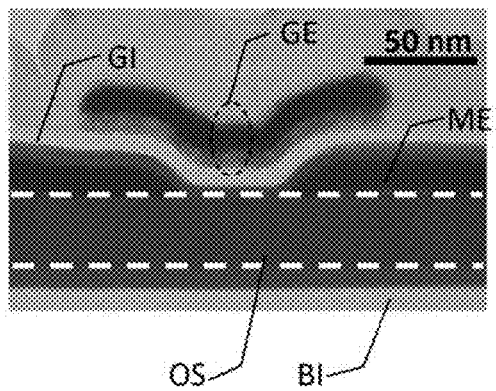
Figure 16D:
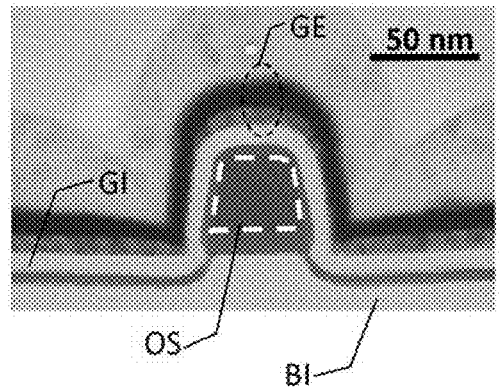

FIGS. 16C and 16D show cross-sectional scanning transmission electron microscope (STEM) images of a transistor actually fabricated. As can be observed from the images, the transistor includes the insulator BI, the oxide semiconductor OS, the electrodes ME (source electrode and drain electrode), the gate insulator GI, and the gate electrode GE. Thus, the device structure is desirable.

Figure 17A:
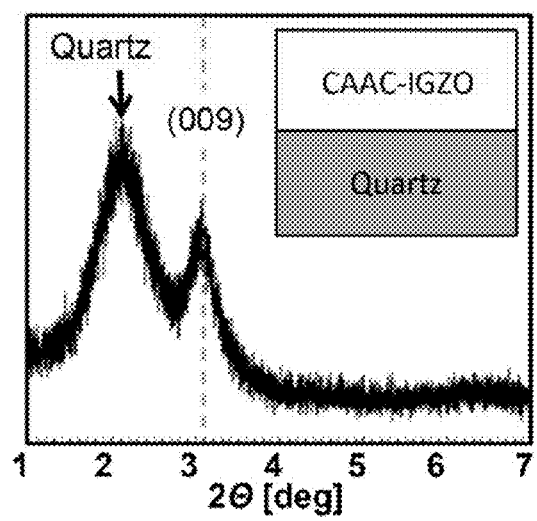
FIGS. 17A to 17D show an X-ray diffraction spectrum of CAAC-IGZO, a unit cell structure of CAAC-IGZO, a high-resolution TEM image of a cross section of CAAC-IGZO, and a high-resolution TEM image of a surface of CAAC-IGZO.
Figure 17B:
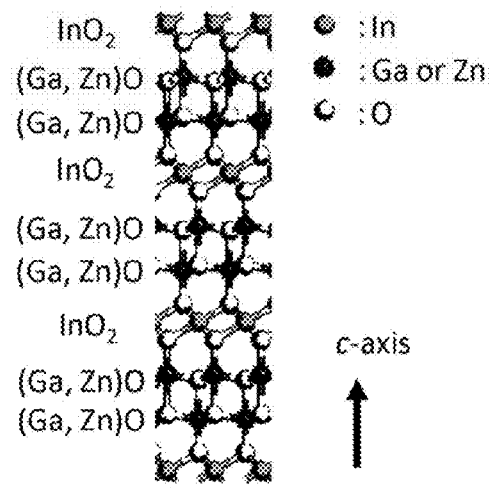
Figure 17C:
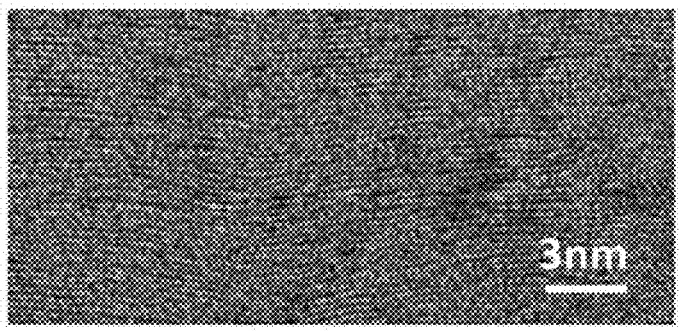
Figure 17D:
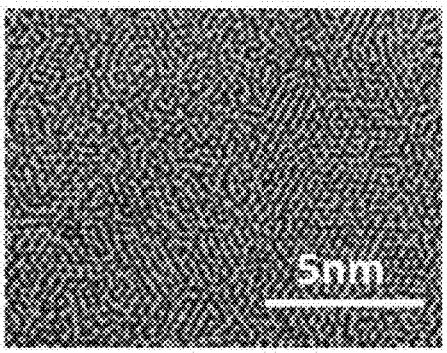
Figure 18A:
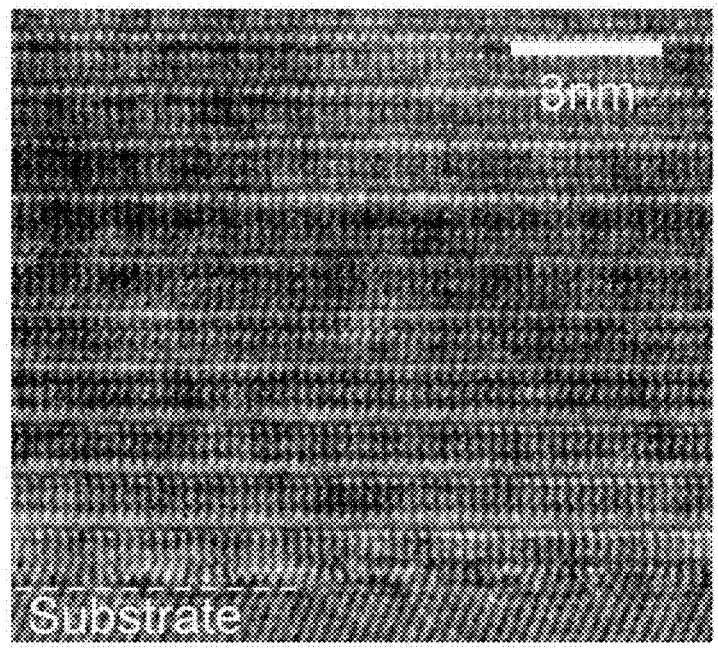
FIGS. 18A and 18B show high-resolution TEM images of single crystal IGZO.
Figure 18B:
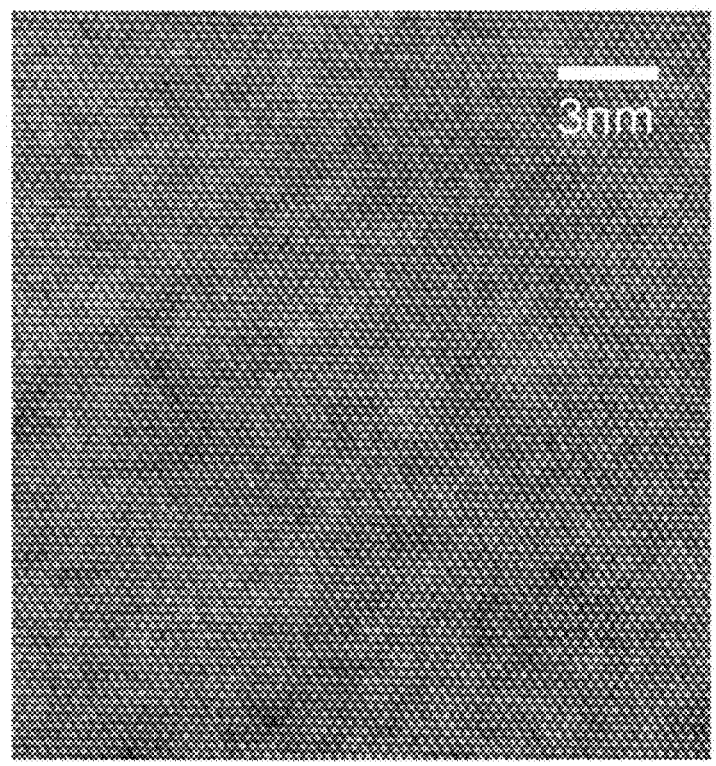

The oxide semiconductor OS was deposited over the insulator BI by a DC sputtering method using a polycrystalline target having an atomic ratio of In:Ga:Zn=1:1:1 in an atmosphere containing Ar and $O_2$ gasses with a substrate temperature at 300° C. An out-of-plane X-ray diffraction spectrum of the oxide semiconductor OS in FIG. 17A has a (009) diffraction peak attributed to an $InGaZnO_4$ crystal with a unit cell illustrated in FIG. 17B. In a high-resolution cross-sectional TEM image of the oxide semiconductor OS in FIG. 17C, atoms are arranged in a layered manner in a direction perpendicular to the substrate. In a high-resolution TEM image of a surface of the oxide semiconductor OS, triangular and hexagonal atomic arrangement is observed, as can be seen in FIG. 17D. These features show that the oxide semiconductor OS is CAAC-IGZO. As reference, FIGS. 18A and 18B show high-resolution TEM images of single crystalline indium-gallium-zinc oxide (single crystal IGZO). FIG. 18A is a high-resolution TEM image of a cross section and FIG. 18B is a high-resolution TEM image of a surface. As can be seen from the images, the single crystal IGZO and the CAAC-IGZO have different structures.

Figure 19A:
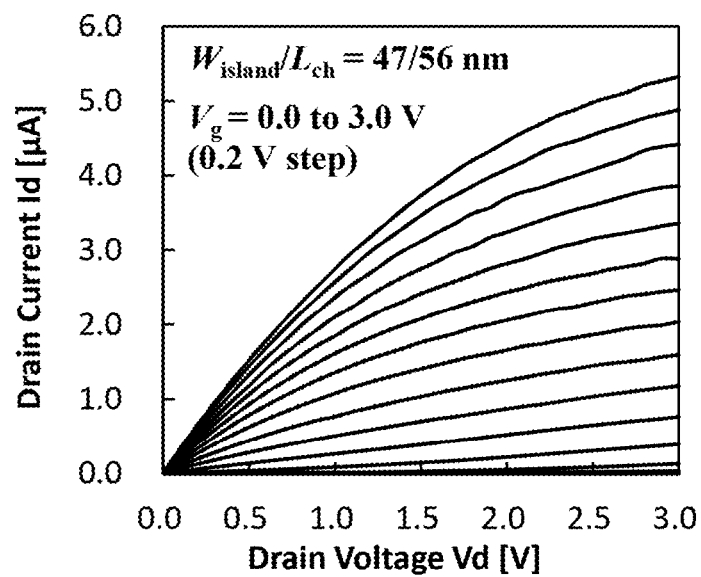
FIGS. 19A and 19B show the electrical characteristics of a transistor of one embodiment of the present invention.
Figure 19B:
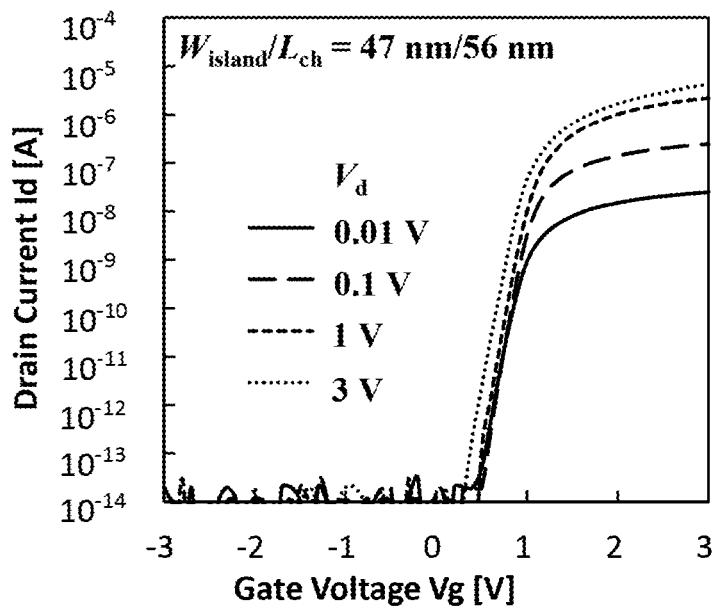
Figure 20:
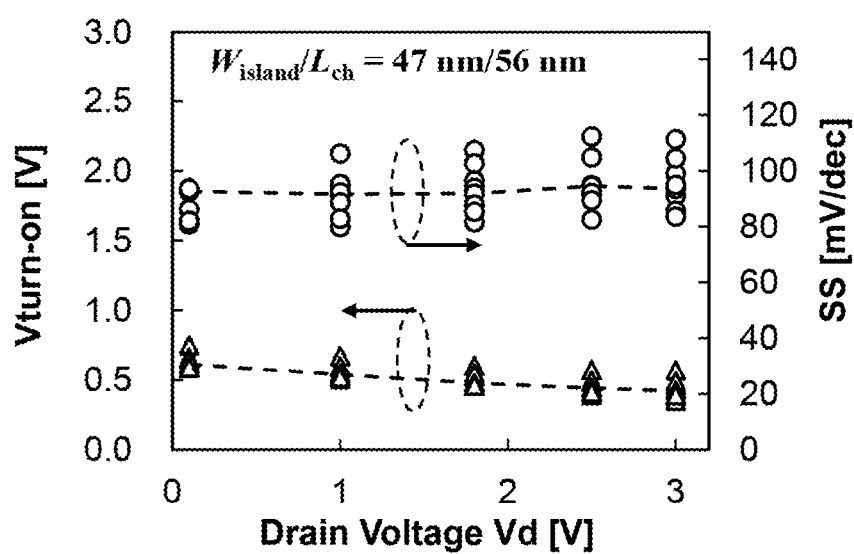
FIG. 20 shows the drain voltage dependence of turn-on voltage and an SS value in a transistor of one embodiment of the present invention.

The electrical characteristics of the transistor in which the oxide semiconductor OS had a thickness of 40 nm, the gate insulator GI had an equivalent oxide thickness of 11 nm, and the insulator BI had an equivalent oxide thickness of 390 nm were examined. FIGS. 19A and 19B show the $I_d$-$V_d$ characteristics and $I_d$-$V_g$ characteristics of the transistor with $W_{island}$ of 47 nm and $L_{ch}$ of 56 nm. Note that $I_d$, $V_d$, and $V_g$ mean drain current, drain voltage, and gate voltage of the transistor, respectively. The values shown in FIGS. 19A and 19B are the medians obtained by measurements performed on nine samples. The output characteristics are favorable and on-state current when $V_g$=3 V and $V_d$=1 V is 58 µA/µm. Furthermore, the transistor is normally off. The off-state current is lower than the lower measurement limit (under 0.1 pA) of a general semiconductor parameter analyzer. FIG. 20 shows the $V_d$ dependence of turn-on voltage $V_{turn-on}$ ($V_g$ when $I_d$=1 pA) and the SS value of each of the nine samples. From FIG. 20, it can be found that favorable subthreshold characteristics were obtained in spite of the short channel. Specifically, the medians of the drain induced barrier lowering (DIBL) and SS value were 67 mV/V and 92 mV/dec ($V_d$=1 V), respectively.

Figure 21:
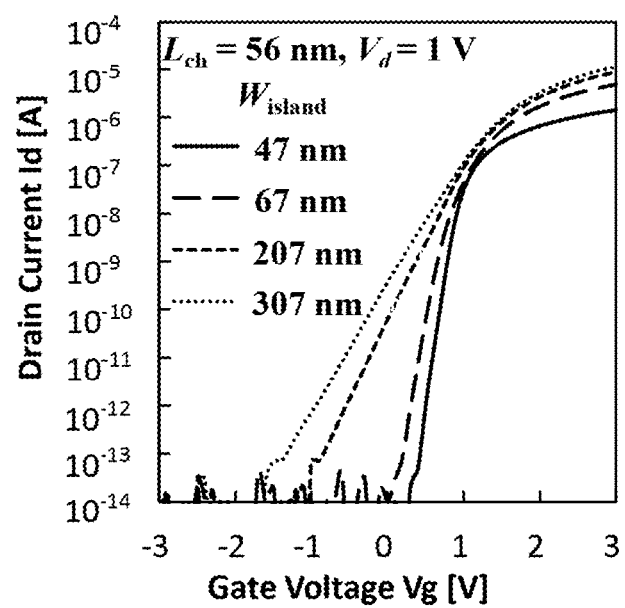
FIG. 21 shows the channel width dependence of electrical characteristics in a transistor of one embodiment of the present invention.
Figure 22:
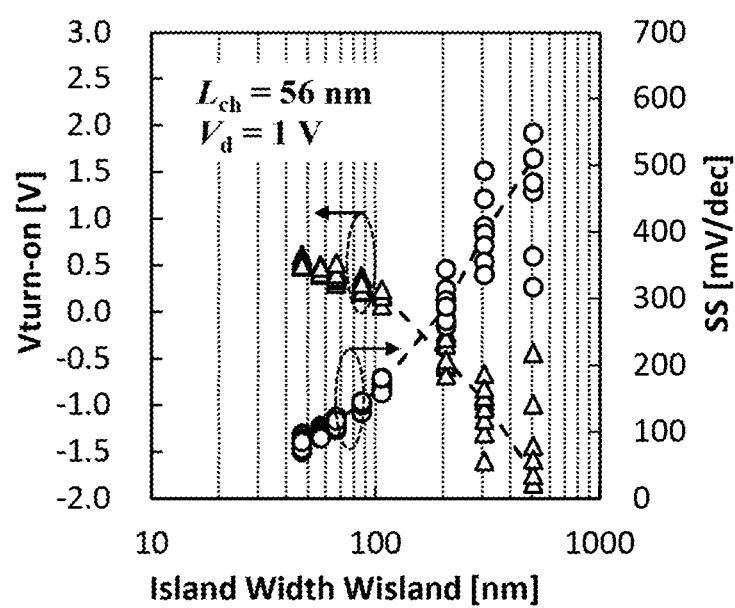
FIG. 22 shows the channel width dependence of turn-on voltage and an SS value in a transistor of one embodiment of the present invention.

This is because the gate electric field from the side surface of the oxide semiconductor OS greatly influences the channel owing to the sufficiently small channel width. As the results in FIG. 21 and FIG. 22 show, the larger the channel width is, the worse the subthreshold characteristics are. FIG. 21 shows the $I_d$-$V_g$ characteristics of the transistors with a fixed channel length $L_{ch}$ of 56 nm and various channel widths when $V_d$=1 V. FIG. 22 shows the channel width dependence of turn-on voltage and an SS value. With increasing channel width, the SS value increases and the turn-on voltage shifts in the negative direction. In the cases where the channel width $W_{island}$ is less than 100 nm, the values are gradually saturated.

Figure 30A:
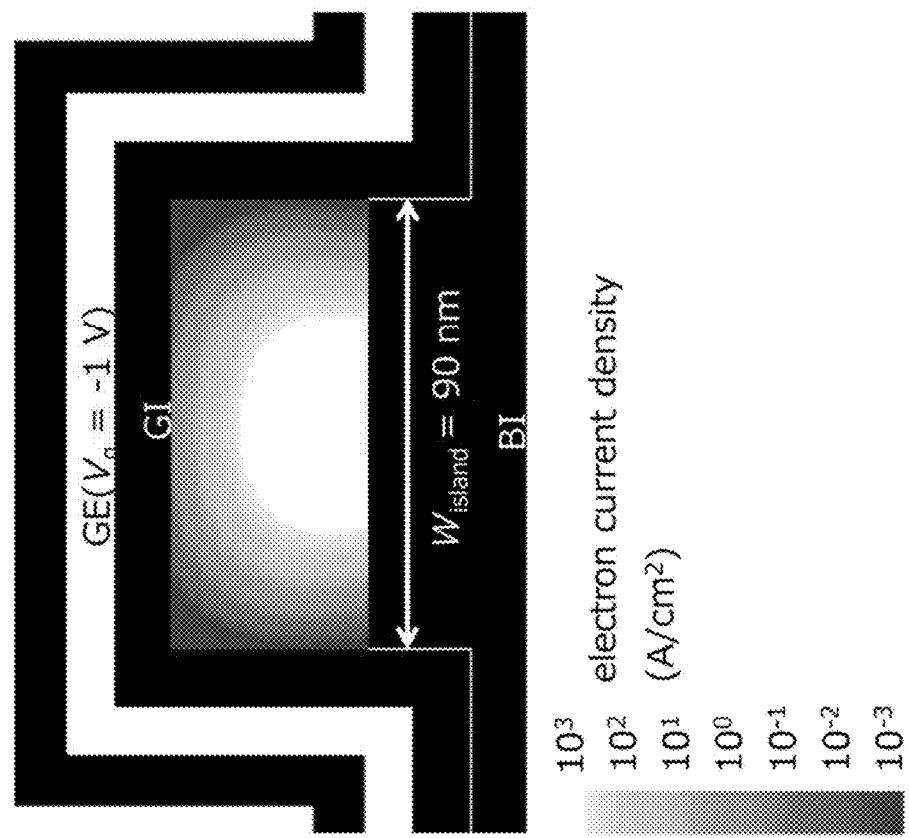
FIGS. 30A and 30B each show electron current density distribution in an active layer obtained by device calculation.
Figure 30B:
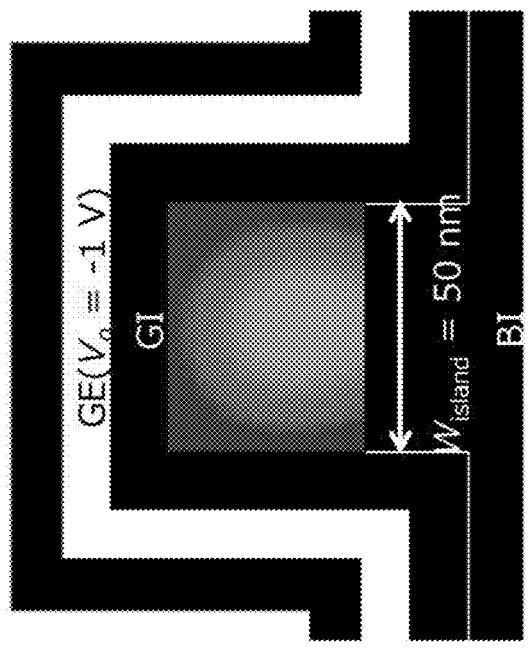

The reason why the SS value is reduced with decreasing channel width will be discussed referring to results of device calculation. With the use of Sentaurus (manufactured by Synopsys, Inc.), 3D device calculation was conducted. As the device structure, that of the fabricated s-channel CAAC-IGZO transistor was used. FIGS. 30A and 30B each show electron current density distribution in the active layer in a cross section taken in the channel width direction of the transistor. In the transistor, $W_{island}$ is 50 nm or 90 nm and $L_{ch}$ is 56 nm. The active layer corresponds to an oxide semiconductor. $V_g$ was set to −1 V and $V_d$ was set to 1 V. As shown in FIG. 30B, the transistor with $W_{island}$ of 90 nm has a high electron current density in the active layer on a back channel side, which is apart from the gate electrode. By contrast, as shown in FIG. 30A, the transistor in which $W_{island}$ is 50 nm has a greatly reduced electron current density on a back channel side. When $W_{island}$ is small, the electron current density on the back channel side is highly controllable. The reduced SS value can be attributed to the high controllability.

Figure 23:
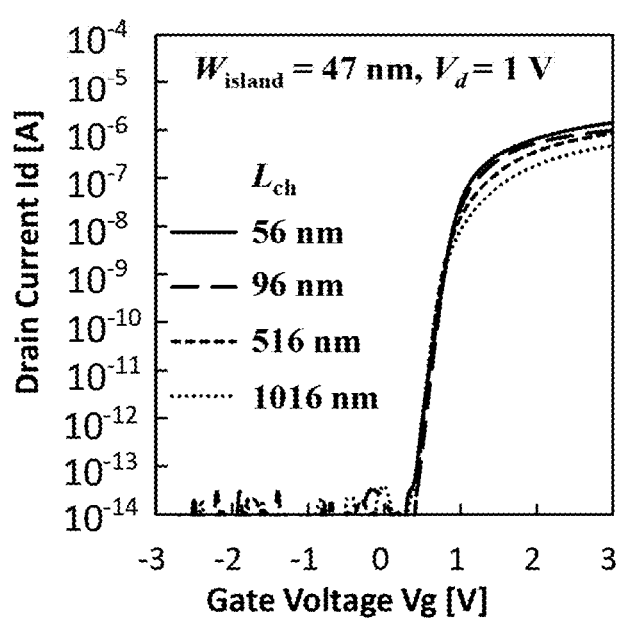
FIG. 23 shows the channel length dependence of electrical characteristics in a transistor of one embodiment of the present invention.
Figure 24:
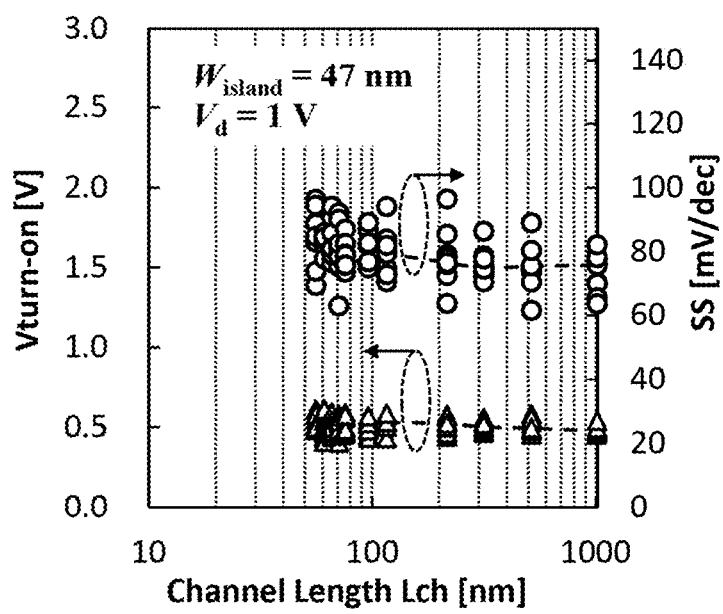
FIG. 24 shows the channel length dependence of turn-on voltage and an SS value in a transistor of one embodiment of the present invention.

Results of the 3D device calculation where an upper end portion of the active layer is rounded are shown in FIGS. 31A and 31B. As shown in FIG. 23 and FIG. 24, the device structure with a small channel width is hardly influenced by short channel effects. FIG. 23 shows the $I_d$-$V_g$ characteristics of the transistors with a fixed channel width of 47 nm and various channel lengths $L_{ch}$ when $V_d$=1 V. FIG. 24 shows the channel length $L_{ch}$ dependence of turn-on voltage and an SS value. When the channel width is 47 nm and the channel length $L_{ch}$ is 56 nm or less, characteristics deterioration due to short channel effects hardly occurs.

Figure 32:
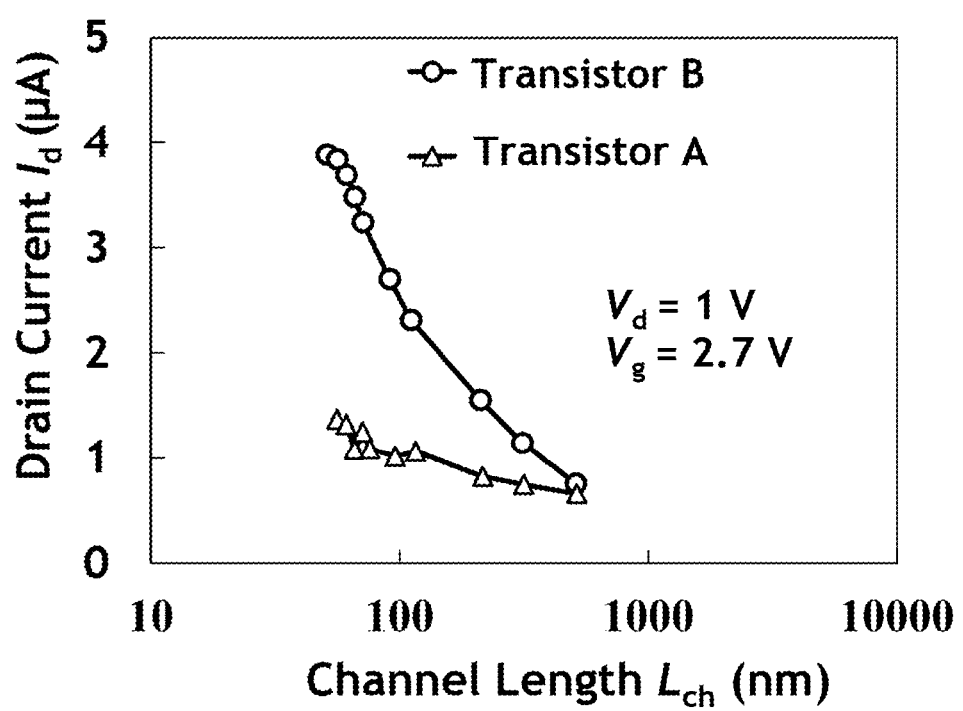
FIG. 32 shows the channel length dependence of drain current in a transistor of one embodiment of the present invention.

FIG. 32 shows the channel length $L_{ch}$ dependence of drain current $I_d$ in two kinds of transistors (denoted as transistors A and B in the graph). The drain current $I_d$ is current when $V_d$ is 1 V and $V_g$ is 2.7 V. The channel width is approximately 50 nm. Transistor A has the $I_d$-$V_g$ characteristics shown in FIG. 23. Transistor B has thicker source and drain electrodes than Transistor A. The drain current $I_d$ of Transistor B is the average value of six samples. As can be observed from FIG. 32, the drain current $I_d$ increases as the channel length $L_{ch}$ decreases in each of the transistors. The drain current $I_d$ is higher in Transistor B than in Transistor A, and increases more greatly in Transistor B than in Transistor A with the decreasing channel length $L_{ch}$. This is because the larger thicknesses of the source and drain electrodes lead to lower resistance thereof.

Figure 33:
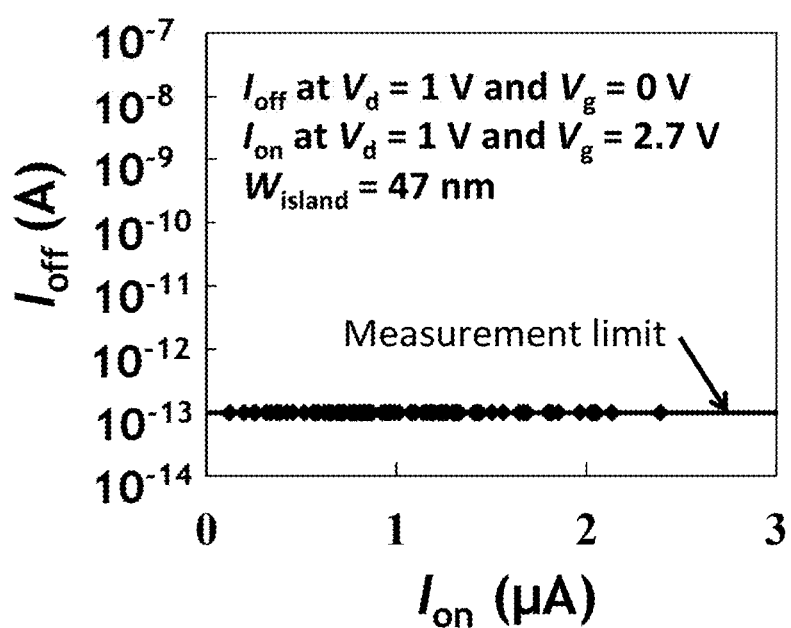
FIG. 33 shows a relation between off-state current and on-state current in a transistor of one embodiment of the present invention.

FIG. 33 shows the relation between drain current when $V_d$ is 1 V and $V_g$ is 2.7 V (denoted as on-state current $I_{on}$ in the graph) and drain current when $V_d$ is 1 V and $V_g$ is 0 V (denoted as off-state current $I_{off}$ in the graph). The data is that of the transistor having the $I_d$-$V_g$ characteristics shown in FIG. 23. It is shown from FIG. 33 that the drain current when $V_d$ is 1 V and $V_g$ is 0 V is as low as, or even lower than, the lower measurement limit ($10^{-13}$ A), independent on the drain current when $V_d$ is 1 V and $V_g$ is 2.7 V.

Figure 25:
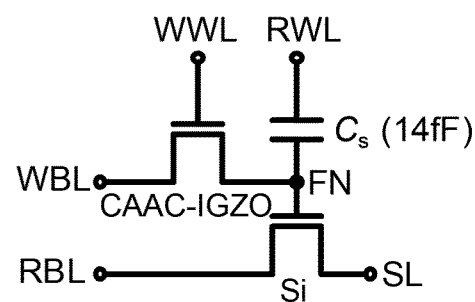
FIG. 25 illustrates a memory circuit of one embodiment of the present invention.

As an application example of an s-channel CAAC-IGZO transistor, a memory circuit illustrated in FIG. 25 can be given. The memory circuit in FIG. 25 includes a Si transistor, an s-channel CAAC-IGZO transistor, and a capacitor Cs. The capacitor Cs has a capacitance of 14 fF.

In FIG. 25, a source electrode of the Si transistor is electrically connected to a source line SL, and a drain electrode is electrically connected to a bit line RBL. A gate electrode of the s-channel CAAC-IGZO transistor is electrically connected to a word line WWL, and one of a source electrode and a drain electrode is electrically connected to a bit line WBL. A gate electrode of the Si transistor and the other of the source electrode and the drain electrode of the s-channel CAAC-IGZO transistor are electrically connected to one electrode of the capacitor Cs, and the other electrode of the capacitor Cs is electrically connected to a word line RWL.

A memory cell including an s-channel CAAC-IGZO transistor in which $W_{island}$ is 64 nm and $L_{ch}$ is 68 nm was fabricated, and measured write time ($T_{write}$) and $T_{write}$ calculated by SPICE were compared. Here, the write time ($T_{write}$) is, as illustrated in a timing chart of FIG. 26, duration between the time when the potential of the word line WWL is raised from a low-level potential (L potential) to a high-level potential (H potential) and the time when the potential ($V_{FN}$) of a floating node (FN) reaches 90% of the potential of the bit line WBL.

Figure 26:
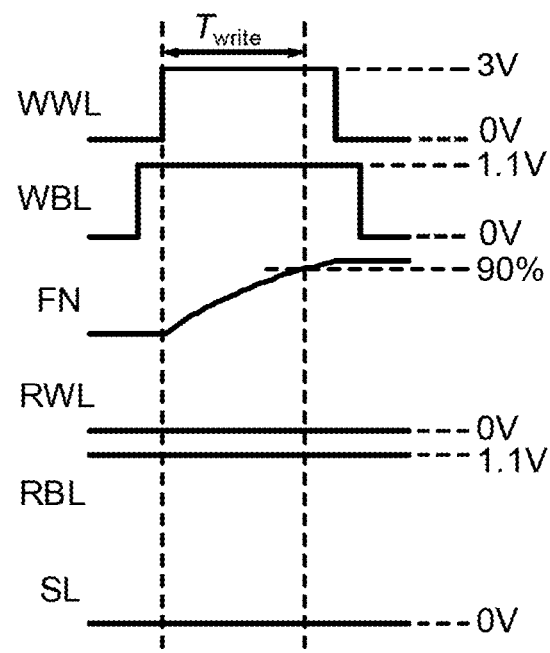
FIG. 26 is a timing chart of a write operation of a memory circuit of one embodiment of the present invention.

FIG. 26 is an example of a timing chart of writing into a memory circuit. When the bit line WBL is set to an H potential (here, 1.1 V) and the word line WWL is set to an H potential (here, 3 V), the s-channel CAAC-IGZO transistor is turned on, the bit line WBL and the one electrode of the capacitor Cs are brought into conduction, and the potential of the one electrode of the capacitor (the potential $V_{FN}$ of the FN) becomes close to the potential of the bit line WBL; thus, writing is performed. When the word line WWL is set to an L potential (here, 0 V), the s-channel CAAC-IGZO transistor is turned off and the writing is completed. Then, the bit line WBL is set to an L potential (here, 0 V). In writing, the word line RWL is set to an L potential (here, 0 V), the source line SL is set to an L potential (here, 0 V), and the bit line RBL is set to an H potential (here, 1.1 V).

Figure 27:
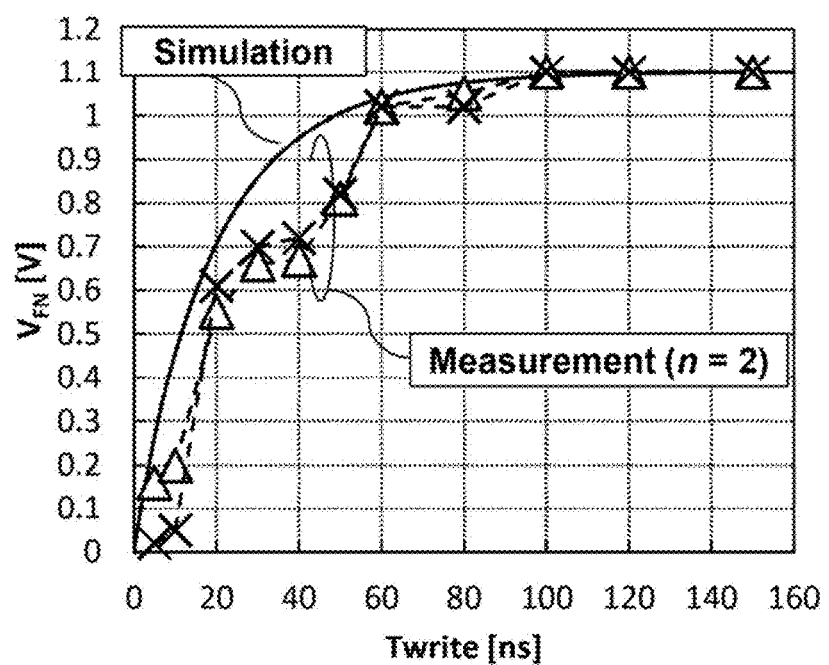
FIG. 27 shows the write time characteristics of a memory circuit of one embodiment of the present invention.

FIG. 27 shows the relation between write time and the potential of the one electrode of the capacitor (the potential $V_{FN}$ of the FN). As can be seen in FIG. 27, the measured write time (60 nanoseconds) is consistent with the write time calculated by SPICE (50 nanoseconds).

Figure 28:
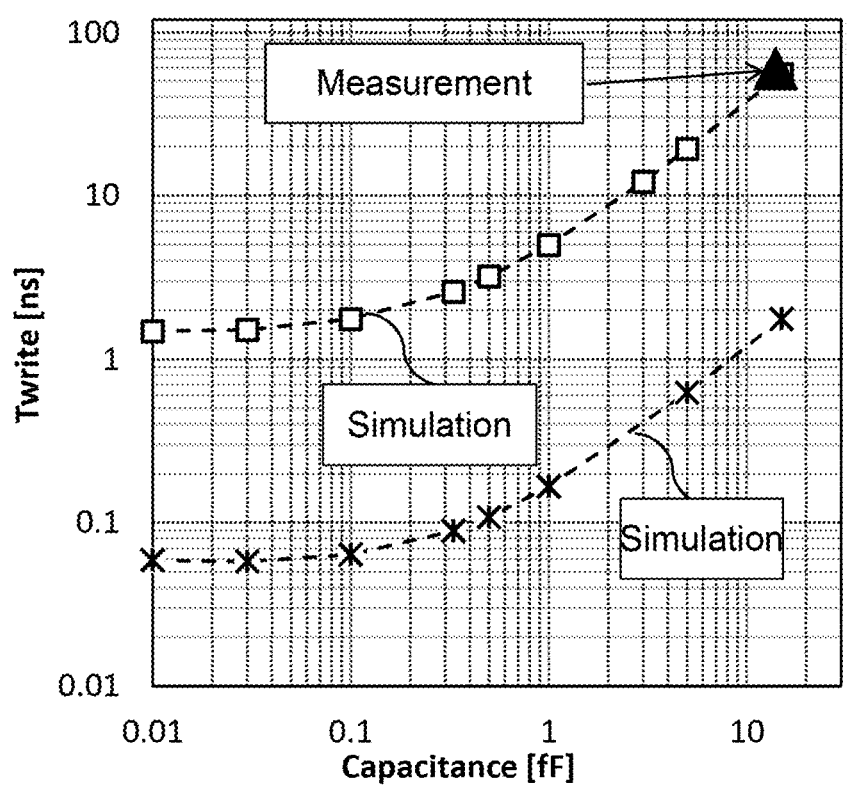
FIG. 28 shows a relation between storage capacitance and write time of a memory circuit of one embodiment of the present invention.

FIG. 28 shows SPICE calculation results of write time depending on the storage capacitance for the s-channel CAAC-IGZO transistor and the Si transistor in which W is 90 nm and L is 45 nm. The write time $T_{write}$ of the s-channel CAAC-IGZO transistor is approximately 30 times as long as that of the Si transistor. However, the off-state current when $V_g$ is 0 V is estimated to be lower than $10^{-19}$ A in the s-channel CAAC-IGZO transistor, and when the storage capacitance is 1 fF and voltage drop due to leakage in the FN is up to 0.1 V, the retention time is longer than 1000 seconds. In that case, the write time is shorter than 5 nanoseconds.

Figure 29A:
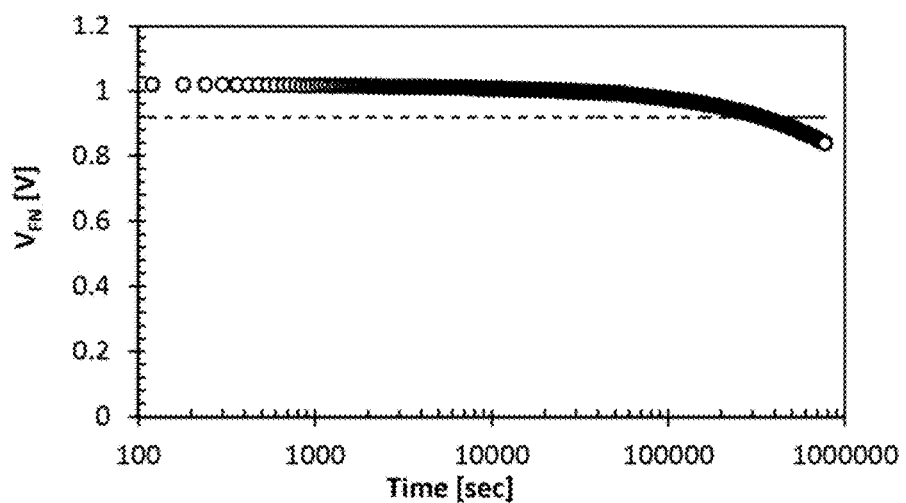
FIGS. 29A and 29B show the characteristics of a memory circuit of one embodiment of the present invention.

FIG. 29A shows the relation between time and the potential of the one electrode of the capacitor (the potential $V_{FN}$ of the FN) at room temperature. A data retention period, which is the period until when the potential $V_{FN}$ decreases by 10% here, was measured and turned out to be approximately $3 \times 10^5$ seconds (3.5 days) as shown in FIG. 29A.

Figure 29B:
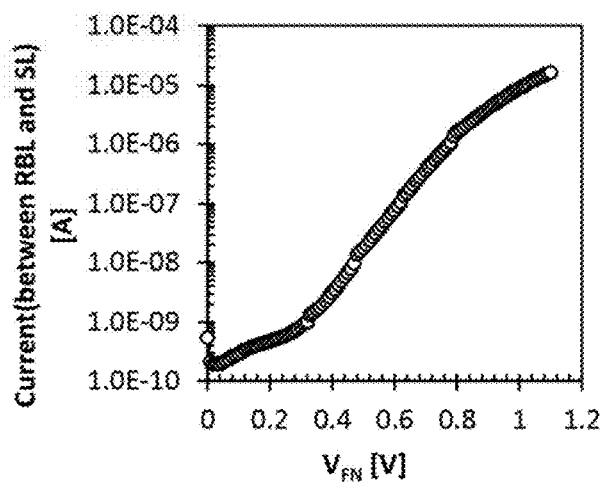

FIG. 29B shows the relation between the potential $V_{FN}$ at room temperature and current flowing between the bit line RBL and the source line SL. Note that the potential $V_{FN}$ of the FN was changed by changing the potential applied to the bit line WBL in the state where the s-channel CAAC-IGZO transistor is on. A positive correlation is shown between the potential $V_{FN}$ and the above-mentioned current in the potential $V_{FN}$ range from 0 V (precisely, approximately 0.02 V) to 1.1 V. This means that monitoring the above-mentioned current enables reading of data (potential $V_{FN}$) retained in the memory circuit.

The above features can be utilized in a high-speed, low-power LSI, a specific example of which is a memory.

Example 2

In this example, a semiconductor device of one embodiment of the present invention is described with reference to drawings.

Examining the characteristics of a miniaturized s-channel CAAC-IGZO transistor is extremely important in its application to an LSI or the like. Thus, s-channel CAAC-IGZO transistors with various channel widths and a channel length of approximately 50 nm were fabricated, and the current characteristics of the transistors were compared to determine the effects of the s-channel structure.

The fabricated s-channel CAAC-IGZO transistors have the structure illustrated in the schematic view and the plan view of FIGS. 16A and 16B. Thus, for the structure of the s-channel CAAC-IGZO transistors, the description of FIGS. 16A and 16B can be referred to. The s-channel CAAC-IGZO transistors each have a top-gate top-contact structure in which the gate electrode GE overlaps with the electrodes ME serving as the source electrode and the drain electrode. The gate electrode GE provided on the side surface of the channel covers part of a side surface of the insulator BI under the oxide semiconductor OS. As illustrated in FIG. 16B, the channel length $L_{ch}$ means the distance between the electrodes ME and the channel width $W_{island}$ means the width of the oxide semiconductor OS.

A fabrication process is described below. Over the insulator BI formed over a Si substrate, the oxide semiconductor OS was deposited using a DC sputtering apparatus to a thickness of 15 nm. As a target, a polycrystalline target having an atomic ratio of In:Ga:Zn=1:1:1 was used. The deposition was performed at a substrate temperature of 300° C. in an atmosphere containing Ar and $O_2$. Here, the oxide semiconductor deposited under the above conditions was found to be CAAC-IGZO by structure analysis using an XRD apparatus and high-resolution TEM observation. The deposited CAAC-IGZO was processed into a CAAC-IGZO island and then, the source electrode and the drain electrode were formed over the CAAC-IGZO island. After that, the gate insulator with an equivalent oxide thickness of 11 nm and the metal gate electrode were formed.

Figure 34B:
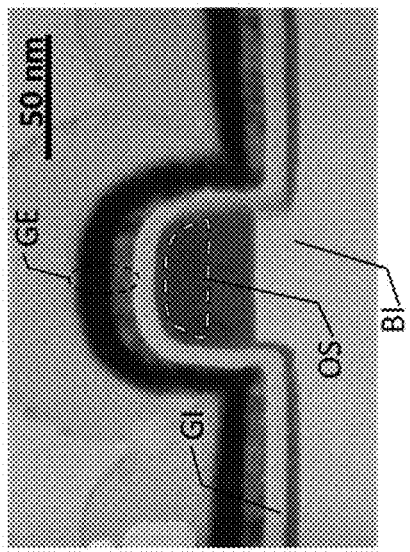
FIGS. 34A and 34B are cross-sectional STEM images of a transistor of one embodiment of the present invention.
Figure 34A:
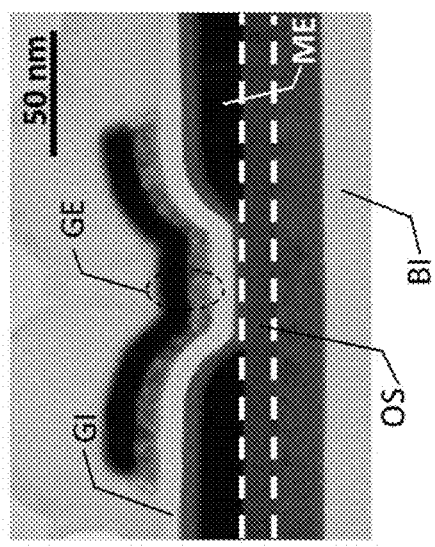

FIGS. 34A and 34B respectively show cross-sectional STEM images of the s-channel CAAC-IGZO transistor in the channel length direction and the channel width direction. From FIGS. 34A and 34B, it can be found that a desired structure was obtained.

Figure 35A:
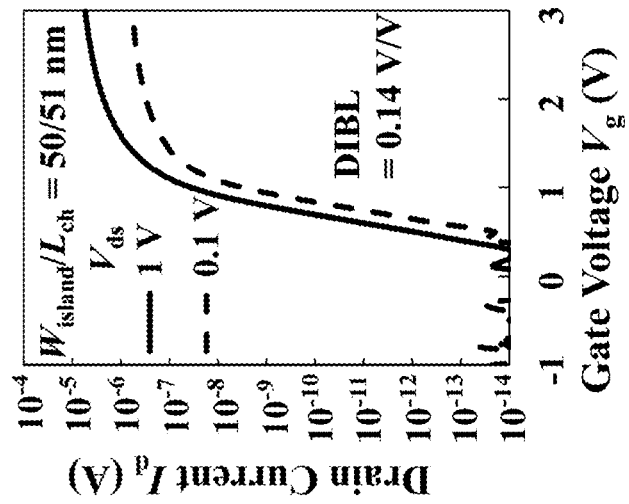
FIGS. 35A and 35B show the electrical characteristics of transistors of embodiments of the present invention.
Figure 35B:
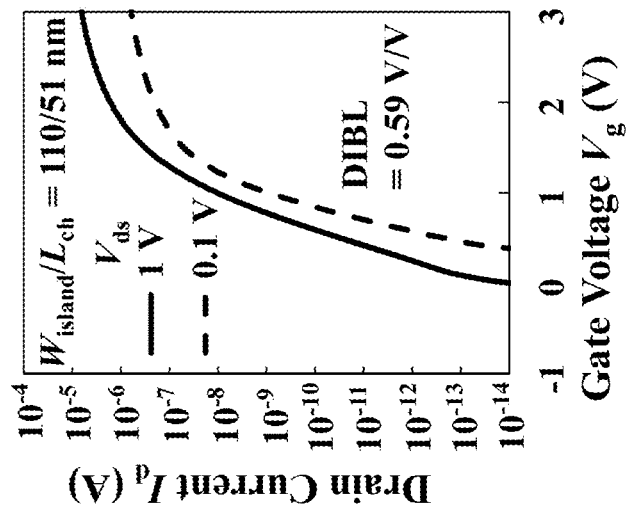

FIG. 35A shows the $I_d$-$V_g$ characteristics of the s-channel CAAC-IGZO transistor in which $W_{island}$ is 110 nm and $L_{ch}$ is 51 nm when $V_d$ is 0.1 V and 1 V. FIG. 35B shows the $I_d$-$V_g$ characteristics of the s-channel CAAC-IGZO transistor in which $W_{island}$ is 50 nm and $L_{ch}$ is 51 nm when $V_d$ is 0.1 V and 1 V. The results in FIG. 35A reveal that in the transistor whose $W_{island}$ is as large as 110 nm, with the higher $V_d$, the $I_d$-$V_g$ characteristics are shifted in the negative direction in the gate voltage, which means that DIBL effects are obtained. The DIBL here is 0.59 V/V. As shown in FIG. 35B, in the transistor whose $W_{island}$ is as small as 50 nm, even with the higher $V_d$, the $I_d$-$V_g$ characteristics are shifted only slightly in the negative direction in the gate voltage, suggesting that DIBL effects are suppressed. The DIBL here is as small as 0.14 V/V.

The reason for the above is as follows. The distance in which a drain electric field affects the potential in the channel is called natural length and expressed by a formula (1).

$$\lambda_n = \sqrt{\frac{\varepsilon_{act}}{n\varepsilon_{ox}}\left(1 + \frac{\varepsilon_{ox}t_{act}}{4\varepsilon_{act}t_{ox}}\right)t_{act}t_{ox}} \quad (1)$$

Here, $\lambda_n$ is natural length, $\varepsilon_{act}$ is the dielectric constant of the active layer, $\varepsilon_{ox}$ is the dielectric constant of the gate insulator, $t_{act}$ is the thickness of the active layer, and $t_{ox}$ is the thickness of the gate insulator. Furthermore, n represents the effective number of gates with respect to the channel. The active layer corresponds to the oxide semiconductor of the s-channel CAAC-IGZO transistor. For example, in a transistor with a single gate (i.e., a single-gate structure), n is 1. In a transistor with two gates between which a semiconductor is provided (i.e., a dual-gate structure), n is 2. In a transistor in which a gate is provided to cover the top surface and side surfaces of a semiconductor in three directions (i.e., a tri-gate structure), n is 3. In a transistor in which a gate is provided to surround a semiconductor (i.e., a quadruple-gate structure), n is 4. A shorter $\lambda_n$ means a smaller influence of a drain electric field on the potential in the channel. When $W_{island}$ is large in the s-channel CAAC-IGZO transistor, a portion of the gate electrode on the top surface side of the channel dominantly contributes to the control of an electric field, so that n in the formula (1) is almost 1. Meanwhile, when $W_{island}$ is small, a portion of the gate electrode on the side surface side of the channel also greatly contributes to the control of an electric field, so that n in the formula (1) is close to 3 and $\lambda_n$ is short. Accordingly, it can be said that making $W_{island}$ small reduces DIBL.

Figure 36:
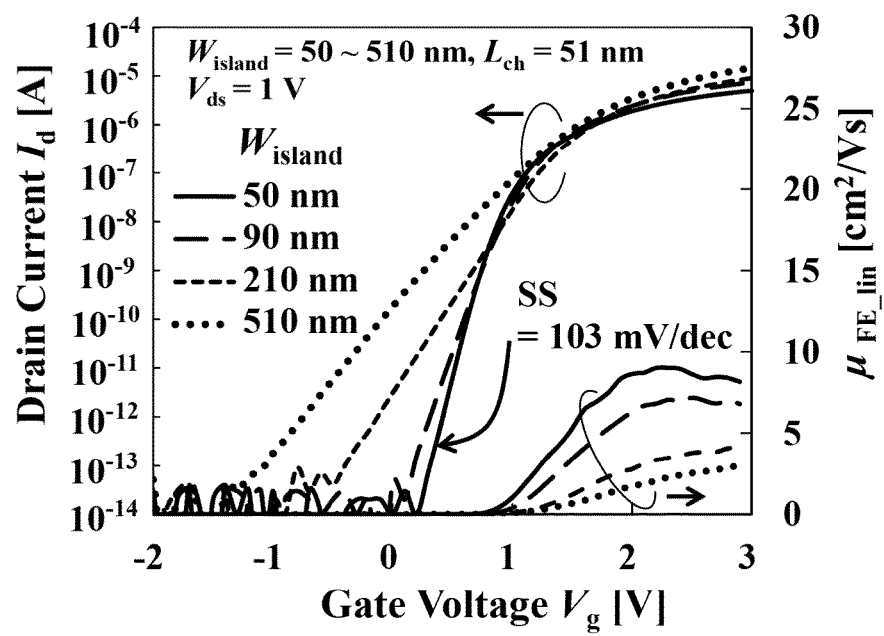
FIG. 36 shows the electrical characteristics of transistors of embodiments of the present invention.

FIG. 36 shows the $I_d$-$V_g$ characteristics of a plurality of s-channel CAAC-IGZO transistors with a channel length $L_{ch}$ of 51 nm and various channel widths $W_{island}$ when $V_d$ is 1 V. Field-effect mobility $\mu_{FE\_lin}$ in a linear region is obtained by a formula (2).

$$\mu_{FE\_lin} = \frac{g_m L_{ch}}{W_{island} C_{ox} V_{ds}} \quad (2)$$

Here, $g_m$ is transconductance obtained from the $I_d$-$V_g$ characteristics, and $C_{ox}$ is the capacitance of the gate insulator. Channel width $W_{island}$ is 50 nm, 90 nm, 210 nm, or 510 nm.

First, a region where the transistor is off is focused on. As shown in FIG. 36, the SS value decreases with decreasing $W_{island}$ and is 103 mV/dec when $W_{island}$ is 50 nm. The SS value increases with increasing $W_{island}$; however, when the gate voltage has a large negative value, the off-state current is lower than or equal to $10^{-13}$ A, i.e., the lower measurement limit. When $W_{island}$ is 50 nm or 90 nm, normally off characteristics are also achieved.

For example, in a transistor with $W_{island}$ of 510 nm, the off-state current is lower than or equal to $10^{-13}$ A when $V_g$ is lower than or equal to −1.5 V. In a transistor with $W_{island}$ of 50 nm or 90 nm, the off-state current is lower than or equal to $10^{-13}$ A when $V_g$ is lower than or equal to 0 V.

Figure 37A:
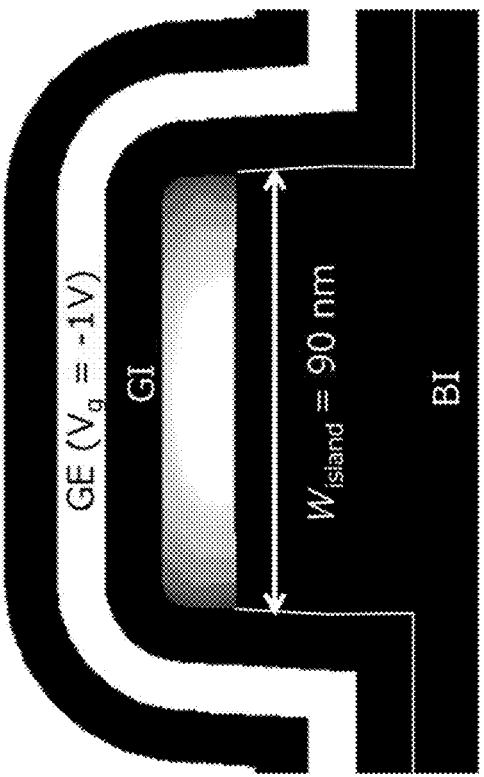
FIGS. 37A and 37B each show electron current density distribution in an active layer obtained by device calculation.
Figure 37B:
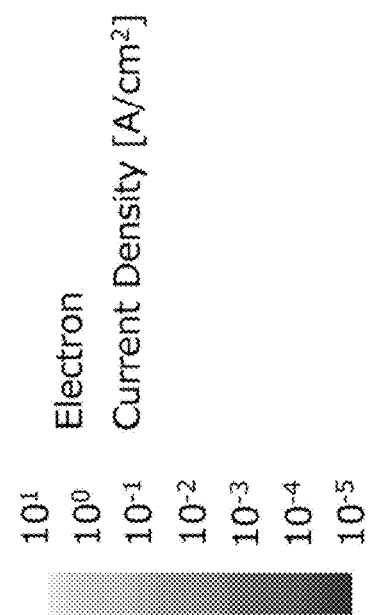

The reason why the SS value is reduced with decreasing channel width will be discussed referring to results of device calculation. With the use of Sentaurus (manufactured by Synopsys, Inc.), 3D device calculation was conducted. As the device structure, that of the fabricated s-channel CAAC-IGZO transistor was used. FIGS. 37A and 37B each show electron current density distribution in the active layer in a cross section taken in the channel width direction of the transistor. In the transistor, $W_{island}$ is 50 nm or 90 nm and $L_{ch}$ is 51 nm. The active layer corresponds to an oxide semiconductor. $V_g$ was set to −1 V and $V_d$ was set to 1 V. As shown in FIG. 37B, the transistor with $W_{island}$ of 90 nm has a high electron current density in the active layer on a back channel side, which is apart from the gate electrode. By contrast, as shown in FIG. 37A, the transistor in which $W_{island}$ is 50 nm has a greatly reduced electron current density on a back channel side. When $W_{island}$ is small, the electron current density on the back channel side is highly controllable. The reduced SS value can be attributed to the high controllability.

Next, a region where the transistor is on is focused on. Although the $\mu_{FE\_lin}$ cannot possibly be dependent on the channel width, it can be observed that the $\mu_{FE\_lin}$ increases with decreasing $W_{island}$. This is because with decreasing $W_{island}$, the proportion of current flowing on the side surface of the channel becomes larger than that of current flowing on the top surface of the channel. That is, a decrease in $W_{island}$ can increase current that can flow in one transistor. In other words, a decrease in $W_{island}$ of an s-channel structure leads to improvement in on-state current characteristics.

As described above, a smaller channel width leads to reduced DIBL, a reduced SS value, and improved on-state current characteristics. The reason for this is that reduced $W_{island}$ makes a portion of the gate electrode on the side surface side of the channel contribute to the control of an electric field more than a portion of the gate electrode on the top surface side of the channel does. An s-channel CAAC-IGZO transistor can be normally off even when the channel length is approximately 50 nm, for example, by having a small $W_{island}$. In a region where the transistor is in an off state, the SS value is small and the off-state current is low, and in a region where the transistor is in an on state, excellent on-state current characteristics can be achieved. Utilizing the above-described characteristics can make it possible to provide LSIs for low-power electronic devices, and the like, which cannot be achieved by using Si.

Example 3

In this example, a semiconductor device of one embodiment of the present invention is described with reference to drawings.

Examining the characteristics of a miniaturized s-channel CAAC-IGZO transistor is extremely important in its application to an LSI or the like. Thus, s-channel CAAC-IGZO transistors with various channel widths and channel lengths were fabricated, and the stability of the characteristics of the s-channel structure was examined. Note that a fabrication process similar to that in Example 2 was employed. The oxide semiconductor OS was deposited to a thickness of 15 nm, and the gate insulator GI was deposited to have an equivalent oxide thickness of 9.5 nm.

Figure 42:
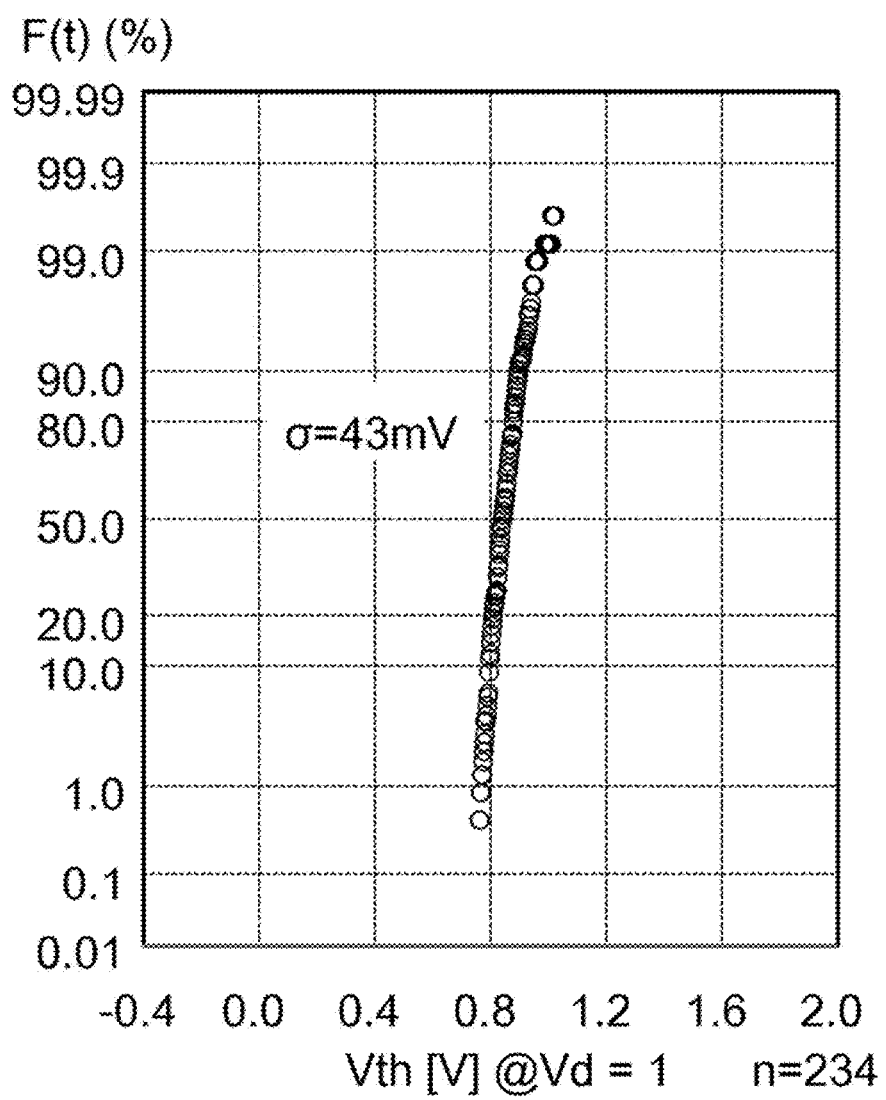
FIG. 42 shows cumulative frequency distribution of the threshold values of transistors of embodiments of the present invention.
Figure 43:
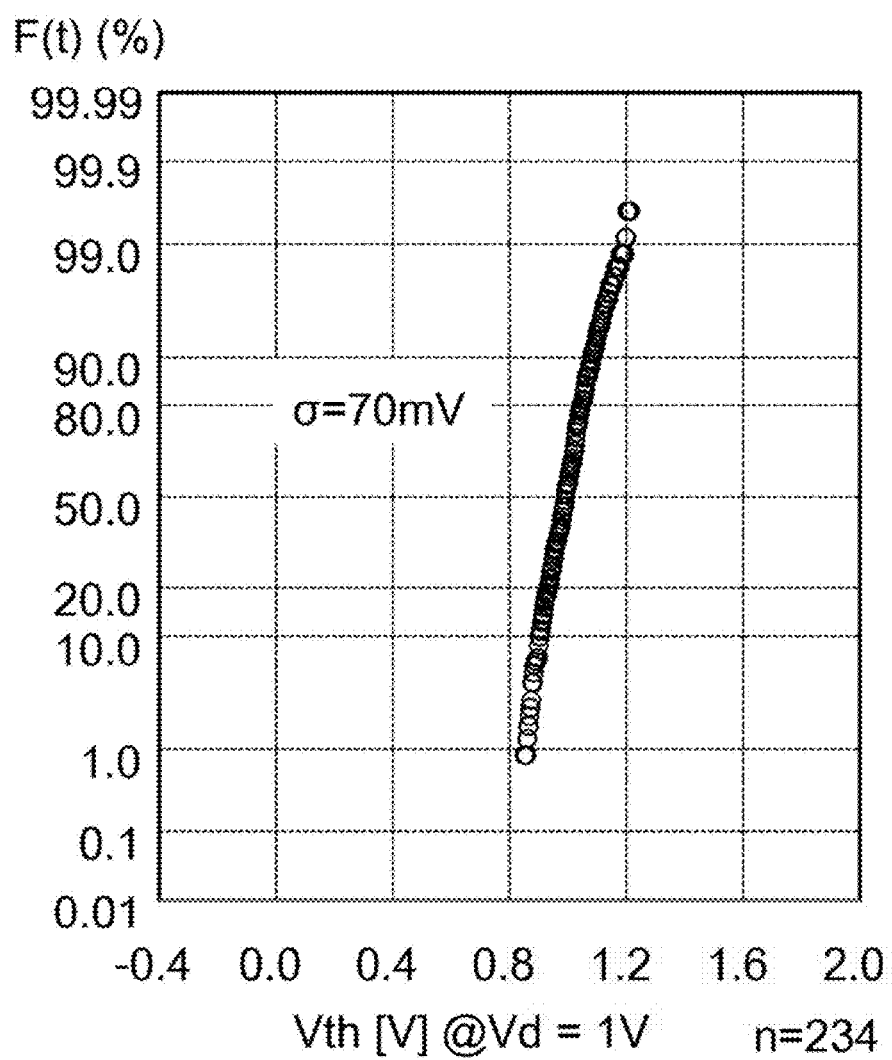
FIG. 43 shows cumulative frequency distribution of the threshold values of transistors of embodiments of the present invention.

FIG. 41, FIG. 42, and FIG. 43 each show the cumulative frequency distribution of the threshold values $V_{th}$ of 234 s-channel CAAC-IGZO transistors formed on one substrate that was obtained from the $I_d$-$V_g$ characteristics. FIG. 41 shows results of the transistors in each of which $W_{island}$ is 54 nm and $L_{ch}$ is 118 nm, and the measurement was performed in a state where $V_d$ was 1 V. FIG. 42 shows results of the transistors in each of which $W_{island}$ is 54 nm and $L_{ch}$ is 518 nm, and the measurement was performed in a state where $V_d$ was 1 V. FIG. 43 shows results of the transistors in each of which $W_{island}$ is 94 nm and $L_{ch}$ is 118 nm, and the measurement was performed in a state where $V_d$ was 1 V. As shown in FIGS. 41 to 43, variation in $V_{th}$ characteristics ($\sigma V_{th}$) of the CAAC-IGZO transistors having various sizes is 43 mV to 70 mV. When including CAAC-IGZO, a transistor can have excellent characteristics such as high on-state current, a small SS value, and an extremely low off-state current, and in addition, the transistor characteristics have a small variation and are stable. Thus, combination of such characteristics with the characteristics obtained in the other examples can make it possible to stably manufacture LSIs for low-power electronic devices, and the like, which cannot be achieved by using Si.

REFERENCE NUMERALS

10: electron gun chamber, 12: optical system, 14: sample chamber, 16: optical system, 18: camera, 20: observation chamber, 22: film chamber, 24: electron, 28: substance, 32: fluorescent plate, 101: transistor, 102: transistor, 103: transistor, 110: substrate, 120: insulator, 130: oxide semiconductor, 131: oxide semiconductor, 132: oxide semiconductor, 133: oxide semiconductor, 140: source electrode, 150: drain electrode, 160: gate insulator, 170: gate electrode, 172: conductor, 180: insulator, 185: insulator, 191: region, 192: region, 200: semiconductor device, 201: memory circuit, 202: memory circuit, 203: memory circuit, 204: circuit, 209: transistor, 210: transistor, 212: transistor, 213: transistor, 215: transistor, 217: transistor, 218: transistor, 219: capacitor, 220: capacitor, 240: wiring, 241: wiring, 242: wiring, 243: wiring, 244: wiring, 300: semiconductor device, 301: CPU core, 302: power controller, 303: power switch, 304: cache, 305: bus interface, 306: debug interface, 307: control unit, 308: PC, 309: pipeline register, 310: pipeline register, 311: ALU, 312: register file, 321: power management unit, 322: peripheral circuit, 323: a data bus, 402: insulator, 404: conductor, 406a: semiconductor, 406b: semiconductor, 406c: semiconductor, 408: insulator, 412: insulator, 413: conductor, 416: conductor, 416a: conductor, 416b: conductor, 417: conductor, 418: insulator, 426: mask, 436a: semiconductor, 436b: semiconductor, 442: insulator, 490: transistor, 750: interposer, 751: chip, 752: terminal, 753: mold resin, 800: panel, 801: printed wiring board, 802: package, 803: FPC, 804: battery, 901: housing, 902: housing, 903: display portion, 904: display portion, 905: microphone, 906: speaker, 907: operation key, 908: stylus, 911: housing, 912: housing, 913: display portion, 914: display portion, 915: joint, 916: operation key, 921: housing, 922: display portion, 923: keyboard, 924: pointing device, 931: housing, 932: a door for a refrigerator, 933: a door for a freezer, 941: housing, 942: housing, 943: display portion, 944: operation key, 945: lens, 946: joint, 951: car body, 952: wheel, 953: dashboard, 954: light, 2100: transistor, 2200: transistor, 2201: insulator, 2202: wiring, 2203: plug, 2204: insulator, 2205: wiring, 2206: wiring, 2207: insulator, 2208: blocking film, 2211: semiconductor substrate, 2212: insulator, 2213: gate electrode, 2214: gate insulator, 2215: source region and drain region, 3001: wiring, 3002: wiring, 3003: wiring, 3004: wiring, 3005: wiring, 3200: transistor, 3300: transistor, and 3400: capacitor.

This application is based on Japanese Patent Application serial no. 2014-013395 filed with Japan Patent Office on Jan. 28, 2014, Japanese Patent Application serial no. 2014-120992 filed with Japan Patent Office on Jun. 11, 2014, Japanese Patent Application serial no. 2014-161300 filed with Japan Patent Office on Aug. 7, 2014, and Japanese Patent Application serial no. 2014-209486 filed with Japan Patent Office on Oct. 10, 2014, the entire contents of which are hereby incorporated by reference.

The invention claimed is:

1. A semiconductor device comprising:
   a first transistor comprising:
   an insulating layer having a projecting portion;
   a first oxide semiconductor layer on the projecting portion of the insulating layer;
   a source electrode and a drain electrode each electrically connected to the first oxide semiconductor layer;
   a second oxide semiconductor layer overlapping with the first oxide semiconductor layer, the source electrode, and the drain electrode;
   a gate insulating layer over the first oxide semiconductor layer, the source electrode, the drain electrode, and the second oxide semiconductor layer; and
   a gate electrode over the gate insulating layer, the gate electrode overlapping with the first oxide semiconductor layer,
   wherein a bottom surface of the gate electrode is positioned lower than a bottom surface of the first oxide semiconductor layer,
   wherein a sum of a height of the projecting portion and a thickness of the first oxide semiconductor layer is greater than or equal to 30 nm and less than or equal to 300 nm, and
   wherein the first transistor has a switching speed lower than 100 nanoseconds.

2. The semiconductor device according to claim 1, wherein the first oxide semiconductor layer comprises indium and zinc.

3. The semiconductor device according to claim 1,
   wherein the first oxide semiconductor layer comprises a region overlapping with the gate electrode, and
   wherein the region has a carrier density lower than $1 \times 10^{15}$ $cm^{-3}$.

4. The semiconductor device according to claim 1, wherein the first oxide semiconductor layer has a stacked-layer structure.

5. The semiconductor device according to claim 1, further comprising:
   a conductive layer under the insulating layer, the conductive layer overlapping with the first oxide semiconductor layer.

6. The semiconductor device according to claim 5, wherein the conductive layer is electrically connected to the gate electrode.

7. The semiconductor device according to claim 1, further comprising:
   a second transistor under the insulating layer, the second transistor comprising a semiconductor layer,
   wherein the second transistor is electrically connected to one of the source electrode and the drain electrode,
   wherein a channel formation region in the first oxide semiconductor layer and a channel formation region in the semiconductor layer overlap with each other, and
   wherein a material of the semiconductor layer is different from a material of the first oxide semiconductor layer.

8. A semiconductor device comprising:
   a first transistor comprising:
   an insulating layer having a projecting portion;
   a first oxide semiconductor layer on the projecting portion of the insulating layer;
   a source electrode and a drain electrode each electrically connected to the first oxide semiconductor layer;
   a second oxide semiconductor layer overlapping with the first oxide semiconductor layer, the source electrode, and the drain electrode;
   a gate insulating layer over the first oxide semiconductor layer, the source electrode, the drain electrode, and the second oxide semiconductor layer; and
   a gate electrode over the gate insulating layer, the gate electrode overlapping with the first oxide semiconductor layer,
   wherein an entire portion of each of the source electrode and the drain electrode overlaps with the first oxide semiconductor layer,
   wherein a bottom surface of the gate electrode is positioned lower than a bottom surface of the first oxide semiconductor layer,
   wherein a sum of a height of the projecting portion and a thickness of the first oxide semiconductor layer is greater than or equal to 30 nm and less than or equal to 300 nm, and
   wherein the first transistor has a switching speed lower than 100 nanoseconds.

9. The semiconductor device according to claim 8, wherein the first oxide semiconductor layer comprises indium and zinc.

10. The semiconductor device according to claim 8,
    wherein the first oxide semiconductor layer comprises a region overlapping with the gate electrode, and
    wherein the region has a carrier density lower than $1 \times 10^{15}$ $cm^{-3}$.

11. The semiconductor device according to claim 8, wherein the first oxide semiconductor layer has a stacked-layer structure.

12. The semiconductor device according to claim 8, further comprising:
    a conductive layer under the insulating layer, the conductive layer overlapping with the first oxide semiconductor layer.

13. The semiconductor device according to claim 12, wherein the conductive layer is electrically connected to the gate electrode.

14. The semiconductor device according to claim 8, further comprising:
    a second transistor under the insulating layer, the second transistor comprising a semiconductor layer,
    wherein the second transistor is electrically connected to one of the source electrode and the drain electrode,
    wherein a channel formation region in the first oxide semiconductor layer and a channel formation region in the semiconductor layer overlap with each other, and
    wherein a material of the semiconductor layer is different from a material of the first oxide semiconductor layer.

* * * * *